United States Patent
Nagatani et al.

(10) Patent No.: US 8,493,257 B2
(45) Date of Patent: Jul. 23, 2013

(54) CURRENT-SWITCHING CELL AND DIGITAL-TO-ANALOG CONVERTER

(75) Inventors: Munehiko Nagatani, Kanagawa (JP); Hideyuki Nosaka, Kanagawa (JP); Shogo Yamanaka, Kanagawa (JP); Kimikazu Sano, Kanagawa (JP); Koichi Murata, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 58 days.

(21) Appl. No.: 13/145,782

(22) PCT Filed: Jan. 28, 2010

(86) PCT No.: PCT/JP2010/051157
§ 371 (c)(1),
(2), (4) Date: Jul. 21, 2011

(87) PCT Pub. No.: WO2010/087410
PCT Pub. Date: Aug. 5, 2010

(65) Prior Publication Data
US 2011/0273317 A1    Nov. 10, 2011

(30) Foreign Application Priority Data
Jan. 29, 2009   (JP) .................................. 2009-017697

(51) Int. Cl.
*H03M 1/66*    (2006.01)

(52) U.S. Cl.
USPC ............................. 341/144; 341/145; 341/118

(58) Field of Classification Search
USPC ................. 341/144, 145, 118, 141, 154, 148, 341/149
See application file for complete search history.

(56) References Cited

U.S. PATENT DOCUMENTS

| | | | |
|---|---|---|---|
| 5,059,977 A | 10/1991 | Herman et al. | |
| 5,625,360 A | 4/1997 | Garrity et al. | |
| 5,748,020 A * | 5/1998 | Mactaggart et al. | 327/218 |
| 2005/0225465 A1* | 10/2005 | Zhang et al. | 341/144 |

(Continued)

FOREIGN PATENT DOCUMENTS

| | | |
|---|---|---|
| CN | 1574645 A | 2/2005 |
| CN | 101227191 A | 7/2008 |
| JP | 2001-144617 A | 5/2001 |
| JP | 2008-124894 A | 5/2008 |

OTHER PUBLICATIONS

Baranauskas et al., "A 0.36W 6b up to 20GS/s DAC for UWB Wave Formation", ISSCC Digest of Technical Papers, 2006.

(Continued)

*Primary Examiner* — Jean B Jeanglaude
(74) *Attorney, Agent, or Firm* — Blakely Sokoloff Taylor & Zafman

(57) ABSTRACT

Two D flip-flops (D-FF$_{MA}$, D-FF$_{MB}$) output two half-rate signals (D$_{MR-A}$, D$_{MR-B}$) by dividing a digital input signal (D$_M$) into two signals and retiming them based on a clock signal (CLK) and a negative-phase clock signal (CLKB). First and second switches (S$_{M1}$, S$_{M2}$) are driven by the two half-rate signals (D$_{MR-A}$, D$_{MR-B}$). Third and fourth switches (S$_{M3}$, S$_{M4}$) are driven by a select signal SW and a negative-phase select signal SWB that have the same frequency as that of the clock signal (CLK) but a different phase from that of the clock signal (CLK). The current supplied from a current source (1) to a load (4) thus becomes a current signal corresponding to a conversion frequency twice the frequency of the clock signal (CLK).

19 Claims, 30 Drawing Sheets

U.S. PATENT DOCUMENTS

2006/0022856 A1* 2/2006 Choe .............................. 341/144
2006/0061499 A1* 3/2006 Seo ............................... 341/144
2007/0097579 A1* 5/2007 Amamiya ..................... 361/100

OTHER PUBLICATIONS

Nagatani et al., "A 32-GS/s 6-bit Double-Sampling DAC in InP HBT Technology", Technical Digest of IEEE Compound Semiconductor Integrated Circuit Symposium, 2009.

Razavi, "Principles of Data Conversion System Design", Capter 5, (1995).

Jalali et al, "InP HBTs: Growth, Processing and Applications", Capter 9, (1995).

Krall et al., "Time-Interleaved Digital-to-Analog Converters for UWB Signal Generation", Proceedings of IEEE International Conference on Ultra-Wideband 2007.

* cited by examiner

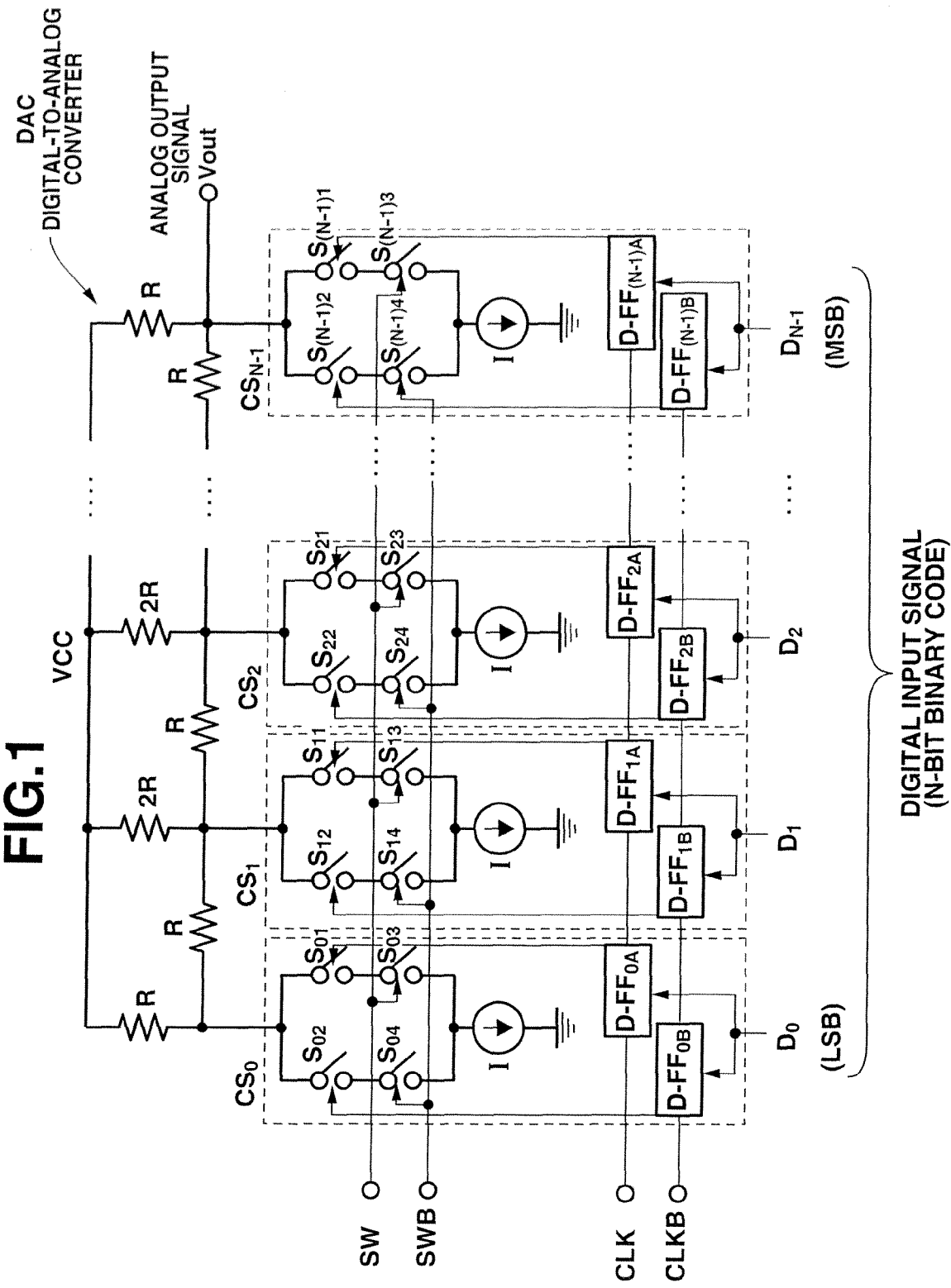

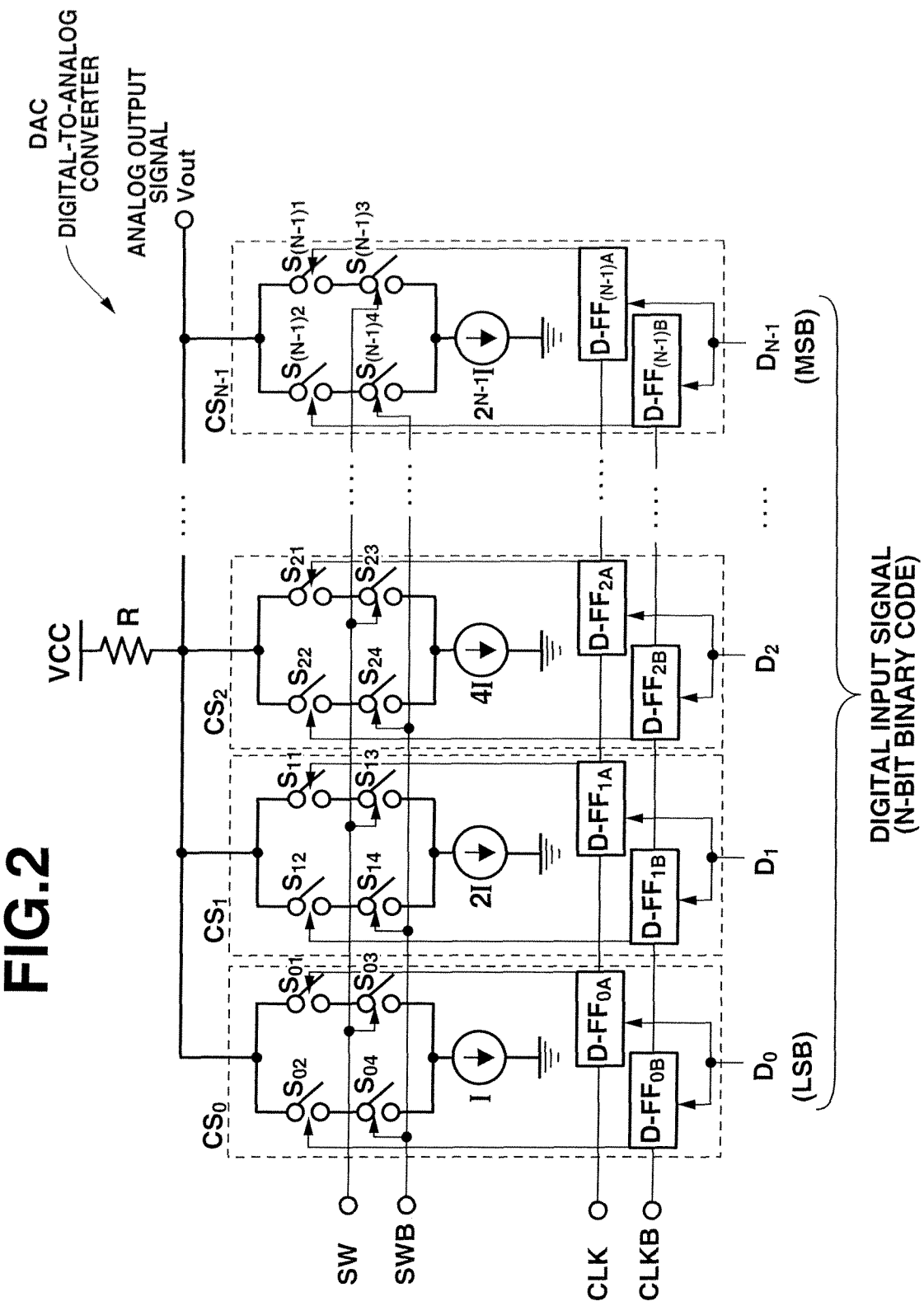

< CURRENT-SWITCHING CELL >

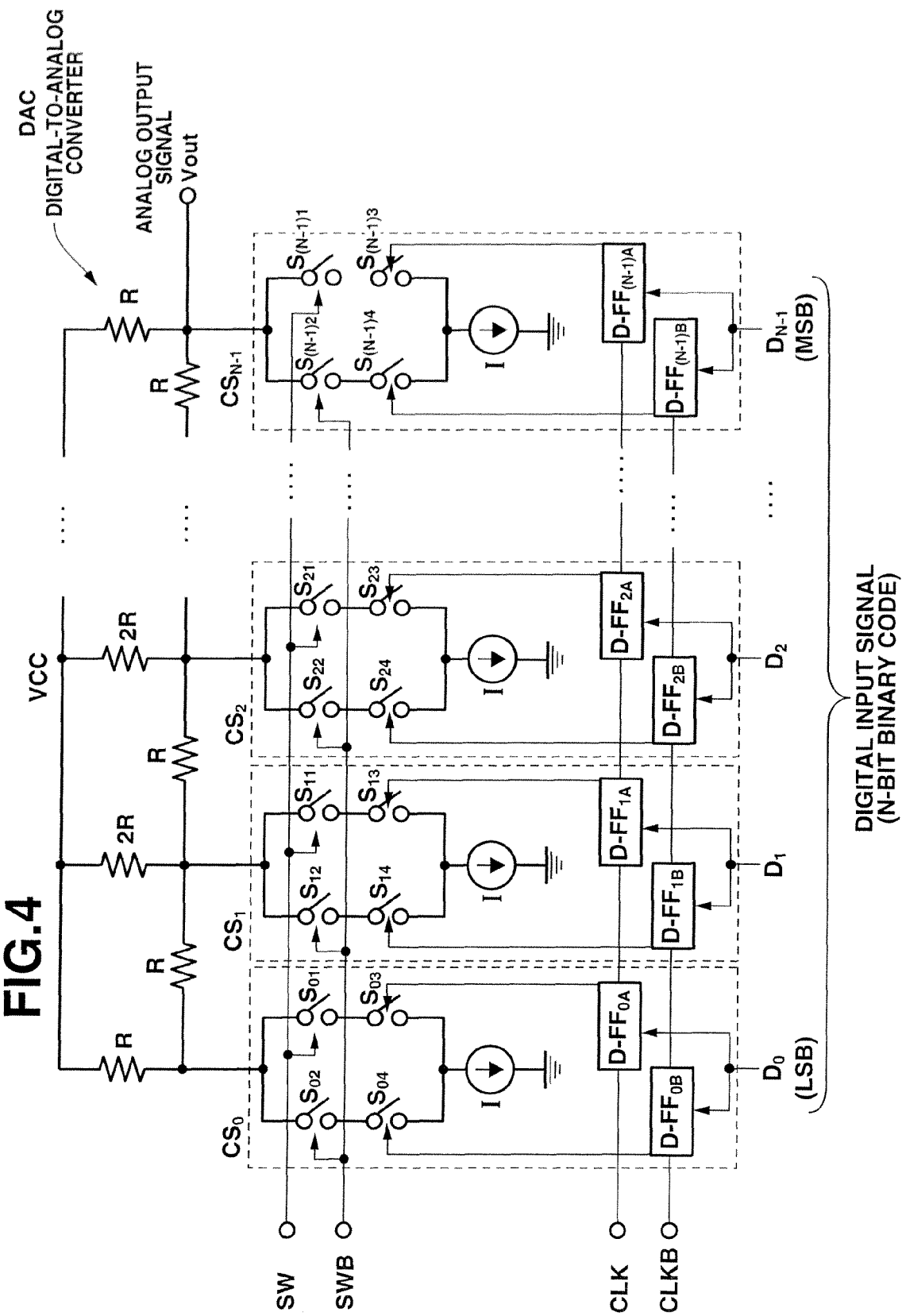

< CURRENT-SWITCHING CELL >

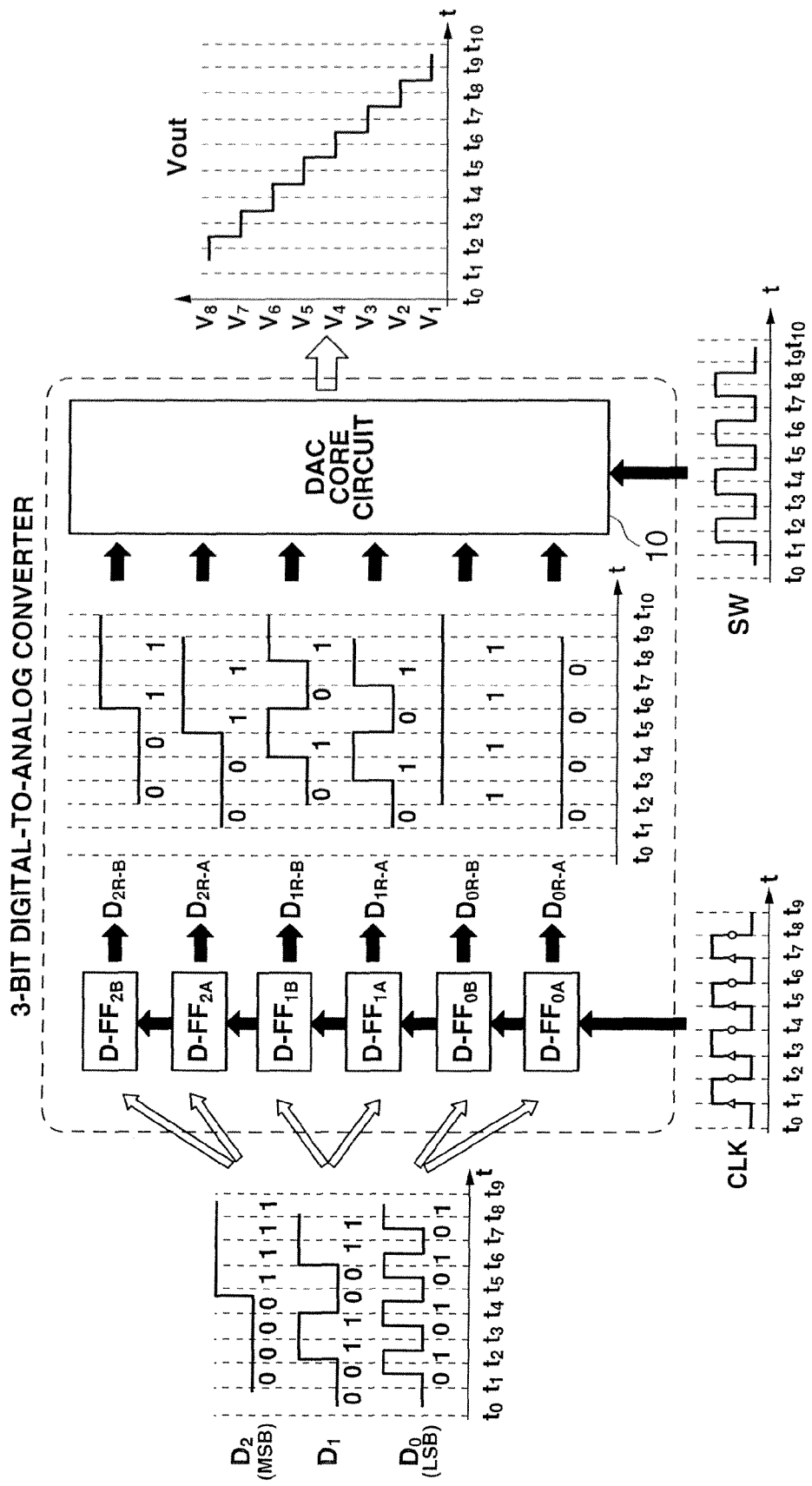

< CURRENT-SWITCHING CELL >

< CURRENT-SWITCHING CELL >

< CURRENT-SWITCHING CELL >

US 8,493,257 B2

CURRENT-SWITCHING CELL AND DIGITAL-TO-ANALOG CONVERTER

This is a non-provisional application claiming the benefit of International application number PCT/JP2010/051157 filed Jan. 28, 2010.

TECHNICAL FIELD

The present invention relates to a current-switching cell and a digital-to-analog converter (DAC: Digital-to-Analog Converter) using the current-switching cell and, more particularly, to a current-switching cell suitably applicable to a current-steering (current addition) digital-to-analog converter that is excellent in a high-speed operation as a digital-to-analog converter for converting digital signals into an analog signal, and the digital-to-analog converter.

BACKGROUND ART

Introducing the multilevel modulation technology and the OFDM (Orthogonal Frequency Division Multiplexing) technology has recently been examined to further increase the speed and capacity of optical communication systems. As the result of the approach, application of the digital signal processing technologies to an optical transceiver is proving to be effective. A digital-to-analog converter DAC serving as an analog front-end circuit is indispensable on the transmitter side of such an optical transceiver. The digital-to-analog converter DAC is required to operate at a high speed of several ten GS/s.

As digital-to-analog converters DACs excellent in the high-speed operation, current-steering (current addition) digital-to-analog converters DACs as shown in FIGS. 24 and 25 are known well. The digital-to-analog converters DACs shown in FIGS. 24 and 25 are described even in books related to data converters such as non-patent reference 1: Behzad Razavi, "PRINCIPLES OF DATA CONVERSION SYSTEM DESIGN", Chapter 5 "Current-Steering Architectures" and non-patent reference 2: B. Jalali et al, "InP HBTs: Growth, Processing and Applications", Chapter 9 "Digital-To-Analog Converters".

FIG. 24 is a block diagram showing an example of the circuit arrangement of a conventional current-steering (current addition) digital-to-analog converter DAC. In this example, the digital-to-analog converter DAC includes N current-switching cells. N currents having the same current value are weighted and added using a binary-weighted load resistor network (resistor ladder network) including a plurality of resistors formed in a ladder with resistance values R and 2R in accordance with the digital input signal bits of an N-bit binary code and thus converted into an analog output signal Vout and output.

That is, the digital-to-analog converter in FIG. 24 includes N current-switching cells $CS_{10}, CS_1, CS_2, \ldots,$ and $CS_{N-1}$, and more specifically, includes N D flip-flops (D-FF: circuits having a latch function) $D\text{-}FF_0, D\text{-}FF_1, D\text{-}FF_2, \ldots,$ and $D\text{-}FF_{N-1}$ which temporarily latch N digital input signal bits $D_0$ (LSB side), $D_1, D_2, \ldots,$ and $D_{N-1}$ (MSB side) and output the signal bits retimed by a clock signal CLK, respectively, N current sources which flow N currents having the same current value (I) to the binary-weighted load resistor network (resistor ladder network) including a plurality of resistors formed in a ladder with resistance values R and 2R, and switches $S_0, S_1, S_2, \ldots,$ and $S_{N-1}$ to be on/off-controlled based on the values of the digital input signal bits $D_0, D_1, D_2, \ldots,$ and $D_{N-1}$, respectively. Note that symbol VCC denotes a power supply configured to drive the digital-to-analog converter DAC.

On the other hand, FIG. 25 is a block diagram showing another example of the circuit arrangement of the conventional current-steering (current addition) digital-to-analog converter DAC. In this example, the digital-to-analog converter DAC includes N current-switching cells $CS_0, CS_1, CS_2, \ldots,$ and $CS_{N-1}$, as in FIG. 24. However, the N currents obtained by binary-weighting a current value are added using a single load resistor in accordance with the digital input signal bits of an N-bit binary code and thus converted into the analog output signal Vout and output.

That is, the digital-to-analog converter in FIG. 25 includes N D flip-flops D-FF which temporarily latch the N digital input signal bits $D_0$ (LSB side), $D_1, D_2, \ldots,$ and $D_{N-1}$ (MSB side) and output the signal bits retimed by the clock signal CLK, respectively, N current sources which flow N currents binary-weighted to current values I (LSB side), 2I, $2^2 I, \ldots,$ and $2^{N-1} I$ (MSB side) to the single load resistor having the resistance value R, and switches $S_0, S_1, S_2, \ldots,$ and $S_{N-1}$ to be on/off-controlled based on the values of the digital input signal bits $D_0, D_1, D_2, \ldots,$ and $D_{N-1}$, respectively. Note that symbol VCC denotes the power supply configured to drive the digital-to-analog converter DAC.

Each of the conventional current-steering (current addition) digital-to-analog converters DACs shown in FIGS. 24 and 25 includes the N current-switching cells $CS_0, CS_1, CS_2, \ldots,$ and $CS_{N-1}$, as described above. In accordance with the digital input signal bits $D_0, D_1, D_2, \ldots,$ and $D_{N-1}$ of an N-bit binary code, the switches $S_0, S_1, S_2, \ldots,$ and $S_{N-1}$ corresponding to them are simultaneously driven (on/off) to change the weight of the current flowing to the load formed from the resistor ladder network or the single load resistor, that is, generate binary-weighted currents, thereby obtaining the analog output signal (voltage). In general, to make the driving timings of the switches $S_0, S_1, S_2, \ldots,$ and $S_{N-1}$ coincide, the N D flip-flops D-FF (circuits having a latch function) are arranged at the preceding stages of the switches $S_0, S_1, S_2, \ldots,$ and $S_{N-1}$, respectively. The digital-to-analog converter is configured to simultaneously drive the switches $S_0, S_1, S_2, \ldots,$ and $S_{N-1}$ by retiming the N digital input signal bits $D_0, D_1,$ and $D_{N-1}$ based on the same clock signal CLK.

The outline of the operations of the conventional current-steering (current addition) digital-to-analog converters DACs shown in FIGS. 24 and 25 will be described with reference to FIGS. 26A, 26B, and 27 by taking the digital-to-analog converter DAC in FIG. 25 as an example.

FIGS. 26A and 26B are schematic views for explaining the operation of a current-switching cell included in the conventional current-steering (current addition) digital-to-analog converter DAC. In particular, FIG. 26A shows the circuit arrangement of an Mth current-switching cell $CS_M$ of the N current-switching cells $CS_0, CS_1, CS_2, \ldots,$ and $CS_{N-1}$. FIG. 26B shows the signal waveforms of various parts of the Mth current-switching cell $CS_M$ shown in FIG. 26A. Note that FIG. 26A shows, as an example, a case in which a load resistor network (resistor ladder network) including a plurality of resistors formed in a ladder with resistance values R and 2R, as shown in FIG. 24, is provided as the load connected to the current-switching cell $CS_M$.

The current-switching cell is a circuit (cell) which has a function of latching and retiming a digital input signal and a switch function of controlling whether to supply a current to the load side and is arranged in correspondence with a digital input signal bit. The current-switching cell includes a D flip-flop, a switch circuit, and a current source. This circuit controls whether to flow the current from the current source to the load by switching the on/off state of the switch circuit in accordance with the digital input signal latched and retimed by the D flip-flop.

An Mth digital input signal bit $D_M$ input to an Mth D flip-flop D-$FF_M$, as shown in FIG. 26A, has a signal waveform as shown in FIG. 26B. The digital input signal bit is temporarily latched and retimed by the Mth D flip-flop D-$FF_M$ in accordance with a rising edge (timing indicated by Δ) of the clock signal CLK, as shown in FIG. 26B, and output to a switch $S_M$ as a retimed digital input signal $D_{MR}$.

The digital signal $D_{MR}$ retimed to be coincident with the rising edge of the clock signal CLK drives the switch $S_M$ that is the switch circuit of the Mth current-switching cell $CS_M$ so as to determine whether to flow a current signal $I_M$ to the load resistor network (resistor ladder network). That is, as shown in FIG. 26B, when the retimed digital signal $D_{MR}$ is "High", the switch $S_M$ is turned on to flow the current signal from the current source to the load resistor network.

The D/A (Digital-to-Analog) conversion operation of a digital-to-analog converter DAC including current-switching cells as described with reference to FIG. 26A will be described using FIG. 27, FIG. 27 is a schematic view for explaining the operation of the entire conventional current-steering (current addition) digital-to-analog converter DAC by taking a 3-bit structure as an example. FIG. 27 indicates that the analog output signal Vout corresponding to three digital input signal bits $D_0$ (LSB side), $D_1$, and $D_2$ (MSB side) is generated.

Note that three current-switching cells $CS_0$, $CS_1$, and $CS_2$ including D flip-flops D-$FF_0$, D-$FF_1$, and D-$FF_2$, switch circuits, and current sources are provided in correspondence with the three digital input signal bits $D_0$, $D_1$, and $D_2$, although not illustrated in FIG. 27. FIG. 27 illustrates the D flip-flops D-$FF_0$, D-$FF_1$, and D-$FF_2$ but shows the remaining switch circuits and the current sources of the current-switching cells $CS_0$, $CS_1$, and $CS_2$ in a form different from FIG. 24 or 25 as a DAC core circuit 100 that performs the D/A conversion operation together with the load-side resistor ladder network.

Referring to FIG. 27, the digital input signal bits $D_0$, $D_1$, and $D_2$ are input to the digital-to-analog converter DAC. The three digital input signal bits $D_0$, $D_1$, and $D_2$ are external signal bits. In general, the three data bits somewhat have a shift on the time axis, as shown in FIG. 27.

Each of the three digital input signal bits $D_0$, $D_1$, and $D_2$ is input to a corresponding one of the D flip-flops D-$FF_0$, D-$FF_1$, and D-$FF_2$, latched, retimed to a rising edge (timing indicated by Δ) of the external clock signal CLK to eliminate the shift on the time axis, and output as a corresponding one of retimed digital input signals $D_{0R}$ (LSB side), $D_{1R}$, and $D_{2R}$ (MSB side).

After that, the retimed digital input signals $D_{0R}$, $D_{1R}$, and $D_{2R}$ simultaneously drive the switches $S_0$, $S_1$, and $S_2$ of the switch circuits provided in the DAC core circuit 100 to flow the currents from the current sources to the load (the load resistor network in the example shown in FIG. 26A). The currents are thus weighted in accordance with the values of the retimed digital input signal bits $D_{0R}$, $D_{1R}$, and $D_{2R}$. Finally, the analog output signal Vout (voltage) in eight levels ($=2^3$) corresponding to the digital input signal bits $D_0$, $D_1$ and $D_2$ is generated and output, as shown in FIG. 27.

An interleaving method is a technique of increasing the conversion speed of the digital-to-analog converter DAC, which is explained in, for example, non-patent reference 3: C. Frail et al, "Time-Interleaved Digital-to-Analog Converters for UWB Signal Generation" contained in the proceedings of IEEE International Conference on Ultra-Wideband 2007. FIG. 28 is a block diagram showing an example of the arrangement of a conventional interleaved digital-to-analog converter DAC described in non-patent reference 3. As a sub-digital-to-analog converter SDAC that performs the interleaving operation, two digital-to-analog converters DACs having the same conversion speed performance are provided.

The digital-to-analog converter DAC having the circuit arrangement as shown in FIG. 28 includes a first sub-digital-to-analog converter (SDAC1) 101, a second sub-digital-to-analog converter (SDAC2) 102, a clock (CLK) 103, a first phase shifter 104, a second phase shifter 105, and a mixer 106.

In the digital-to-analog converter DAC having the circuit arrangement as shown in FIG. 28, the first phase shifter 104 and the second phase shifter 105 generate clock signals of different phases based on the clock signal from the clock (CLK) 103. The first sub-digital-to-analog converter (SDAC1) 101 and the second sub-digital-to-analog converter (SDAC2) 102, which have the same conversion speed performance, thus perform the interleaving operation.

The mixer 106 combines the analog output signals output from the first sub-digital-to-analog converter (SDAC1) 101 and the second sub-digital-to-analog converter (SDAC2) 102. This enables to generate an analog output signal corresponding to twice the conversion speed of each of the first sub-digital-to-analog converter (SDAC1) 101 and the second sub-digital-to-analog converter (SDAC2) 102.

For example, assume that each of the first sub-digital-to-analog converter (SDAC1) 101 and the second sub-digital-to-analog converter (SDAC2) 102 can operate at a conversion speed of 14 GS/s. In this case, when the interleaving method of causing the first sub-digital-to-analog converter (SDAC1) 101 and the second sub-digital-to-analog converter (SDAC2) 102 to perform the interleaving operation, an analog output signal corresponding to 28 GS/s can be obtained.

RELATED ART REFERENCES

Non-Patent References

Non-patent reference 1: Behzad Razavi; "PRINCIPLES OF DATA CONVERSION SYSTEM DESIGN", IEEE Press, Chapter 5, Section 5.2, pp. 84-95
Non-Patent reference 2: B. Jalali and S. J. Pearton; "InP HBTs: Growth, Processing and Applications", Artech House Publishers, Chapter 9, Section 9.5, pp. 340-343
Non-Patent Reference 3: C. Krall, C. Vogel, K. Witrisal; "Time-Interleaved Digital-to-Analog Converters for UWB Signal Generation", proceedings of IEEE International Conference on Ultra-Wideband 2007, pp. 366-371, issued Sep. 24, 2007

DISCLOSURE OF INVENTION

Problems to be Solved by the Invention

In the conventional digital-to-analog converters DACs as shown in FIGS. 24 and 25, one of the factors that restrict the conversion speed performance is the circuit arrangement of the conventional current-switching cell (the circuit having the function of latching and retiming a digital input signal and the switching function of controlling whether to flow a current to the load side) included in the digital-to-analog converter DAC. That is, in the conventional current-switching cell, degradation of the retiming accuracy of the D flip-flop D-FF that latches and retires the digital input signal is the large factor that restricts the conversion speed performance. For example, if the switch driving timings of the current-switching cells $CS_0$, $CS_1$, $CS_2$, ..., and $CS_{N-1}$ included in the digital-to-analog converter DAC, that is, the switches $S_0$, $S_1$, $S_2$, ..., and $S_{N-1}$ in the DAC core circuit that performs the D/A conversion operation do not coincide with each other, a large waveform distortion such as a glitch is generated in the analog output signal, resulting in degradation in the performance of the digital-to-analog converter DAC.

For this reason, retiming that makes the switch driving timings coincident is an important function of the digital-to-analog converter DAC, and an accurate timing design is necessary.

To implement the retiming function in the current-switching cells $CS_0$, $CS_1$, $CS_2$, ..., and $CS_{N-1}$, the external clock signal CLK needs to be supplied, as indicated by the digital-to-analog converters DACs shown in FIGS. 24 and 25. For example, to achieve the conversion operation of the digital-to-analog converter DAC at 28 GS/s, a clock signal CLK of 28 GHz is necessary.

As is apparent from the waveform charts of FIGS. 26B and 27, the clock signal CLK has the highest frequency component in the current-switching cell. In addition, since it is necessary to simultaneously distribute and supply the clock signal CLK to a number of D flip-flops D-FF (that is, the D flip-flops D-$FF_0$, D-$FF_1$, D-$FF_2$, ..., and D-$FF_{N-1}$ in FIGS. 24 and 25) included in the current-switching cells $CS_0$, $CS_1$, $CS_2$, ..., and $CS_{N-1}$ of the digital-to-analog converter DAC, the wiring length (wiring run length) of the clock signal line in the IC of the digital-to-analog converter DAC increases.

As a result, the clock signal CLK is susceptible to the band limitation by the parasitic components (the parasitic capacitance and the like) of the clock signal line. It is therefore difficult to supply the high-frequency clock signal CLK to a number of D flip-flops D-FF simultaneously at high quality. The higher the conversion speed of the digital-to-analog converter DAC needs to be, the more conspicuous the degradation of the retiming accuracy of the current-switching cells becomes.

When the interleaved digital-to-analog converter DAC as shown in FIG. 28 is used, the requirement for the conversion speed performance of the plurality of sub-digital-to-analog converters SDACs themselves that perform the interleaving operation is relaxed. This can be one solution to the above-described problem.

However, such an interleaved digital-to-analog converter DAC needs a plurality of, for example, two sub-digital-to-analog converters SDACs having the same conversion speed performance. In addition, a mixer having excellent linearity is required to combine the analog output signals from the sub-digital-to-analog converters SDACs. This leads to a great increase in the circuit scale and the power consumption (the circuit arrangement and the power consumption increase to more than one times, for example, twice those of the digital-to-analog converter DAC that does not use the interleaving method). Application to an optical transceiver that needs to operate at low power consumption is considered difficult.

In the interleaved digital-to-analog converter DAC, the quality (linearity) of the final analog output signal degrades due to the characteristic difference between the sub-digital-to-analog converters SDACs or the nonlinearity characteristic of the mixer.

The present invention has been made to solve the above-described problems, and has as its object to provide a current-switching cell and a digital-to-analog converter, which can perform a high-speed conversion operation at a frequency higher than that of an externally supplied clock signal.

Means of Solution to the Problems

In order to achieve the above-described object, a current-switching cell according to the present invention comprises a current source, a switch circuit that switches a connection state between the current source and a load so as to switch whether to supply a current from the current source to load, and a first latch circuit and a second latch circuit that latch and retime a digital input signal based on a first clock signal and a second clock signal that is a negative-phase signal of the first clock signal, respectively, and output a first half-rate signal and a second half-rate signal obtained by dividing the digital input signal into two signals to the switch circuit, the switch circuit comprising a first switch that is inserted between the current source and the load and driven by the first half-rate signal, a second switch that is inserted between the current source and the load in parallel to the first switch and driven by the second half-rate signal and a select switch that selectively connects one of a circuit including the first latch circuit and a circuit including the second switch between the current source and the load, in accordance with a signal having the same frequency as that of the first clock signal but a different phase from that of the first clock signal.

A digital-to-analog converter according to the present invention comprises at least one current-switching cell provided in correspondence with a bit of an N-bit (N is an integer of not less than 1) digital input signal, and a load, each of the current-switching cells comprising a current source, a switch circuit that switches a connection state between the current source and the load so as to switch whether to supply a current from the current source to the load, and a first latch circuit and a second latch circuit that latch and retime the digital input signal of a bit corresponding to the current-switching cell based on a first clock signal and a second clock signal that is a negative-phase signal of the first clock signal, respectively, and output a first half-rate signal and a second half-rate signal obtained by dividing the digital input signal into two signals to the switch circuit, and the switch circuit comprising a first switch that is inserted between the current source and the load and driven by the first half-rate signal, a second switch that is inserted between the current source and the load in parallel to the first switch and driven by the second half-rate signal, and a select switch that selectively connects one of a circuit including the first latch circuit and a circuit including the second switch between the current source and the load in accordance with a signal having the same frequency as that of the first clock signal but a different phase from that of the first clock signal, wherein the load adds currents supplied from the current sources via the current-switching cells so as to D/A (Digital-to-Analog)-convert the digital input signal.

Effects of the Invention

The current-switching cell and the digital-to-analog converter according to the present invention can yield the following effects.

The current-switching cell and the digital-to-analog converter according to the present invention enable the operation of dividing a digital input signal into two half-rate signals serving as two retimed digital input signals each having a frequency ½ the original operating frequency (that is, the desired signal rate). It is therefore possible to achieve a D/A (Digital-to-Analog) conversion speed twice the externally supplied clock frequency. That is, the digital-to-analog converter according to the present invention can ensure a retiming accuracy that was a factor to restrict the conversion speed performance, and therefore implement a faster D/A conversion operation because the speed/band requirement for the clock signal system is relaxed as compared to the conventional digital-to-analog converter.

Note that in the current-switching cell and the digital-to-analog converter according to the present invention, the D flip-flop D-FF that latches a digital input signal and outputs a retimed signal divides the digital input signal into half-rate signals. For this reason, the band requirement for the digital signal wiring system from the D flip-flop D-FF to the switch circuit is also relaxed. This allows to increase the degree of freedom in digital signal wiring run from the viewpoint of the circuit layout of the digital-to-analog converter.

The half-rate signals that are divided and output are multiplexed in the current-switching cell based on the select signal. As far as the supply timing of the select signal is accurately given, a slight skew (a shift on the time axis) between the half-rate signals is allowed. In this regard, since the current-switching cell itself is not large-scaled and can be implemented in a small area on the circuit layout, the timing of the select signal to be supplied to the current-switching cell can relatively easily be adjusted.

On the other hand, in the current-switching cell and the digital-to-analog converter according to the present invention, the number of D flip-flops D-FF and that of switches in the current-switching cell increase, as compared to the conventional current-switching cell and digital-to-analog converter.

However, as compared to an interleaved digital-to-analog converter, the increase in the number of D flip-flops D-FF and that of switches is largely suppressed. Hence, the digital-to-analog converter can be made compact, and the increase in the power consumption is also suppressed.

In the current-switching cell and the digital-to-analog converter according to the present invention, quality (linearity) degradation of the analog output signal problematically caused in the interleaved digital-to-analog converter by the characteristic difference between the sub-digital-to-analog converters or the nonlinearity characteristic of the mixer never occurs.

As described above, the current-switching cell according to the present invention and the digital-to-analog converter using the current-switching cell can increase the conversion speed to almost twice that of the conventional digital-to-analog converter while suppressing the increase in the power consumption and maintaining high quality.

BRIEF DESCRIPTION OF DRAWINGS

FIG. 1 is a block diagram showing an example of the circuit arrangement of a digital-to-analog converter according to the first embodiment of the present invention;

FIG. 2 is a block diagram showing another example of the circuit arrangement of the digital-to-analog converter according to the first embodiment of the present invention;

FIG. 4 is a block diagram showing still another example of the circuit arrangement of the digital-to-analog converter according to the first embodiment of the present invention;

FIG. 7 is a schematic view for explaining the operation of the entire digital-to-analog converter according to the first embodiment of the present invention by taking a 3-bit structure as an example;

BEST MODE FOR CARRYING OUT THE INVENTION

Figure 3A:
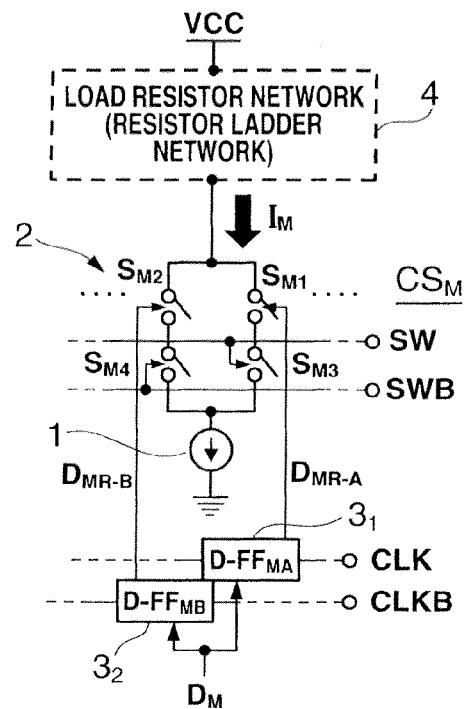
FIG. 3A is a block diagram showing the circuit arrangement of a current-switching cell included in the digital-to-analog converters shown in FIGS. 1 and 2.

The embodiments of a current-switching cell and a digital-to-analog converter DAC according to the present invention will now be described in detail with reference to the accompanying drawings.

Features of Present Invention

The outline of the features of the present invention will be described first prior to the explanation of the embodiments of the present invention. The present invention implements a circuit arrangement capable of speeding up the operation of a current-steering (current addition) digital-to-analog converter DAC (Digital-to-Analog Converter), and has a feature of implementing a circuit arrangement capable of suppressing linearity degradation or a glitch (waveform distortion) in the analog output signal caused by the speedup.

That is, in the current-switching cell and the digital-to-analog converter DAC according to the present invention, retiming and sampling of each digital input signal bit are done by rising edge trigger or falling edge trigger using a clock signal (first clock signal) CLK having a frequency ½ the necessary operating frequency and a negative-phase clock signal (second clock signal) CLKB that is the negative-phase signal of the clock signal CLK.

Next, a switch circuit (a total of four switches which are connected in series by twos) arranged in correspondence with each bit of retimed digital input signals is driven by the retimed digital input signals obtained by converting the input signal into two half-rate signals by dividing, retiming, and sampling it, a select signal (third clock signal) SW having the same frequency as that of the clock signal CLK and a phase shifted in any one of the directions, and a negative-phase select signal (fourth clock signal) SWB that is the negative-phase signal of the select signal.

The switch circuit (four switches) to be driven is connected to a current source and a load resistor network (resistor ladder network) or a single load resistor. This implements an arrangement which, upon driving the switch circuit, consequently multiplexes the retimed digital input signals of the half-rate signals and outputs an analog output signal equivalent to that of D/A (Digital-to-Analog) conversion at the full rate, that is, the double rate of the frequency of the clock signal CLK.

Note that in the following description, out of the four switches included in the switch circuit, two switches to be driven by the retimed digital input signals (or differential retimed digital input signals) of two half-rate signals (or differential half-rate signals) will be referred to as first and second switches, and two remaining switches to be driven respectively by the select signal SW and the negative-phase select signal SWB will be referred to as third and fourth switches.

In principle, the first and third switches are connected in series, and the second and fourth switches are connected in series. Any switch can be connected to the negative side. In some circuit arrangements, one of the terminals of the first switch and a corresponding one of the terminals of the fourth switch may be connected in parallel, and one of the terminals of the second switch and a corresponding one of the terminals of the third switch may be connected in parallel. The first and second switches may be connected to a load, and the third and fourth switches may bypass the load.

Note that in the arrangement of the current-switching cell and the digital-to-analog converter DAC according to the present invention, the speed of the clock signal CLK (and the negative-phase clock signal CLKB, the select signal SW, and the negative-phase select signal SWB) that is the signal having the highest frequency in the current-switching cell and the digital-to-analog converter DAC can be only ½, that is, the half rate of the originally required operating frequency (full rate). For this reason, a margin can be ensured for driving timing adjustment between the current-switching cells of the digital-to-analog converter DAC so that the driving timings can easily be made coincident, and any degradation of the output signal caused by the driving timing shift can be suppressed.

In addition, as compared to an interleaved digital-to-analog converter DAC that executes a double-rate operation, the digital-to-analog converter DAC using the current-switching cell according to the present invention has a small-scale circuit arrangement and low power consumption.

First Embodiment

The circuit arrangement of a current-switching cell and a digital-to-analog converter DAC according to the first embodiment of the present invention will be described first. The circuit arrangement according to the first embodiment has a large feature in the arrangement of the current-switching cell having a retiming function of retiming a digital input signal and a switching function of controlling a current to be supplied to a load in accordance with the retimed digital input signal. Applying this current-switching cell allows to implement a digital-to-analog converter DAC capable of a high-speed D/A (Digital-to-Analog) conversion operation.

Details of the current-switching cell according to the present invention will be explained later. First, the block arrangement of the digital-to-analog converter DAC according to the first embodiment of the present invention, which is formed using the current-switching cell, will be described with reference to FIGS. 1 and 2.

FIG. 1 is a block diagram showing an example of the circuit arrangement of the digital-to-analog converter DAC according to the first embodiment of the present invention. In this example, the digital-to-analog converter DAC includes N current-switching cells $CS_0, CS_1, CS_2, \ldots,$ and $CS_{N-1}$ (that is, each current-switching cell is a circuit including D flip-flops for retiming, a switch circuit for current switching to the load, and a current source that supplies a current to the load) in correspondence with N digital input signal bits. N currents having the same current value are weighted and added using a binary-weighted load resistor network (resistor ladder network) including a plurality of resistors formed in a ladder with resistance values R and 2R in accordance with the digital input signal bits of an N-bit binary code and thus converted into an analog output signal Vout and output, like the current-steering (current addition) digital-to-analog converter DAC shown in FIG. 24 described above.

Figure 24:
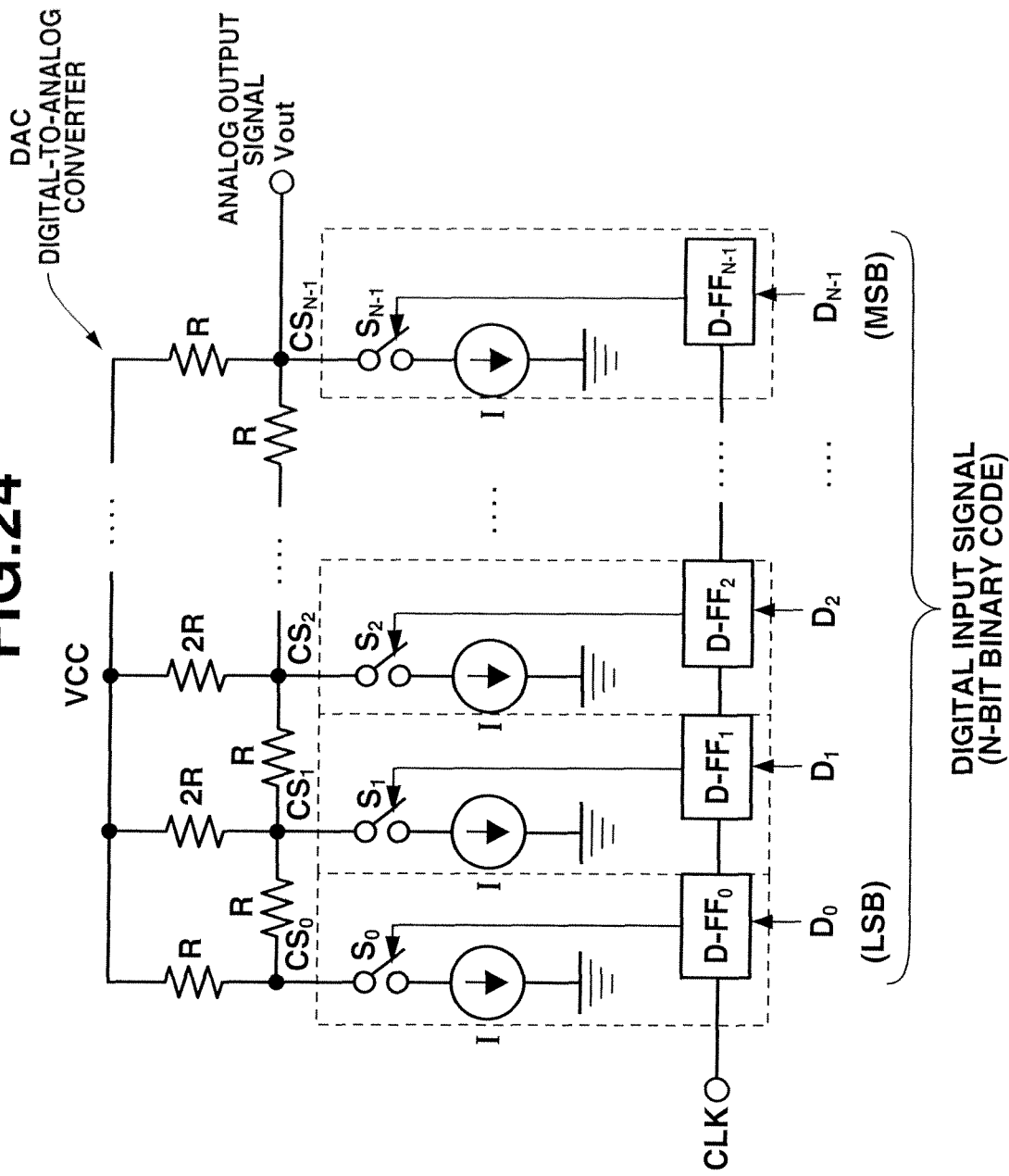
FIG. 24 is a block diagram showing an example of the circuit arrangement of a conventional current-steering (current addition) digital-to-analog converter.

However, the digital-to-analog converter DAC in FIG. 1 including the N current-switching cells $CS_0, CS_1, CS_2, \ldots,$ and $CS_{N-1}$ includes two D flip-flops D-FF (D-FF: circuits having a latch function) in each of the current-switching cells $CS_0, CS_1, CS_2, \ldots,$ and $CS_{N-1}$, unlike FIG. 24. The digital-to-analog converter DAC thus includes 2×N D flip-flops D-$FF_{0A}$, D-$FF_{0B}$, D-$FF_{1A}$, D-$FF_{1B}$, D-$FF_{2A}$, D-$FF_{2B}$, ..., D-$FF_{(N-1)A}$, and D-$FF_{(N-1)B}$ which temporarily latch N digital input signal bits $D_0$ (LSB side), $D_1, D_2, \ldots,$ and $D_{N-1}$ (MSB side) and output signals obtained by dividing each of the digital input signal bits $D_0, D_1, D_2, \ldots,$ and $D_{N-1}$ and retiming and sampling the signals in accordance with the externally supplied clock signal CLK and the negative-phase signal (negative-phase clock signal CLKB) of the clock signal CLK or the externally supplied clock signal CLK and the negative-phase clock signal CLKB generated by single balance conversion (single phase→difference conversion) of the clock signal CLK.

Additionally, in the digital-to-analog converter DAC in FIG. 1, one current source is arranged in each of the N current-switching cells $CS_0, CS_1, CS_2, \ldots,$ and $CS_{N-1}$ prepared in correspondence with the digital input signal bits $D_0, D_1, D_2, \ldots,$ and $D_{N-1}$. The current sources of the current-switching cells $CS_0, CS_1, CS_2, \ldots,$ and $CS_{N-1}$ are configured to flow currents having the same current value (I) to the binary-weighted load resistor network (resistor ladder network) including a plurality of resistors formed in a ladder with resistance values R and 2R.

Each of the current-switching cells $CS_0, CS_1, CS_2, \ldots,$ and $CS_{N-1}$ includes corresponding two of the D flip-flops D-$FF_{0A}$, D-$FF_{0B}$, D-$FF_{1A}$, D-$FF_{1B}$, D-$FF_{2A}$, D-$FF_{2B}$, ..., D-$FF_{(N-1)A}$, and D-$FF_{(N-1)B}$, unlike FIG. 24, so as to divide each bit into two signals and output them. Hence, each current-switching cell includes a switch circuit including a total of four switches of which the first and third switches are connected in series, and so do the second and fourth switches. The first and second switches are on/off-controlled based on the values of the digital input signal bits, and the third and fourth switches are on/off-controlled based on an externally supplied select signal SW and the negative-phase signal (negative-phase select signal SWB) of the select signal SW or based on the externally supplied select signal SW and the negative-phase select signal SWB generated by single balance conversion (single phase difference conversion) of the select signal SW.

Hence, the digital-to-analog converter DAC includes N switch circuits each including four serially/parallelly connected switches in correspondence with the respective bits. The digital-to-analog converter DAC includes a total of 4×N switches $S_{01}, S_{02}, S_{03}, S_{04}, S_{11}, S_{12}, S_{13}, S_{14}, S_{21}, S_{22}, S_{23}, S_{24}, \ldots, S_{(N-1)1}, S_{(N-1)1}, S_{(N-1)2}, S_{(N-1)3},$ and $S_{(N-1)4}$.

Each of the N current sources arranged in the current-switching cells $CS_0, CS_1, CS_2, \ldots,$ and $CS_{N-1}$, respectively, is connected to the load resistor network (resistor ladder network) via four switches included in the switch circuit of the corresponding one of the current-switching cells $CS_0, CS_1, CS_2, \ldots,$ and $CS_{N-1}$ out of the N switch circuits that is, 4×N switches. As a result, the digital-to-analog converter DAC is configured to determine whether to supply a current to the load resistor network (resistor ladder network) in accordance with the value of a corresponding one of the digital input signal bits $D_0, D_1, D_2, \ldots,$ and $D_{N-1}$. Note that symbol VCC denotes a power supply configured to drive the digital-to-analog converter DAC.

On the other hand, FIG. 2 is a block diagram showing another example of the circuit arrangement of the digital-to-analog converter DAC according to the first embodiment of the present invention. In this example, the digital-to-analog converter DAC includes N current-switching cells $CS_0, CS_1, CS_2, \ldots,$ and $CS_{N-1}$ (that is, each current-switching cell is a circuit including D flip-flops for retiming, a switch circuit for current switching to the load, and a current source that supplies a current to the load) in correspondence with N digital input signal bits. Current sources in the N current-switching cells $CS_0, CS_1, CS_2, \ldots,$ and $CS_{N-1}$ supply N currents obtained by binary-weighting a current value so that the N binary-weighted currents are added using a single load resistor in accordance with the digital input signal bits of an N-bit binary code and thus converted into the analog output signal Vout and output, like the current-steering (current addition) digital-to-analog converter DAC shown in FIG. 25 described above.

Figure 25:
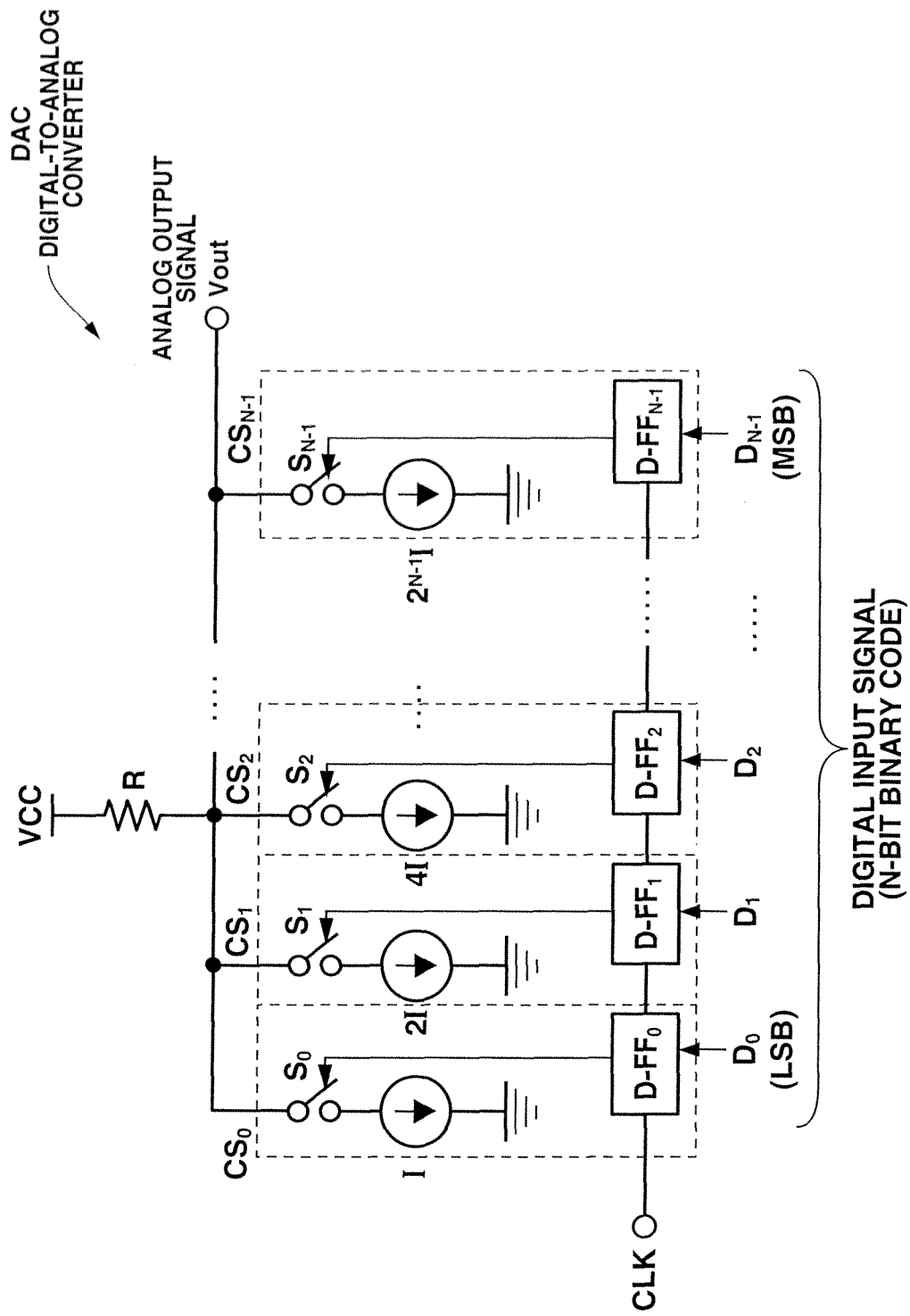
FIG. 25 is a block diagram showing another example of the circuit arrangement of the conventional current-steering (current addition) digital-to-analog converter.

However, the digital-to-analog converter DAC in FIG. 2 including the N current-switching cells $CS_0, CS_1, CS_2, \ldots,$ and $CS_{N-1}$ includes two D flip-flops D-FF (D-FF: circuits having a latch function) in each of the current-switching cells $CS_0, CS_1, CS_2, \ldots,$ and $CS_{N-1}$, unlike FIG. 25. The digital-to-analog converter DAC thus includes 2×N D flip-flops D-$FF_{0A}$, D-$FF_{0B}$, D-$FF_{1A}$, D-$FF_{1B}$, D-$FF_{2A}$, D-$FF_{2B}$, ..., and D-$FF_{(N-1)A}$, and D-$FF_{(N-1)B}$ which temporarily latch N digital input signal bits $D_0$ (LSB side), $D_1, D_2, \ldots,$ and $D_{N-1}$ (MSB side) and output signals obtained by dividing each of the digital input signal bits $D_0, D_1, D_2, \ldots,$ and $D_{N-1}$ and retiming and sampling the signals in accordance with the externally supplied clock signal CLK and the negative-phase signal (negative-phase clock signal CLKB) of the clock signal CLK or the externally supplied clock signal CLK and the negative-phase clock signal CLKB generated by single balance conversion (single phase→difference conversion) of the clock signal CLK.

Additionally, in the digital-to-analog converter DAC in FIG. 2, one current source is arranged in each of the N current-switching cells $CS_0, CS_1, CS_2, \ldots,$ and $CS_{N-1}$ prepared in correspondence with the digital input signal bits $D_0, D_1, D_2, \ldots,$ and $D_{N-1}$. The current sources of the current-switching cells $CS_0, CS_1, CS_2, \ldots,$ and $CS_{N-1}$ are configured to flow currents binary-weighted to current values I (LSB side), 2I, $2^2$I, ..., and $2^{N-1}$I side) in accordance with the position of the corresponding digital input signal bit to the single load resistor having the resistance value R.

Each of the current-switching cells $CS_0, CS_1, CS_2, \ldots$, and $CS_{N-1}$ includes corresponding two of the D flip-flops D-FF$_{0A}$, D-FF$_{0B}$, D-FF$_{1A}$, D-FF$_{1B}$, D-FF$_{2A}$, D-FF$_{2B}$, ..., and D-FF$_{(N-1)A}$, and D-FF$_{(N-1)B}$, unlike FIG. 25, so as to divide each bit into two signals and output them. Hence, each current-switching cell includes a switch circuit including a total of four switches of which the first and third switches are connected in series, and so do the second and fourth switches. The first and second switches are on/off-controlled based on the values of the digital input signal bits, and the third and fourth switches are on/off-controlled based on an externally supplied select signal SW and the negative-phase signal (negative-phase select signal SWB) of the select signal SW or based on the externally supplied select signal SW and the negative-phase select signal SWB generated by single balance conversion (single phase→difference conversion) of the select signal SW.

Hence, the digital-to-analog converter DAC includes N switch circuits each including four serially/parallelly connected switches in correspondence with the respective bits. The digital-to-analog converter DAC includes a total of 4×N switches $S_{01}, S_{02}, S_{03}, S_{04}, S_{11}, S_{12}, S_{13}, S_{14}, S_{21}, S_{22}, S_{23}, S_{24}, \ldots, S_{(N-1)1}, S_{(N-1)2}, S_{(N-1)3}$, and $S_{(N-1)4}$.

Each of the N current sources arranged in thr cur ent-s itching cells $CS_0, CS_1, CS_2, \ldots$, and $CS_{N-1}$, respectively, is connected to the common single load resistor via four switches included in the switch circuit of the corresponding one of the current-switching cells $CS_0, CS_1, CS_2, \ldots$, and $CS_{N-1}$ out of the N switch circuits that is, 4×N switches. As a result, the digital-to-analog converter DAC is configured to determine whether to supply a current to the single load resistor in accordance with the value of a corresponding one of the digital input signal bits $D_0, D_1, D_2, \ldots$, and $D_{N-1}$. Note that symbol VCC denotes a power supply configured to drive the digital-to-analog converter DAC.

Examples of the circuit arrangement and operation of, out of the N current-switching cells $CS_0, CS_1, CS_2, \ldots$, and $CS_{N-1}$ of the digital-to-analog converter DAC according to the first embodiment of the present invention shown in FIGS. 1 and 2, a current-switching cell $CS_M$ corresponding to the Mth bit of the digital input signal bits $D_0, D_1, D_2, \ldots$, and $D_{N-1}$ will be described with reference to FIGS. 3A and 3B.

Figure 3B:
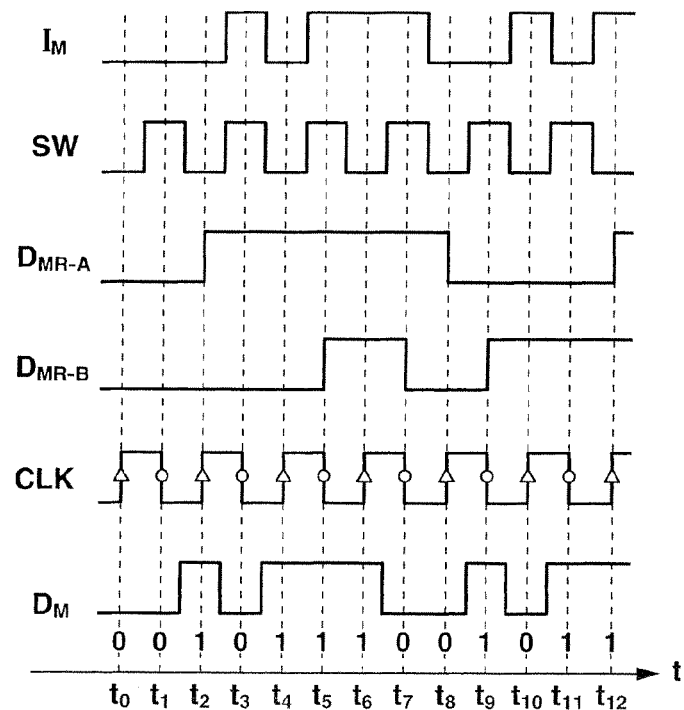
FIG. 3B is a timing chart showing the signal waveforms of various parts of the current-switching cell shown in FIG. 3A.

FIGS. 3A and 3B are schematic views for explaining the operation of the current-switching cell $CS_M$ included in the digital-to-analog converter DAC according to the first embodiment of the present invention. In particular, FIG. 3A shows the circuit arrangement of the Mth current-switching cell $CS_M$ of the N current-switching cells $CS_0, CS_1, CS_2, \ldots$, and $CS_{N-1}$. FIG. 3B shows the signal waveforms of various parts of the Mth current-switching cell $CS_M$ shown in FIG. 3A. Note that FIG. 3A shows, as an example, a case in which a load resistor network (resistor ladder network) including a plurality of resistors formed in a ladder with resistance values R and 2R, as shown in FIG. 1, is provided as the load connected to the current-switching cell CS. Even when the single load resistor is used, as shown in FIG. 2, the operation is the same as the operation to be described below except that the current flowing from the current source to the load resistor changes to the Mth weighted current value.

As shown in FIG. 3A, the Mth current-switching cell $CS_M$ includes a current source 1, a switch circuit 2, a first latch circuit $3_1$, and a second latch circuit $3_2$. In this embodiment, a D flip-flop D-FF$_{MA}$ is used as an example of the first latch circuit $3_1$, and a D flip-flop D-FF$_{MB}$ is used as an example of the second latch circuit $3_2$.

The D flip-flop D-FF$_{MA}$ and the D flip-flop D-FF$_{MB}$ receive an Mth digital input signal bit $D_M$ out the N digital input signal bits (N is an integer of 1 or more).

The D flip-flop D-FF$_{MA}$ latches and retimes the digital input signal $D_M$ at a rising edge of the clock signal CLK, and output a retimed digital input signal $D_{MR-A}$ to the switch circuit 2 as a first half-rate signal. The D flip-flop D-FF$_{MB}$ latches and retimes the digital input signal $D_M$ at a rising edge of the negative-phase clock signal CLKB, and outputs a retimed digital input signal $D_{MR-B}$ to the switch circuit 2 as a second half-rate signal. Both the clock signal CLK and the negative-phase clock signal CLKB may be supplied from outside the IC included in the digital-to-analog converter DAC. Alternatively, only the clock signal CLK may be supplied from outside the IC, and the negative-phase clock signal CLKB may be generated by single balance conversion of the clock signal CLK inside the IC.

The switch circuit 2 has a function of switching the connection state of the current source 1 and a load resistor network (load) 4 and thus switching whether to supply the current from the current source 1 to the load 4. The switch circuit 2 includes a switch $S_{M1}$ and a switch $S_{M3}$ connected in series, and a switch $S_{M2}$ and a switch $S_{M4}$ connected in series. The switches $S_{M1}$ and $S_{M3}$ and the switches $S_{M2}$ and $S_{M4}$ are parallelly inserted between the current source 1 and the load register network 4. In FIG. 3A, the switches $S_{M1}$ and $S_{M2}$ are connected to the load register network 4, and the switches $S_{M3}$ and $S_{M4}$ are connected to the current source 1.

The switch $S_{M1}$ is connected to the D flip-flop D-FF$_{MA}$ and driven by the retimed digital input signal $D_{MR-A}$ output from the D flip-flop D-FF$_{MA}$. The switch $S_{M2}$ is connected to the D flip-flop D-FF$_{MB}$ and driven by the retimed digital input signal $D_{MR-B}$ output from the D flip-flop D-FF$_{MB}$.

The switch $S_{M3}$ is driven by the select signal SW having the same frequency as that of the clock signal CLK but a different phase from that of the clock signal CLK. The switch $S_{M4}$ is driven by the negative-phase select signal SWB that is the negative-phase signal of the select signal SW. The switches $S_{M3}$ and $S_{M4}$ function as select switches that selectively connect one of the circuit including the switch $S_{M1}$ and the circuit including the switch $S_{M2}$ between the current source 1 and the load resistor network 4 in accordance with the select signal SW and the negative-phase select signal SWB.

Figure 26A:
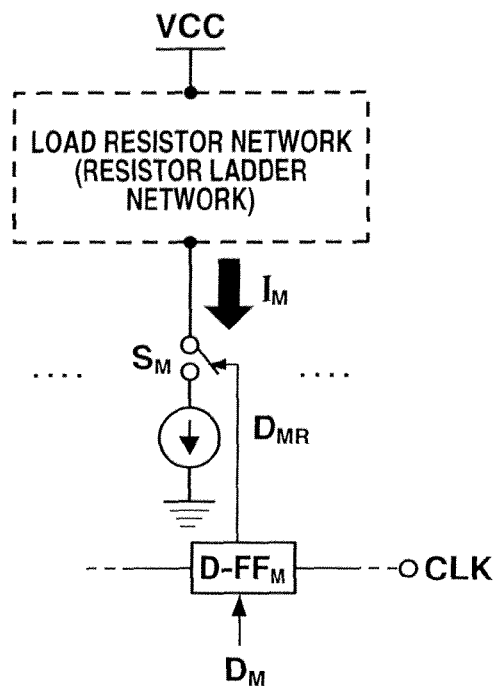
FIG. 26A is a block diagram showing the circuit arrangement of a current-switching cell included in the digital-to-analog converters shown in FIGS. 24 and 25.
Figure 26B:
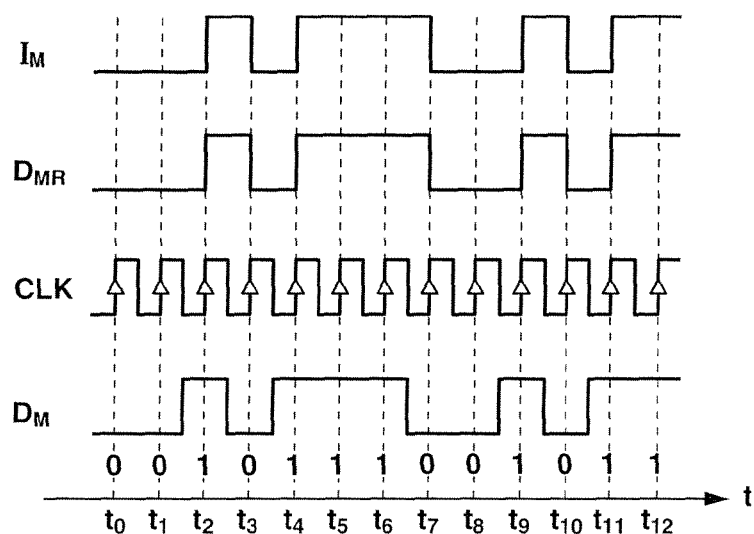
FIG. 26B is a timing chart showing the signal waveforms of various parts of the current-switching cell shown in FIG. 26A.

As a characteristic feature, each of the current-switching cells $CS_0, CS_1, CS_2, \ldots$, and $CS_{N-1}$ included in the digital-to-analog converter DAC according to the first embodiment of the present invention comprises a switch circuit including two D flip-flops D-FF (the D flip-flops D-FF$_{MA}$ and D-FF$_{MB}$ in the Mth current-switching cell $CS_M$) and a total of four switches (the switches $S_{M1}$ to $S_{M4}$ in the Mth current-switching cell $CS_M$) having a 2-parallel/2-serial arrangement, like, for example, the Mth current-switching cell $CS_M$ shown in FIG. 3A but unlike the current-switching cells $CS_0, CS_1, CS_2, \ldots$, and $CS_{N-1}$ included in the conventional digital-to-analog converter DAC shown in FIG. 26A.

According to the characteristic feature of the current-switching cell, the clock signal CLK having a frequency ½ the clock frequency required in the conventional digital-to-analog converter DAC and the negative-phase clock signal CLKB that is the negative-phase signal of the clock signal CLK are used to cause the two D flip-flops D-FF$_{MA}$ and D-FF$_{MB}$ to divide the Mth digital input signal bit $D_M$ into two retimed digital input signals $D_{MR-A}$ and $D_{MR-B}$ formed from two half-rate signals (signals having a signal rate ½ the desired signal rate).

According to the characteristic feature of the current-switching cell, whether to supply the current from the current source to the load resistor network (resistor ladder network) is determined using the select signal SW having the same frequency as that of the clock signal CLK and a phase shifted by, for example, 90° in any one of the directions, the negative-phase select signal SWB that is the negative-phase signal of the select signal SW, the two retimed digital input signals $D_{MR-A}$ and $D_{MR-B}$, and the switch circuit including a total of four switches $S_{M1}$ to $S_{M4}$ having a 2-parallel/2-serial arrangement so as to generate a current corresponding to a full-rate signal by multiplexing the two retimed digital input signals that are two half rate signals and perform an operation at a conversion frequency twice that of the clock signal CLK.

That is, the Mth digital input signal bit $D_M$ input to the Mth current-switching cell $CS_M$, as shown in FIG. 3A, has a signal waveform as shown in FIG. 3B. Unlike FIG. 26A, the two D flip-flops D-FF$_{MA}$ and D-FF$_{ME}$ sample and divide the digital input signal bit into two signals and simultaneously retime them at a rising edge (timing indicated by Δ in FIG. 3B) of the clock signal CLK having a frequency ½ the clock frequency necessary in the conventional digital-to-analog converter DAC and a rising edge (=a falling edge of the clock signal CLK: timing indicated by ○ in FIG. 3B) of the negative-phase clock signal CLKB, as shown in FIGS. 3A and 3B.

As a result, the D flip-flops D-FF$_{MA}$ and D-FF$_{MB}$ generate, as the retimed digital input signals $D_{MR-A}$ and $D_{MR-B}$, two half-rate signals by dividing the information of the digital input signal bit D.

As shown in FIG. 3B, the Mth digital input signal bit $D_M$ is sampled and retimed by the D flip-flop D-FF$_{MA}$ at the rising edge of the clock signal CLK out of the two rising edges of the clock signal CLK and the negative-phase clock signal CLKB, and output as the retimed digital input signal $D_{MR-A}$. The Mth digital input signal bit $D_M$ also sampled and retimed by the D flip-flop D-FF$_{MR-B}$ at the rising edge of the negative-phase clock signal CLKB, and output as the retimed digital input signal $D_{MR-B}$, as shown in FIG. 3B.

The two retimed digital input signals $D_{MR-A}$ and $D_{MR-B}$ retimed to be c incident with the rising edge of the clock signal CLK and that of the negative-phase clock signal CLKB, respectively, and output from the two D flip-flops D-FF$_{MA}$ and D-FF$_{MB}$, serve as the two half-rate signals that drive the two switches $S_{M1}$ and $S_{M2}$ located on the upper stage side out of the four switches $S_{M1}$ to $S_{M4}$ included in the switch circuit of the Mth current-switching cell $CS_M$ and determine the on/off states of the two switches $S_{M1}$ and $S_{M2}$ on the upper stage side. That is, in FIG. 3A, the two switches $S_{M1}$ and $S_{M2}$ form the first and second switches to be driven by the two half-rate signals, respectively.

When the retimed digital input signal $D_{MR-A}$ is "High", whether to flow a current signal $I_M$ from the current source to the load resistor network (resistor ladder network) is determined based on the on/off state of the switch $S_{M3}$ on the lower stage side. On the other hand, when the retimed digital input signal $D_{MR-B}$ is "High", whether to flow the current signal $I_M$ from the current source to the load resistor network (resistor ladder network) is determined based on the on/off state of the switch $S_{M4}$ on the lower stage side.

In this state, the select signal SW having the same frequency as that of the clock signal CLK and a phase shifted in any one of the directions and the negative-phase select signal SWB that is the negative-phase signal of the select signal SW are input to the two switches $S_{M3}$ and $S_{M4}$ located on the lower stage side out of the four switches $S_{M1}$ to $S_{M4}$ included in the switch circuit of the Mth current-switching cell $CS_M$, as shown in FIG. 3B, thereby determining the on/off states of the two switches $S_{M3}$ and $S_{M4}$ on the lower stage side. That is, in FIG. 3A, the two switches form the third and fourth switches to be driven by the select signal SW and the negative-phase select signal SWB, respectively.

Hence, when the select signal SW is "High", whether to flow the current signal $I_M$ to the load resistor network (resistor ladder network) is determined based on the on/off state of the switch $S_{M1}$ on the upper stage side. When the negative-phase select signal SWB is "High", whether to flow the current signal $I_M$ to the load resistor network (resistor ladder network) is determined based on the on/off state of the switch $S_{M2}$ on the upper stage side.

Note that the select signal SW has the same frequency as that of the clock signal but has a phase shift of a certain angle ranging from 0° to 180° (for example, 90° ideally) with respect to the clock signal CLK, as described above. The phase shift of the select signal SW with respect to the clock signal CLK can be set by selecting an arbitrary value based on, for example, the phase margin of the switch circuit in the digital-to-analog converter DAC.

For example, assume that the select signal SW has a phase shift of 90° with respect to the clock signal CLK. In the example of FIG. 3B, at, for example, time $t=t_3$ that is one of the falling edges of the clock signal CLK, the select signal SW is "High". Since the switch $S_{M1}$ on the upper stage side out of the four switches $S_{M1}$ to $S_{M4}$ is on, and the retimed digital input signal $D_{MR-A}$ is "High", the switch $S_{M3}$ on the lower stage side, which is connected in series with the switch $S_{M1}$ on the upper stage side, is on, too. As a result, the current signal $I_M$ flows to the load resistor network (resistor ladder network).

On the other hand, at, for example, time $t=t_4$ that is one of the rising edges of the clock signal CLK, the retimed digital input signal $D_{MR-A}$ is "High", and the switch $S_{M3}$ on the lower stage side is on. However, since the select signal SW is "Low", the switch $S_{M1}$ on the upper stage side, which is connected in series with the switch $S_{M3}$ on the lower stage side, is off.

In addition, since the negative-phase select signal SWB on, the negative-phase signal side of the select signal SW is "High", the switch $S_{M2}$ on the upper stage side out of the four switches $S_{M1}$ to $S_{M4}$ is on. However, since the retimed digital input signal $D_{MR-B}$ is "Low", the switch $S_{M4}$ on the lower stage side, which is connected, in series with the switch $S_{M2}$ on the upper stage side, is off. Hence, at time $t=t_4$, the current signal $I_M$ does not flow to the load resistor network (resistor ladder network), as shown in FIG. 3S.

With the above-described operation, the two half-rate signals divided as the two retimed digital input signals $D_{MR-A}$ and $D_{MR-B}$ are generated by the two D flip-flops D-FF (the D flip-flops D-FF$_{MA}$ and D-FF$_{MB}$ in the Mth current-switching cell $CS_M$ corresponding to the Mth digital input signal bit $D_M$) using the clock signal CLK and negative-phase clock signal CLKB having a frequency ½ the originally required operating frequency.

After that, the two generated half-rate signals are multiplexed into a full-rate signal (the signal having the originally required operating frequency) in each switch circuit (the switch circuit included in the Mth current-switching cell $CS_M$ for the Mth digital input signal bit $D_M$) including a total of four switches (the switches $S_{M1}$ to $S_{M4}$ for the Mth digital input signal bit $D_M$) having a 2-parallel/2-serial arrangement and converted into one current signal $I_M$ (flowing to the load resistor network) corresponding to the Mth digital input signal bit $D_M$.

That is, the current-switching cell $CS_M$ of the digital-to-analog converter DAC according to the first embodiment of the present invention shown in FIG. 3A can generate the current signal $I_M$ (flowing to the load resistor network) having the same rate as that in the conventional digital-to-analog converter DAC using the clock signal CLK having a ½ frequency, as compared to the current-switching cell $CS_M$ of the conventional digital-to-analog converter DAC, as shown in FIG. 26A.

The above-described operation of the current-switching cell $CS_M$ of the digital-to-analog converter DAC according to the first embodiment of the present invention shown in FIG. 3A as will be summarized below.

(1) The current-switching cell $CS_M$ is arranged for each digital input signal bit. For, for example, the Mth digital input signal bit $D_M$, the current-switching cell $CS_M$ includes the two D flip-flops D-$FF_{MA}$ and D-$FF_{MB}$ having the latch function, the clock signal CLK and the negative-phase clock signal CLKB to be used for retiming and sampling by edge trigger, for example, rising edge trigger of the digital input signal bit $D_M$, the select signal SW having the same frequency as that of the clock signal CLK and a phase shifted in any one of the directions by a certain angle ranging from 0° to 150° (for example, 90° ideally) with respect to the clock signal CLK and the negative-phase select signal SWB, the switch circuit including four switches $S_{M1}$ to $S_{M4}$ serially/parallelly connected by twos, and the current source connected to the switch circuit (note that although the number of current sources is one but may be two or more as will be described in the second embodiment), and is connected to a load resistor network (resistor ladder network) a single load resistor.

(2) The frequency of the clock signal CLK is ½ the originally required operating frequency (full-rate), that is, the half-rate frequency.

(3) The Mth digital input signal bit $D_M$ is divided into two retimed digital input signals $D_{MR-A}$ and $D_{MR-B}$ by edge trigger, for example, rising edge trigger of the clock signal CLK and the negative-phase clock signal CLKB.

(4) The four switches $S_{M1}$ to $S_{M4}$ serially/parallelly connected by twos in the switch circuit are driven by the two retimed digital input signals $D_{MR-A}$ and $D_{MR-B}$ the select signal SW, and the negative-phase select signal SWB, respectively.

(5) The current signal $I_M$ or a weighted current $2^M I$, from the current source is supplied to the load resistor network (resistor ladder network) or the single load resistor when
{$(D_{MR-A})_{HIGH}$ AND $(SW)_{HIGH}$}
or {$(D_{MR-B})_{HIGH}$ AND $(SWB)_{HIGH}$}
holds (6) The current signal $I_M$ or the weighted current $2^M I$ is eventually on/off-controlled at the edge timings, for example, rising edges of the select signal SW and the negative-phase select signal SWB having the same frequency as that of the clock signal CLK so as to output an analog output signal equivalent to that of D/A (Digital-to-Analog) conversion at the full rate corresponding to the double rate of the frequency of the clock signal CLK.

Note that in the above description of FIG. 3A, the retimed digital input signals $D_{MR-A}$ and $D_{MR-B}$ (0≦M≦N–1) that are two data signals, that is, two half-rate signals drive the two switches $S_{M1}$ and $S_{M2}$ on the upper stage side out of the four switches $S_{M1}$ to $S_{M4}$ included in the switch circuit, and the select signal SW and the negative-phase select signal SWB drive the two switches $S_{M3}$ and $S_{M4}$ on the lower stage side.

However, the present invention is not limited to this. The same operation can be implemented even when, for example, the retimed digital input signals $D_{MR-A}$ and $D_{MR-B}$ (0≦M≦N–1) that are two data signals, that is, two half-rate signals drive the two switches $S_{M3}$ and $S_{M4}$ serving as the first and second switches on the lower stage side, and the select signal SW and the negative-phase select signal SWB drive the two switches $S_{M1}$ and $S_{M2}$ serving as the third and fourth switches on the upper stage side, as shown in FIGS. 4, 5, 6A and 6B.

FIG. 4 is a block diagram showing still another example of the circuit arrangement of the digital-to-analog converter DAC according to the first embodiment of the present invention. FIG. 4 illustrates a modification of the digital-to-analog converter DAC shown in FIG. 1. In the digital-to-analog converter DAC shown in FIG. 4, the retimed digital input signals $D_{MR-A}$ and $D_{MR-B}$ (0≦M≦N–1) that are two half-rate signals drive the two switches $S_{M3}$ and $S_{M4}$ on the lower stage side, and the select signal SW and the negative-phase select signal SWB drive the two switches $S_{M1}$ and $S_{12}$ on the upper stage side, as described above, unlike the digital-to-analog converter DAC shown in FIG. 1.

Figure 5:
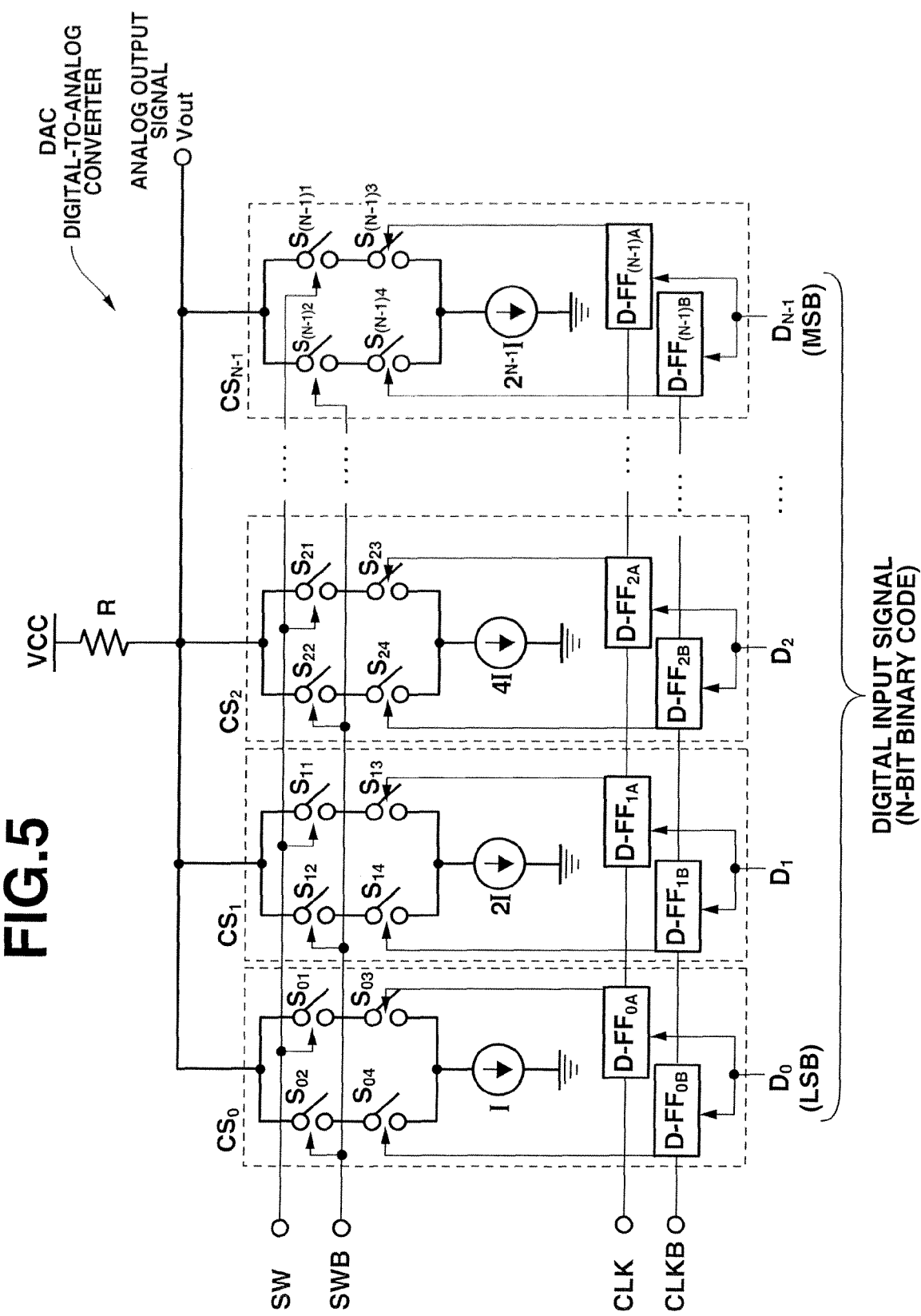
FIG. 5 is a block diagram showing yet another example of the circuit arrangement of the digital-to-analog converter according to the first embodiment of the present invention.

FIG. 5 is a block diagram showing yet another example of the circuit arrangement of the digital-to-analog converter DAC according to the first embodiment of the present invention. FIG. 5 illustrates a modification of the digital-to-analog converter DAC shown in FIG. 2. In the digital-to-analog converter DAC shown in FIG. 5, the retimed digital input signals $D_{MR-A}$ and $D_{MR-B}$ (0≦M≦N–1) that are two half-rate signals drive the two switches $S_{M3}$ and $S_{M4}$ on the lower stage side, and the select signal SW and the negative-phase select signal SWB drive the two switches $S_{M1}$ and $S_{M2}$ on the upper stage side, as described above, unlike the digital-to-analog converter DAC shown in FIG. 2.

Figure 6A:
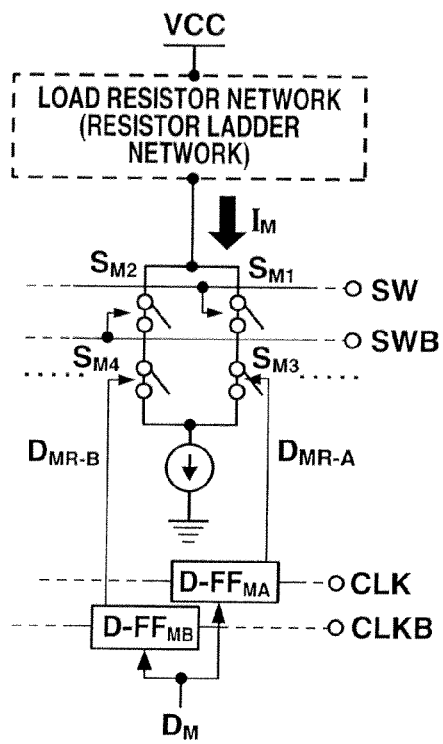
FIG. 6A is a block diagram showing the circuit arrangement of a current-switching cell included in the digital-to-analog converters shown in FIGS. 4 and 5.
Figure 6B:
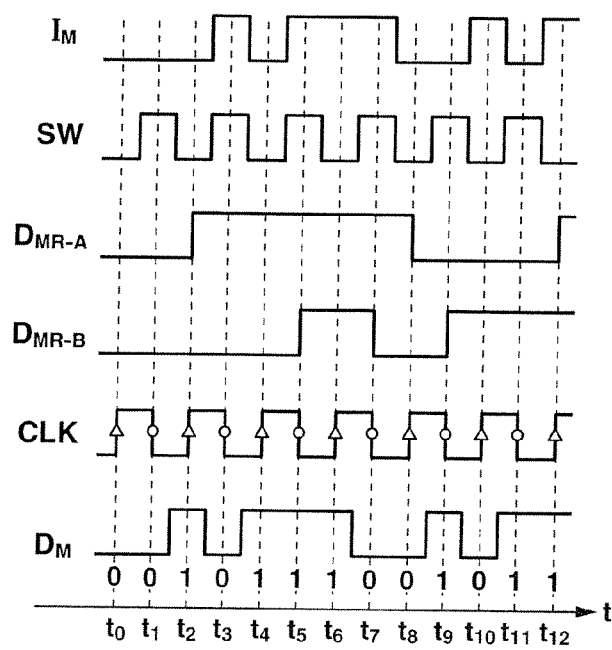
FIG. 6B is a timing chart showing the signal waveforms of various parts of the current-switching cell shown in FIG. 6A.

FIGS. 6A and 6B are schematic views for explaining the operation of a current-switching cell included in the digital-to-analog converter DAC according to the other arrangement example of the first embodiment of the present invention shown in FIG. 4 or 5. FIGS. 6A and 6B show a modification of the current-switching cell shown in FIGS. 3A and 3B. FIG. 6A shows the circuit arrangement of the Mth current-switching cell $CS_M$ of the N current-switching cells $CS_0$, $CS_1$, $CS_2$, ..., and $CS_{N-1}$. FIG. 6B shows the signal waveforms of various parts of the Mth current-switching cell $CS_M$ shown in FIG. 6A.

Note that the signal waveforms in FIG. 6B are the same as those in FIG. 3B, and a repetitive description will be omitted. In the current-switching cell $CS_M$ shown in FIG. 6A, the retimed digital input signals $D_{MR-A}$ and $D_{MR-B}$ that are two half-rate signals drive the two switches $S_{M3}$ and $S_{M4}$ serving as the first and second switches on the lower stage side, and the select signal SW and the negative-phase select signal SWB drive the two switches $S_{M1}$ and $S_{M2}$ serving as the third and fourth switches on the upper stage side, as described above, unlike the current-switching cell shown in FIG. 3A.

In the circuit of the current-switching cell $CS_M$ shown in FIG. 3A or t, each of the four switches $S_{M1}$ to $S_{M4}$ included in the switch circuit may be formed from a transistor circuit. In this case, a bipolar transistor or an FET (Field Effect Transistor) may be used as the switching element of each of the four switches $S_{M1}$ to $S_{M4}$ in the switch circuit.

Figure 27:
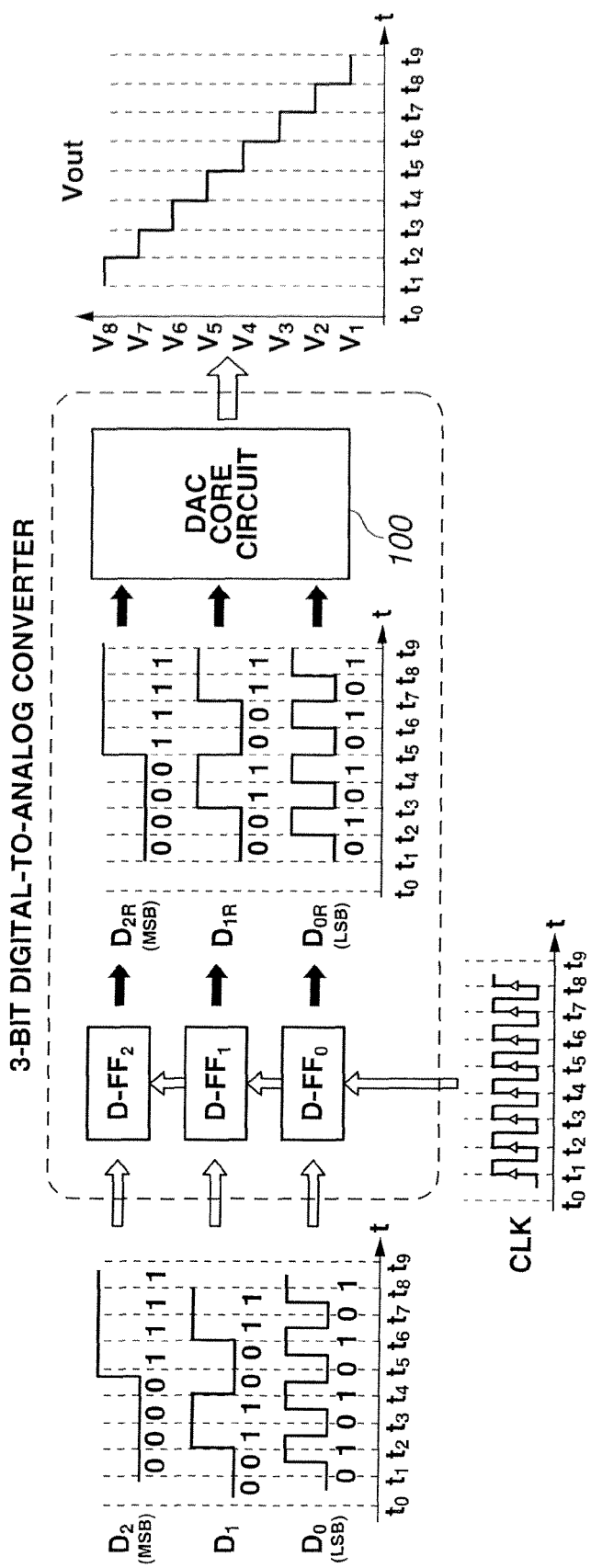
FIG. 27 is a schematic view for explaining the operation of the entire conventional current-steering (current addition) digital-to-analog converter by taking a 3-bit structure as an example.
Figure 28:
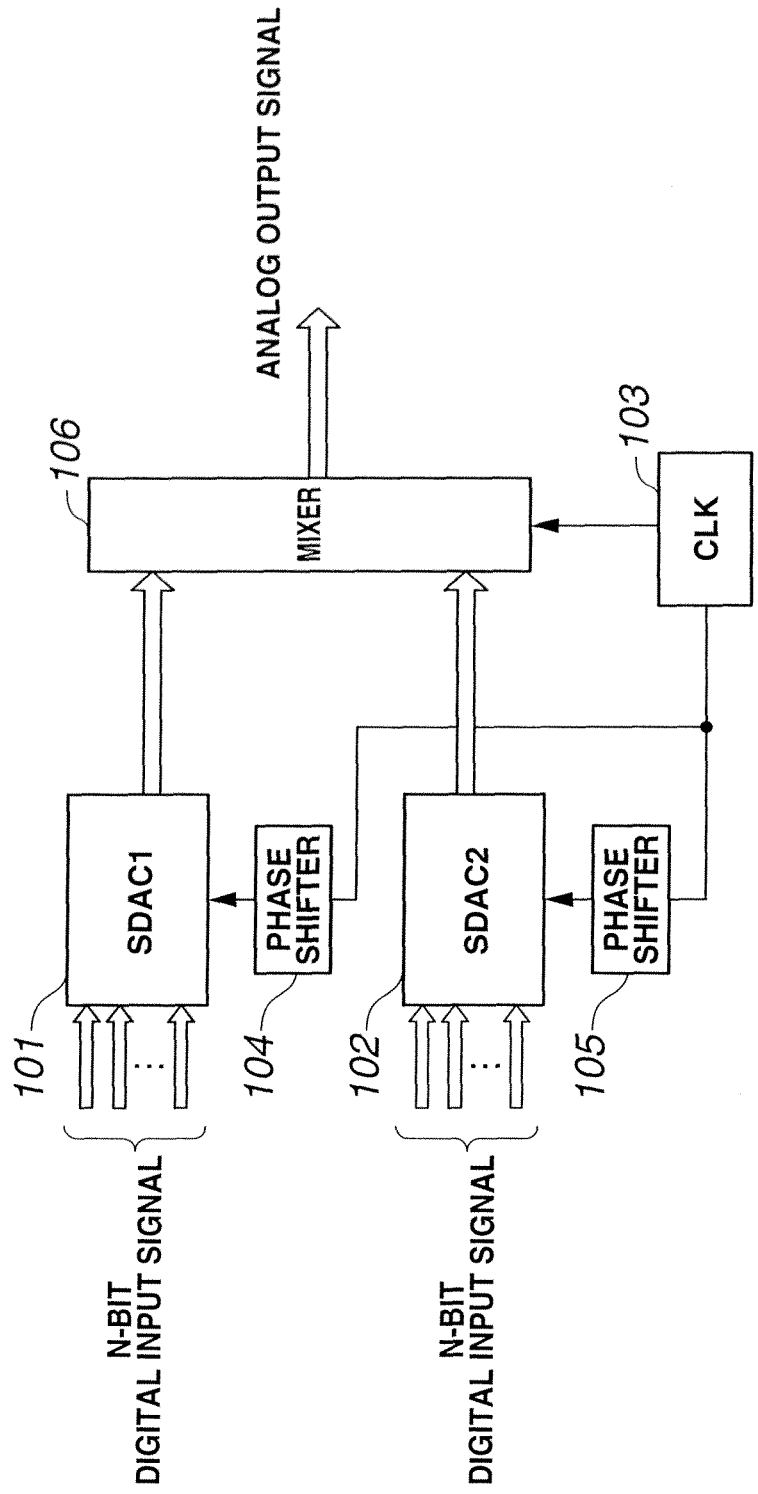
FIG. 28 is a block diagram showing an example of the arrangement of a conventional interleaved digital-to-analog converter.

The outline of the D/A (Digital-to-Analog) conversion operation of the digital-to-analog converter DAC according to the first embodiment of the present invention shown in FIG. 1 or 2 or FIG. 4 or 5 formed using the current-switching cell $CS_M$ as shown in FIG. 3A or 6A described above will be described next in more detail with reference to the schematic view of FIG. 7. FIG. 7 is a schematic view for explaining the operation of the entire digital-to-analog converter DAC according to the first embodiment of the present invention by taking a 3-bit structure as an example. FIG. 7 indicates that the analog output signal Vout corresponding to the three digital input signal bits $D_0$ (LSB side), $D_1$, and $D_2$ (MSB side) is generated, as in the schematic view of FIG. 27.

Note that three current-switching cells $CS_0$, $CS_1$, and $CS_2$ including D flip-flop D-FF groups each including two D flip-flops (D-$FF_{0A}$ & D-$FF_{0B}$, D-$FF_{1A}$ & D-$FF_{1B}$, or D-$FF_{2A}$ & D-$FF_{2B}$), switch circuits each including four switches $S_{01}$ to $S_{04}$, $S_{11}$ to $S_{14}$, or $S_{21}$ to $S_{24}$, and current sources are provided in correspondence with the three digital input signal bits $D_0$, $D_1$, and $D_2$, although not illustrated in FIG. 7. FIG. 7 illustrates the D flip-flop D-FF groups each including two D flip-flops (D-$FF_{0A}$ & D-$FF_{0B}$, D-$FF_{1A}$ & D-$FF_{1B}$, or D-$FF_{2A}$ & D-$FF_{2B}$) but shows the remaining switch circuits each including four switches $S_{01}$ to $S_{04}$, $S_{11}$ to $S_{14}$, or $S_{21}$ to $S_{24}$ and the current sources of the current-switching cells $CS_0$, $CS_1$, and $CS_2$ in a form different from FIG. 1, 2, 4, or 5 as a DAC core circuit 10 that performs the D/A conversion operation together with the load-side resistor ladder network.

Referring to FIG. 7, the digital input signal bits $D_0$, $D_1$, and $D_2$ are input to the digital-to-analog converter DAC. The three digital input signal bits $D_0$, $D_1$, and $D_2$ are external signal bits. In general, the three data bits somewhat have a shift on the time axis, as shown in FIG. 7.

Each of the three digital input signal bits $D_0$, $D_1$, and $D_2$ is retimed by corresponding two D flip-flops of the D flip-flop D-FF groups (D-$FF_{0A}$ & D-$FF_{0B}$, D-$FF_{1A}$ & D-$FF_{1B}$, and D-$FF_{2A}$ & D-$FF_{2B}$) to a rising edge (timing indicated by Δ in FIG. 7) of the clock signal CLK having a frequency ½ of originally required operating frequency, that is, the clock frequency necessary in the conventional digital-to-analog converter DAC and a rising edge (=a falling edge of the clock signal CLK: timing indicated by ○ in FIG. 7) of the negative-phase clock signal CLKB to eliminate the shift on the time axis, and simultaneously divided into two half-rate signals.

As a result, each D flip-flop D-FF group including two D flip-flops outputs corresponding two of retimed digital input signals $D_{0R-A}$ & $D_{0R-B}$ (LSB side), $D_{1R-A}$ & $D_{1R-B}$, and $D_{2R-A}$ & $D_{2R-B}$ (MOB side) as two half rate signals obtained by dividing a corresponding one of the three digital input signal bits $D_0$, $D_1$, and $D_2$, and inputs the retimed digital input signals to the switch circuit in the DAC core circuit 10 to which the select signal SW and the negative-phase select signal SWB are supplied.

After that, each of the current-switching cells $CS_0$, $CS_1$, and $CS_2$ as described above with reference to FIGS. 3A and 3B performs the operation such that corresponding four of the switches $S_{01}$ to $S_{04}$, $S_{11}$ to $S_{14}$, and $S_{21}$ to $S_{24}$ of the switch circuits provided in the DAC core circuit 10 are driven by corresponding two of the retimed digital input signals $D_{0R-A}$ & $D_{0R-B}$, $D_{1R-A}$ & $D_{1R-B}$, and $D_{2R-A}$ & $D_{2R-B}$r which are two half-rate signals, the select signal SW, and the negative-phase select signal SWB to flow the current supplied from the current source to the load (the load resistor network in the example shown in FIG. 7). The half-rate signals are thus multiplexed into a full-rate signal. In addition, desired current addition processing (binary-weighted current generation) is executed to weight the currents in accordance with the values of the retimed digital input signal bits $D_{0R-A}$ & $D_{0R-B}$, $D_{1R-A}$ & $D_{1R-A}$, and $D_{2R-A}$ & $D_{2R-B}$. Finally, the analog output signal Vout (voltage) in eight levels (=$2^3$) corresponding to the digital input signal bits $D_0$, $D_1$, and $D_2$ is generated and output, as shown in FIG. 7.

As described above, the digital-to-analog converter DAC according to the first embodiment of the present invention can achieve the same D/A (Digital-to-Analog) conversion operation speed as that of the conventional digital-to-analog converter DAC by the clock signal CLK having a frequency ½ that in the conventional digital-to-analog converter DAC.

Figure 8:
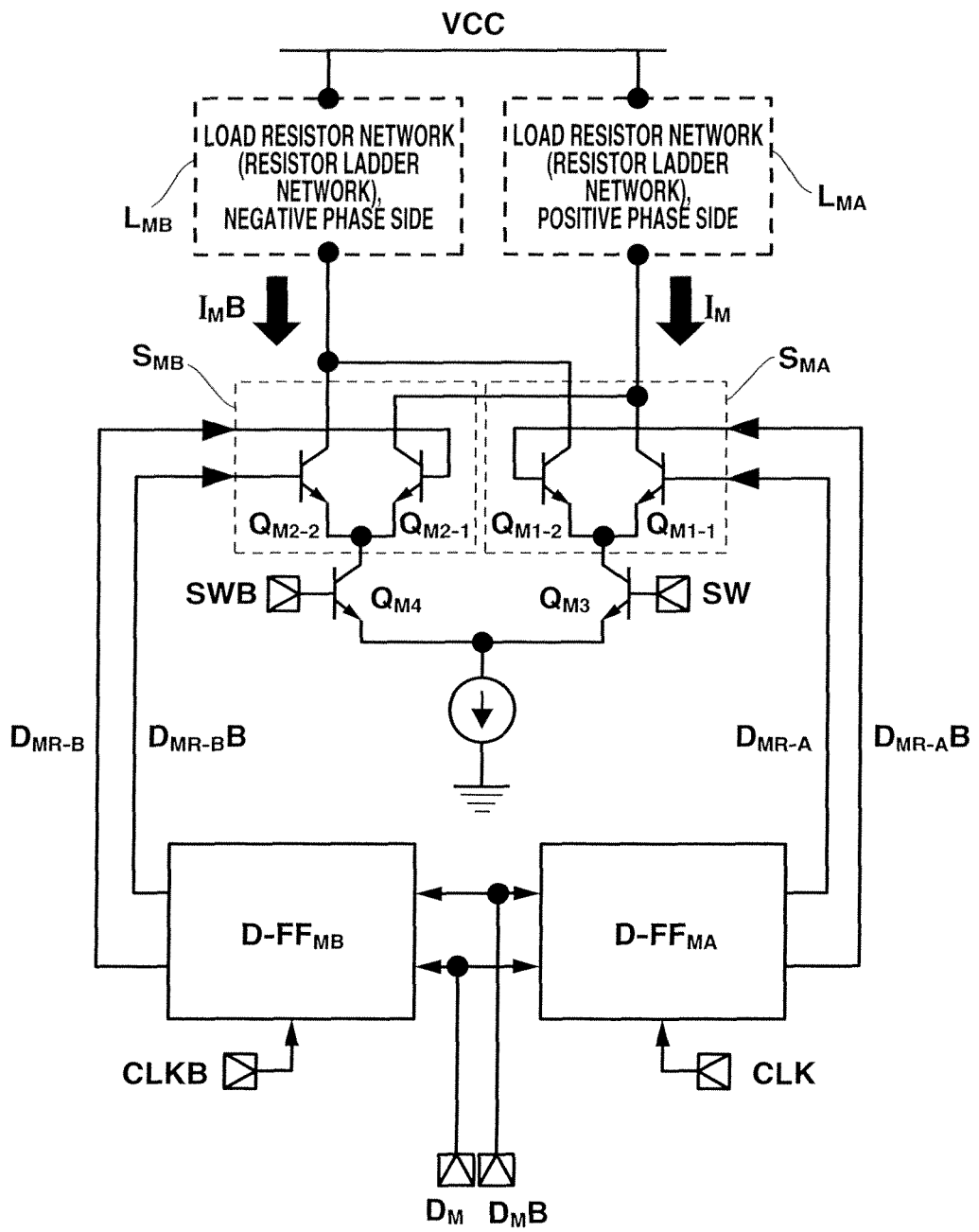
FIG. 8 is a block diagram showing an example of the block arrangement in which the current-switching cell included in the digital-to-analog converter according to the first embodiment of the present invention is formed as a differential circuit.

Applying the circuit arrangement shown in FIG. 8 to the current-switching cell shown in FIG. 3A allows to implement a differential circuit, that is, a differential digital-to-analog converter DAC which receives differential digital input signals and outputs differential analog output signals. FIG. 8 is a block diagram showing an example of the block arrangement in which the current-switching cell included in the digital-to-analog converter DAC according to the first embodiment of the present invention is formed as a differential circuit. In this example, the switch circuit of the current-switching cell is formed as two differential switch circuits each of which is driven by two differential half-rate signals obtained by dividing one of differential digital input signals into two signals and retiming them by the clock signal CLK and the negative-phase clock signal CLKB. Each of the two differential switch circuits is formed by a differential amplifier circuit including a pair of transistors.

As shown in FIG. 8, the current-switching cell $CS_M$ that forms the differential circuit includes the two D flip-flops D-$FF_{MA}$ and D-$FF_{MB}$ for differential input/output which latch a positive-phase-side digital input signal $D_M$ that is the positive-phase signal out of the differential digital input signals and a negative-phase-side digital input signal $D_M B$ that is the negative-phase signal by the clock signal CLK and the negative-phase clock signal CLKB, respectively, divide the signals into two pairs of differential half-rate signals (the retimed digital input signal (first differential half-rate signal) $D_{MR-A}$ and its negative-phase retimed digital input signal (first differential half-rate signal) $D_{MR-A}B$ and the retimed digital input signal (second differential half-rate signal) $D_{MR-B}$ and its negative-phase retimed digital input signal (second differential half-rate signal) $D_{MR-B}B$), and retimes and outputs the signals.

As for the switch circuit including the four switches $S_{M1}$ to $S_{M4}$ serially/parallelly connected by twos, the first and second switches to be driven by the two pairs of differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$) are formed as two differential switch circuits. The two differential switch circuits are formed by a positive-phase-side differential amplifier circuit $S_{MA}$ including a pair of transistors $Q_{M1-1}$ and $Q_{M1-2}$ and a negative-phase-side differential amplifier circuit $S_{MB}$ including a pair of transistors $Q_{M2-1}$ and $Q_{M2-2}$. On the other hand, the third and fourth switches to be driven by the select signal SW and the negative-phase select signal SWB are formed by transistors $Q_{M3}$ and $Q_{M4}$, respectively. The collectors of the transistors $Q_{M3}$ and $Q_{M4}$ included in the third and fourth switches are connected to the emitter sides of the pairs of transistors $Q_{M1-1}$, $Q_{M1-2}$, $Q_{M2-1}$, and $Q_{M2-2}$ of the positive-phase-side differential amplifier circuit $S_{MA}$ and the negative-phase-side differential amplifier circuit $S_{MB}$ included in the first and second switches, thereby connecting the switches in series.

The load side also includes two load groups, that is, a positive-phase-side load resistor network (resistor ladder network) $L_{MA}$ to which a current corresponding to the positive-phase signal flows and a negative-phase-side load resistor network (resistor ladder network) $L_{MB}$ to which a current corresponding to the negative-phase signal flows. A current source configured to flow a positive-phase current signal $I_M$ and a negative-phase current digital $I_M B$ to the positive-phase-side load resistor network (resistor ladder network) $L_{MA}$ and the negative-phase-side load resistor network (resistor ladder network) $L_{MB}$ is connected to the transistors $Q_{M3}$ and $Q_{M4}$ included in the switches $S_{M3}$ and $S_{M4}$ on the lower stage side out of the four switches $S_{M1}$ to $S_{M4}$ of the switch circuit.

Note that the positive-phase-side load resistor network (resistor ladder network) $L_{MA}$ is connected to the transistors $Q_{M1-1}$ and $Q_{M2-1}$ to be driven by the positive-phase-side retimed digital input signals $D_{MR-A}$ and $D_{MR-B}$ of the positive-phase-side differential amplifier circuit $S_{MA}$ and the negative-phase-side differential amplifier circuit $S_{MB}$ included in the switches $S_{M1}$ and $S_{M2}$ on the upper stage side out of the four switches $S_{M1}$ to $S_{M4}$ of the switch circuit. On the other hand, the negative-phase-side load resistor network (resistor ladder network) $L_{MB}$ is connected to the transistors $Q_{M1-2}$ and $Q_{M2-2}$ to be driven by the negative-phase-side retimed digital input signals $D_{MR-A}B$ and $D_{MR-B}B$ of the positive-phase-side differential amplifier circuit $S_{MA}$ and the negative-phase-side differential amplifier circuit $S_{MB}$ on the upper stage side.

The operation of the differential current-switching cell $CS_M$ shown in FIG. 8 will be described below. The Mth differential digital input signal bit $D_M$ and its negative-phase signal $D_MB$ input to the differential current-switching cell $CS_M$ are retimed by the two D flip-flops D-$FF_{MA}$ and D-$FF_{MB}$ for differential input/output to a rising edge of the clock signal CLK having a frequency ½ the clock frequency necessary in the conventional digital-to-analog converter DAC and a rising edge (=a falling edge of the clock signal CLK) of the negative-phase clock signal CLKB and simultaneously divided.

As a result, the two D flip-flops D-$FF_{MA}$ and D-$FF_{MB}$ for differential input/output generate a total of four half-rate signals, that is, two pairs of differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MB-B}B$) by dividing each the information of the differential digital input signal bit $D_M$ and its differential signal $D_MB$ into two signals.

The retimed digital input signal $D_{MR-A}$ and its negative-phase retimed digital input signal $D_{MB-A}B$ and the retimed digital input signal $D_{MR-B}$ and its negative-phase retimed digital input signal $D_{MR-B}B$ that are the two pairs of differential half-rate signals drive the pair of transistors $Q_{M1-1}$ and $Q_{M1-2}$ and the pair of transistors $Q_{M2-1}$ and $Q_{M2-2}$ included in the positive-phase-side differential amplifier circuit $S_{MA}$ and the negative-phase-side differential amplifier circuit $S_{MB}$ which function as the switches $S_{M1}$ and $S_{M2}$ on the upper stage side out of the four switches $S_{M1}$ to $S_{M4}$ included in the switch circuit.

In this state, the select signal SW having the same frequency as that of the clock signal CLK and a phase shifted in any one of the directions and the negative-phase select signal SWB that is the negative-phase signal of the select signal SW are input to the transistors $Q_{M3}$ and $Q_{M4}$ corresponding to the two switches $S_{M3}$ and $S_{M4}$ located on the lower stage side out of the four switches $S_{M1}$ to $S_{M4}$ included in the switch circuit of the Mth current-switching cell $CS_M$, thereby determining the on/off states of the two switches $S_{M3}$ and $S_{M4}$ on the lower stage side, that is, the transistors $Q_{M3}$ and $Q_{M4}$.

As a result, when the transistors $Q_{M3}$ and $Q_{M4}$ are turned on by the select signal SW and the negative-phase select signal SWB, the positive-phase current signal $I_M$ corresponding to the positive-phase-side digital input signal $D_M$ flows to the positive-phase-side load resistor network (resistor ladder network) $L_{MA}$, and the negative-phase current digital $I_MB$ corresponding to the negative-phase-side digital input signal $D_MB$ flows to the negative-phase-side load resistor network (resistor ladder network) $L_{MB}$.

Hence, applying the differential current-switching cell $CS_M$ as shown in FIG. 8 to all the current-switching cells $CS_0$, $CS_1$, $CS_2$, ..., and $CS_{N-1}$ of the digital-to-analog converter DAC shown in FIG. 1 or 2 allows to implement a differential digital-to-analog converter DAC which performs the differential operation for all digital input signal bits.

In the circuit arrangement shown in FIG. 8, the upper and lower switches of the four switches $S_{M1}$ to $S_{M4}$ and the signals that drive the switches may be replaced with each other so that the two pairs of differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$ ($0 \leq M \leq N-1$)) drive the positive-phase-side differential amplifier circuit $S_{MA}$ and the negative-phase-side differential amplifier circuit $S_{MB}$ arranged as the two switches $S_{M3}$ and $S_{M4}$ on the lower stage side, and the select signal SW and the negative-phase select signal SWB drive the transistors $Q_{M3}$ and $Q_{M4}$ arranged as the two switches $S_{M1}$ and $S_{M2}$ on the upper stage side.

Applying the differential current-switching cell in which the upper and lower switches of the four switches $S_{M1}$ to $S_{M4}$ included in the switch circuit and the signals that drive the switches are thus replaced with each other to all the current-switching cell. $CS_0$, $CS_1$, $CS_2$, ..., and $CS_{N-1}$ of the digital-to-analog converter DAC shown in FIG. 1 or 2 or FIGS. 4 to 5 (when applying to the switch circuit in FIG. 4 or 5, the upper- and lower-stage-side switches of the four switches $S_{M1}$ to $S_{M4}$ included in the switch circuit of the differential current-switching cell $CS_M$ shown in FIG. 8 are replaced) allows to implement a differential digital-to-analog converter DAC which performs the differential operation for all digital input signal bits and further improve the linearity (quality) of the analog output signal.

Note that in the circuit of the differential current-switching cell $CS_M$ shown in FIG. 8, a bipolar transistor is used as each switching element of the four switches $S_{M1}$ to $S_{M4}$ included in the switch circuit. However, the present invention is not limited to the bipolar transistor. Any other element capable of implementing the current-switching function is usable. For example, the same function as described above can be implemented using an FET (Field Effect Transistor).

In the current-switching cell according to the first embodiment or the digital-to-analog converter DAC according to the first embodiment, two waveform shaping buffer circuits are connected between the D flip-flops D-$FF_{MA}$ and D-$FF_{MB}$ ($0 \leq M \leq N-1$) and the switch circuit (the switches $S_{M1}$ to $S_{M4}$). This allows to improve the quality of the switch driving data waveforms, that is, the retimed digital input signals $D_{MR-A}$ and $D_{MR-B}$ as the half-rate signals and suppress the degradation (data field through or the like) of the signal waveform of the analog output signal Vout caused by the switch driving waveforms.

Figure 9:
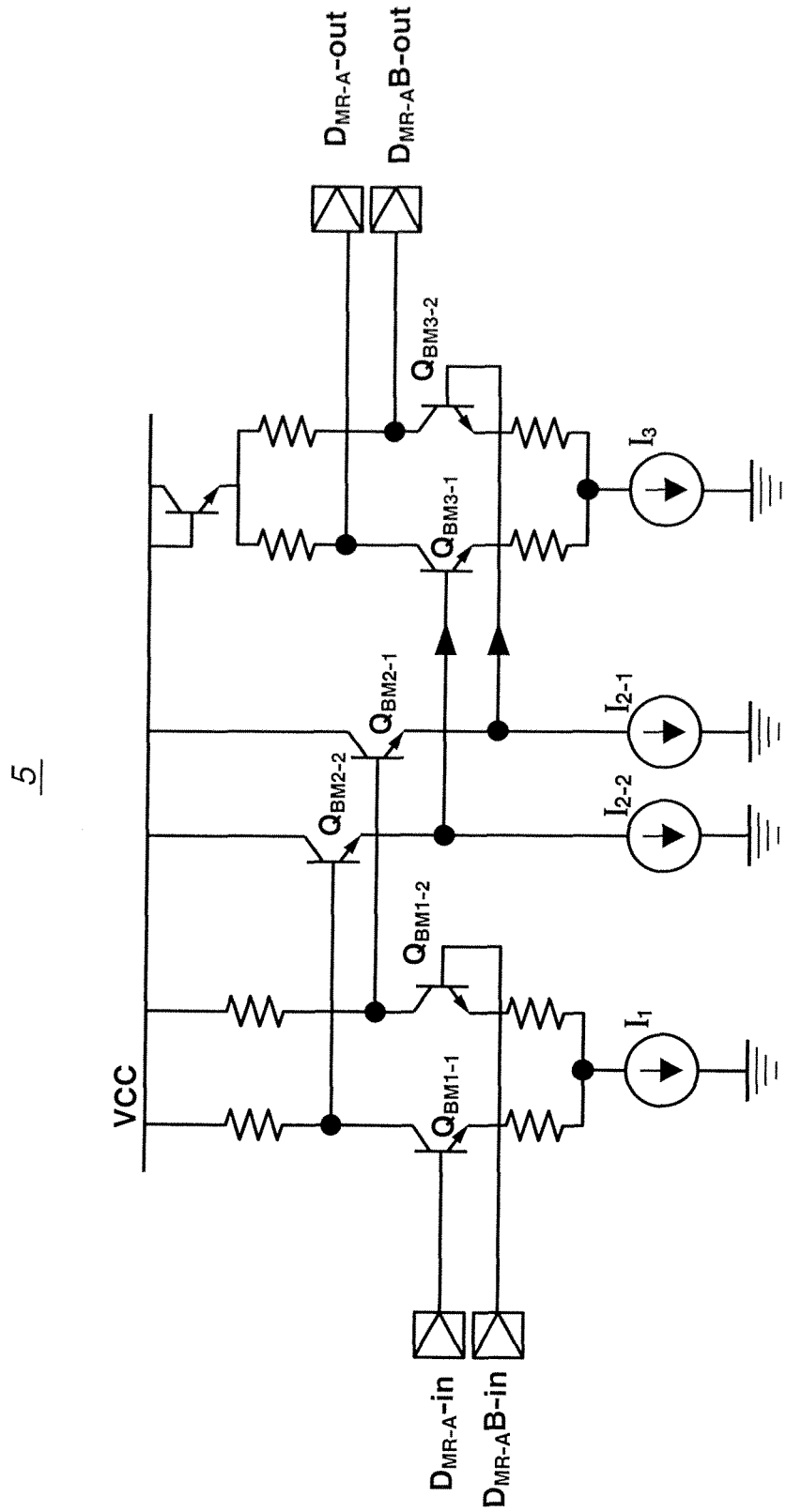
FIG. 9 is a circuit diagram showing an example of the circuit arrangement of a waveform shaping buffer circuit inserted between a D flip-flop and a switch circuit included in the current-switching cell of the digital-to-analog converter according to the first embodiment of the present invention.
Figure 10A:
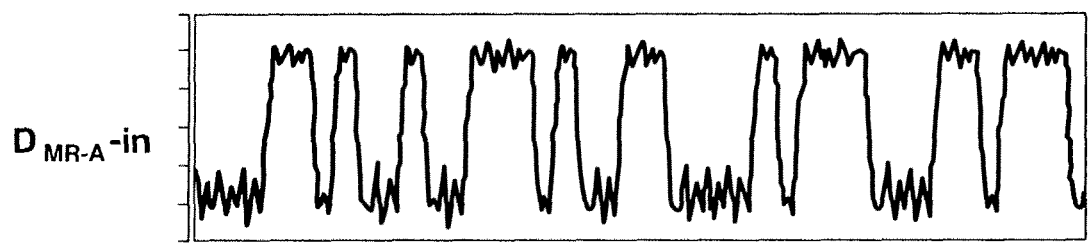
FIG. 10A is a timing chart showing the input signal waveform of the waveform shaping buffer circuit shown in FIG. 9.
Figure 10B:
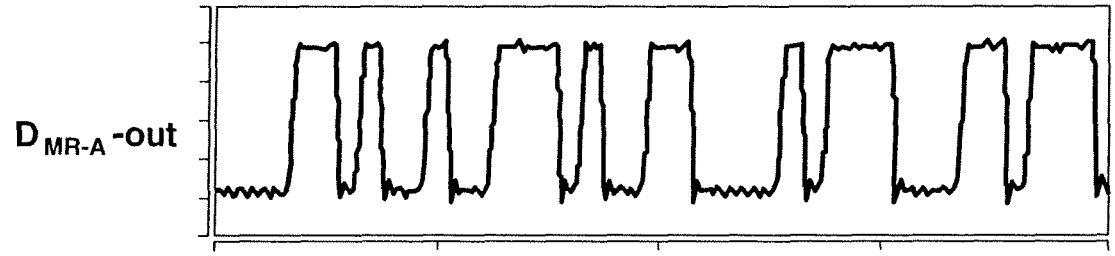
FIG. 10B is a timing chart showing the output signal waveform of the waveform shaping buffer circuit shown in FIG. 9.

For example, when the circuit arrangement of the differential current-switching cell $CS_M$ as shown in FIG. 8 is applied as the current-switching cell, a waveform shaping buffer circuit 5 including multi-stage waveform shaping circuits (for example, differential amplifier circuits) as shown in FIG. 9 is introduced into the differential current-switching cell $CS_M$. This makes it possible to properly remove clock noise and the like existing in the output waveforms of the D flip-flops D-FF and effectively improve the quality of the signal waveform of the analog output signal Vout, as shown in FIGS. 10A and 10B.

FIG. 9 is a circuit diagram showing an example of the circuit arrangement of a waveform shaping buffer circuit inserted between each of the D flip-flops D-$FF_{MA}$ and D-$FF_{MB}$ and the switches $S_{M1}$ to $S_{M4}$ of the switch circuit included in the current-switching cell $CS_M$ of the digital-to-analog converter DAC according to the first embodiment of the present invention. FIG. 9 illustrates an example of the detailed circuit arrangement of the waveform shaping buffer circuit when using the differential current-switching cell $CS_M$ as the current-switching cell.

The waveform shaping buffer circuit 5 shown in FIG. 9 includes multi-stage (in FIG. 9, two-stage) waveform shaping circuits (differential amplifier circuits). The waveform shaping circuit (differential amplifier circuit) of the first stage includes a pair of transistors $Q_{BM1-1}$ and $Q_{BM1-2}$ and a current source $I_1$. The waveform shaping circuit (differential amplifier circuit) of the second stage includes a pair of transistors $Q_{BM3-1}$ and $Q_{BM3-2}$ and a current source $I_3$. The waveform shaping circuit of the first stage and the waveform shaping circuit of the second stage are connected via two emitter followers including transistors $Q_{BM2-1}$ and $Q_{BM2-2}$ and current sources $I_{2-1}$ and $I_{2-2}$, respectively.

In the waveform shaping buffer circuit 5 shown in FIG. 9, differential retimed digital input signals $D_{MR-A}$-in and $D_{MR-A}$B-in output from the D flip-flop D-FF of the current-switching cell $CS_M$ are input to the transistors $Q_{BM1-1}$ and $Q_{BM1-2}$ included in the waveform shaping circuit (differential amplifier circuit) of the first stage and undergo waveform shaping. After that, the signals are input to the pair of transistors $Q_{BM3-1}$ and $Q_{BM3-2}$ included in the waveform shaping circuit (differential amplifier circuit) of the second stage via the transistors $Q_{BM2-1}$ and $Q_{BM2-2}$ of the emitter followers. The signals are then further waveform-shaped by the waveform shaping circuit (differential amplifier circuit) of the second stage and output as differential retimed digital output signals $D_{MR-A}$-out and $D_{MR-A}$B-out that have undergone the waveform shaping.

FIGS. 10A and 10B are timing charts showing the input signal waveform and the output signal waveform of the waveform shaping buffer circuit 5 shown in FIG. 9. More specifically, FIG. 10A shows the signal waveform of the positive-phase-side retimed digital input signal $D_{MR-A}$-in of the differential retimed digital input signals $D_{MR-A}$-in and $D_{MR-A}$B-in. FIG. 10B shows the signal waveform of the positive-phase-side retimed digital output signal $D_{MR-A}$-out of the differential retimed digital output signals $D_{MR-A}$-out and $D_{MR-A}$B-out. As is apparent from FIGS. 10A and 10B, using the waveform shaping buffer circuit 5 as shown in FIG. 9 allows to remove the noise component included in the input signal waveform and obtain the output signal waveform that has sufficiently undergone the waveform shaping.

Note that inserting the waveform shaping buffer circuit 5 as shown in FIG. 9 between the D flip-flop D-FF and the switch circuit of the current-switching cell is not limited to the differential current-switching cell as shown in FIG. 8. Application to the single-phase current-switching cell as shown in FIG. 3A or 6A also enables to obtain the same effect as described above, as a matter of course.

Figure 11:
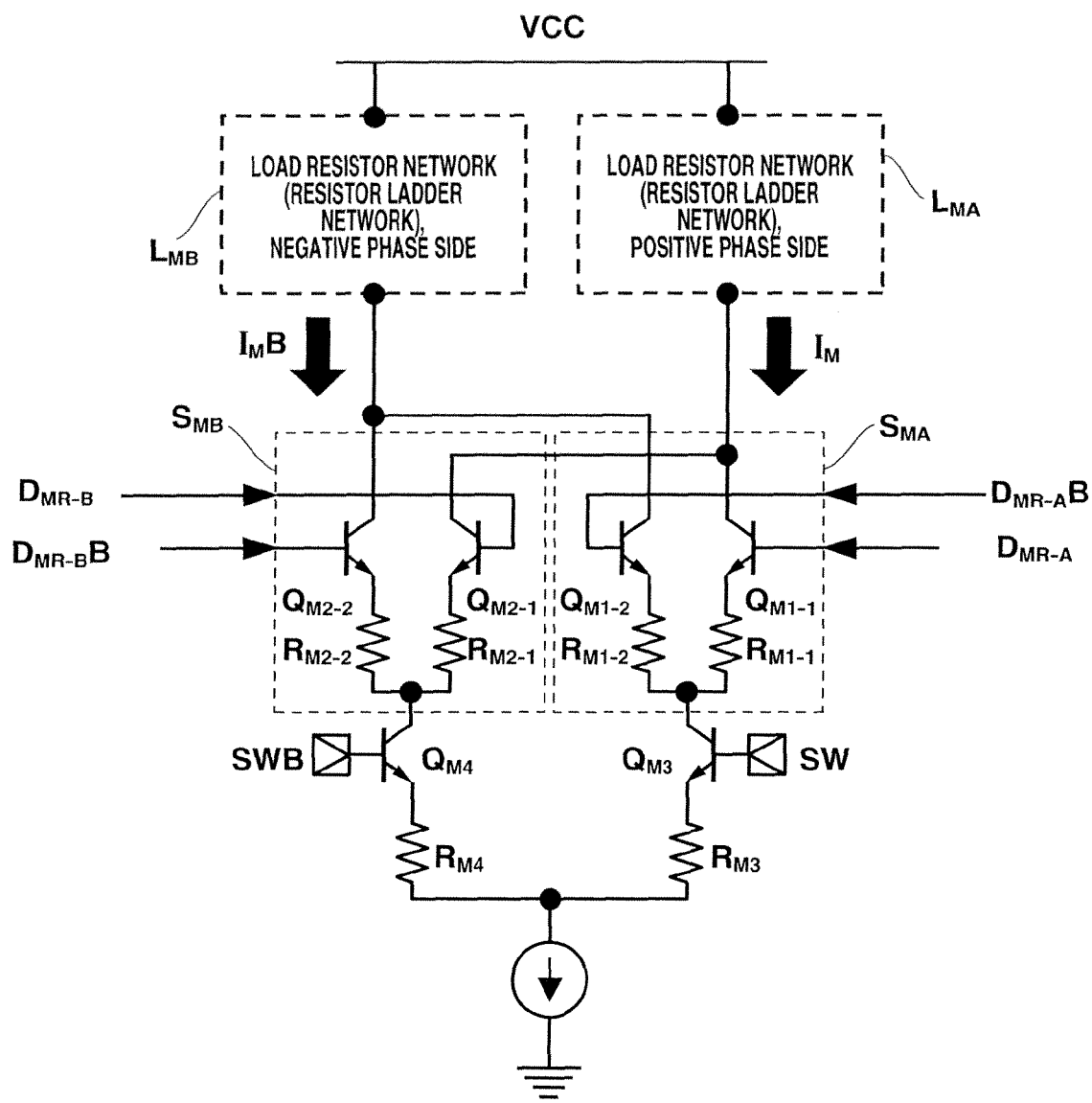
FIG. 11 is a block diagram showing another example of the block arrangement in which the current-switching cell included in the digital-to-analog converter according to the first embodiment of the present invention is formed as a differential circuit.

When the differential current-switching cell as shown in FIG. 8 is employed as the current-switching cell, it may have the circuit arrangement as shown in FIG. 11. FIG. 11 is a block diagram showing another example of the block arrangement in which the current-switching cell included in the digital-to-analog converter DAC according to the first embodiment of the present invention is formed as a differential circuit. Unlike the differential current-switching cell shown in FIG. 8, a degenerate resistor is connected to the emitter of each transistor in the differential current-switching cell $CS_M$.

As shown in FIG. 11, degenerate resistors $R_{M1-1}$ and $R_{M1-2}$ and degenerate resistors $R_{M2-1}$ and $R_{M2-2}$ are respectively connected to the emitters of the pair of transistors $Q_{M1-1}$ and $Q_{M1-2}$ and the pair of transistors $Q_{M2-1}$ and $Q_{M2-2}$ included in the positive-phase-side differential amplifier circuit $S_{MA}$ and the negative-phase-side differential amplifier circuit $S_{MB}$, which function as the switches $S_{M1}$ and $S_{M2}$ on the upper stage side out of the four switches $S_{M1}$ to $S_{M4}$ of the switch circuit of the differential current-switching cell $CS_M$. Degenerate resistors $R_{M3}$ and $R_{M4}$ are respectively connected to the emitters of the transistors $Q_{M3}$ and $Q_{M4}$ functioning as the two switches $S_{M3}$ and $S_{M4}$ on the lower stage side.

When the degenerate resistors are connected to the emitters of the transistors included in the four switches $S_{M1}$ to $S_{M4}$ of the switch circuit of the differential current-switching cell $CS_M$ in the above-described way, an effect of suppressing overshoot or the like that appears in the analog output waveform upon current switching can be obtained.

Note that connecting the degenerate resistors as shown in FIG. 11 to the emitters of the transistors included in the switches $S_{M1}$ to $S_{M4}$ of the switch circuit in the current-switching cell $CS_M$ is not limited to the differential current-switching cell as shown in FIG. 8. Application to the single-phase current-switching cell as shown in FIG. 3A or 6A also enables to obtain the same effect as described above, as a matter of course.

The current-steering (current addition) digital-to-analog converter DAC need not always have the circuit arrangement shown in FIG. 1 or 2, which directly inputs the digital input signal bits $D_0$ (LSB side), $D_1, D_2, \ldots$, and $D_{N-1}$ (MSB side) of the N-bit binary code to the 2×N D flip-flops (circuits having a latch function) D-FF$_{0A}$, D-FF$_{0B}$, D-FF$_{1A}$, D-FF$_{1B}$, D-FF$_{2A}$, D-FF$_{2B}$, \ldots, D-FF$_{(N-1)A}$ and D-FF$_{(N-1)B}$. Instead, the digital-to-analog converter DAC may adopt a circuit arrangement which decodes some (for example, M upper bits) or all of the weighted digital input signal bits $D_0, D_1, D_2, \ldots$, and $D_{N-1}$ of the N-hit binary code into a thermometer code of unweighted bits and inputs them to the D flip-flops D-FF.

Figure 12:
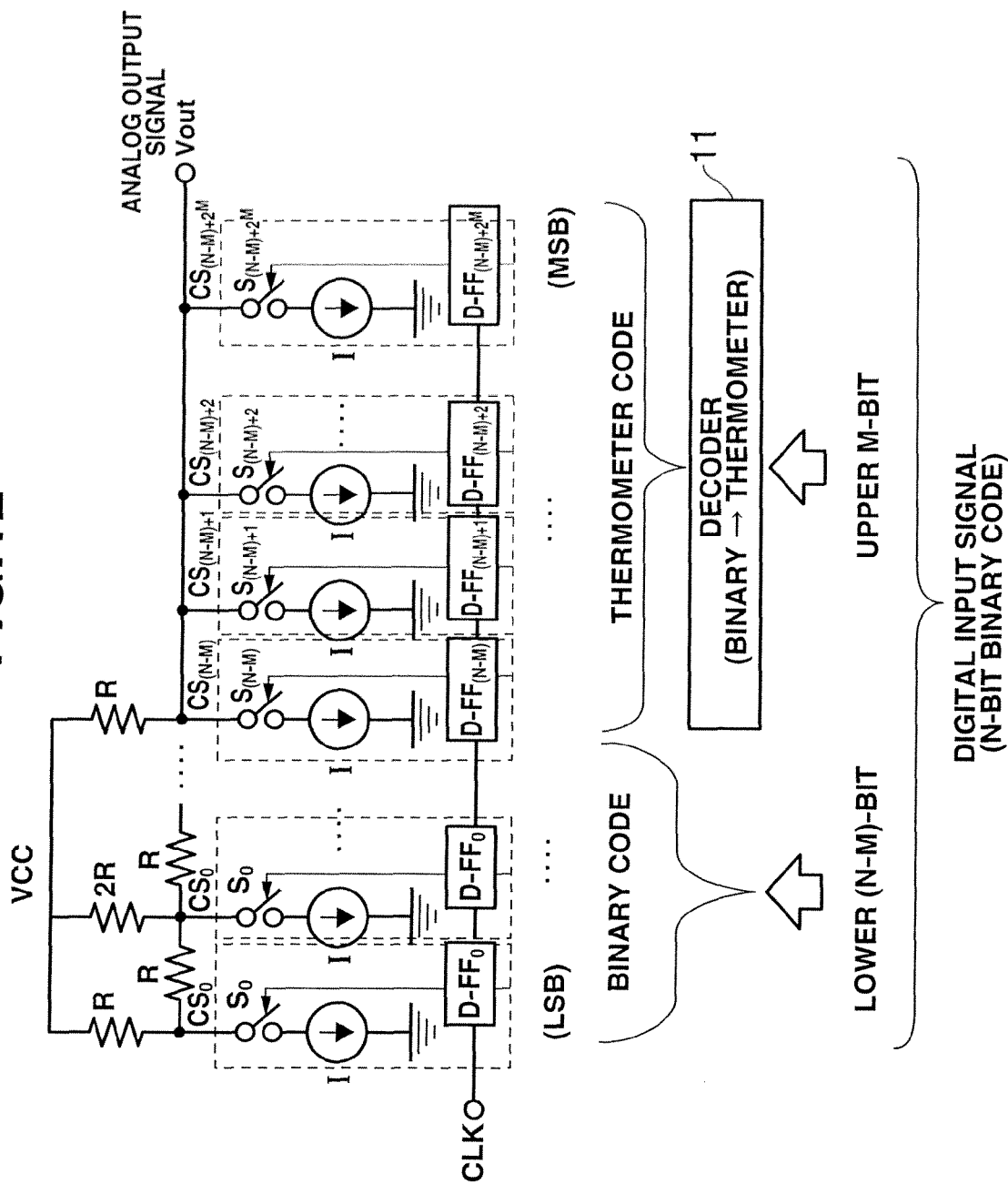
FIG. 12 is a block diagram showing an example of the circuit arrangement of a current-steering (current addition) digital-to-analog converter in which some, for example, M upper bits of digital input signal bits are converted into a thermometer code and input to the D flip-flops.

FIG. 12 is a block diagram showing the circuit arrangement of the current-steering (current addition) digital-to-analog converter, which converts some, for example, M upper bits of the digital input signal bits $D_0, D_1, D_2, \ldots$, and $D_{N-1}$ into a thermometer code and inputs them to the D flip-flops D-FF. This is a modification of the conventional current-steering (current addition) digital-to-analog converter DAC shown in FIG. 24.

As shown in FIG. 12, for the (N–M) lower bits out of the digital input signal bits $D_0, D_1, D_2, \ldots$, and $D_{N-1}$, which are not converted into a thermometer code, the digital-to-analog converter DAC includes (N–M) D flip-flops D-FF$_0$, D-FF$_1, \ldots$, and D-FF$_{(N-M)}$ that latch and retime the digital input signal bits $D_0, D_1, \ldots$, and $D_{(N-M)}$, and (N–M) switch circuits, that is, switches $S_0, S_1, \ldots$, and $S_{(N-M)}$ to be driven by the retimed digital input signals output from the D flip-flops D-FF, like the circuit arrangement in FIG. 24.

Additionally, as shown in FIG. 12, for the M upper bits out of the digital input signal bits $D_0, D_1, D_2, \ldots$, and $D_{N-1}$, the digital-to-analog converter DAC includes a decoder 11 which decodes the bits into an unweighted thermometer code, unlike the circuit arrangement in FIG. 24. The digital-to-analog converter DAC includes $2^M$ D flip-flops D-FF$_{(N-M)+1}$, D-FF$_{(N-M)+2}, \ldots$, and D-FF$_{(N-M)+2^M}$ that latch and retime the $2^M$-bit thermometer code input signal decoded by the decoder 11, and $2^M$ switch circuits, that is, switches $S_{(N-M)+1}$, $S_{(N-M)+2}, \ldots$, and $S_{(N-M)+2^M}$ to be driven by the $2^M$ retimed thermometer code bits.

For both the (N–M) lower hits and the M upper bits, the circuit arrangement of each current-switching cell $CS_L$ including a D flip-flop D-FF$_L$ ($0 \leq L \leq (N-M)+2^M$), a switch circuit, that is, a switch $S_L$, and the current source is replaced with, for example, the circuit arrangement as shown in FIG. 3A, 6A, or 8 of the first embodiment. Timing control is performed using the clock signal CLK, the negative-phase clock signal CLKB, the select signal SW, and the negative-phase select signal SWB which have a frequency ½ the originally required operating frequency. In this case as well, the same effect as in the first embodiment can obviously be obtained.

Figure 13:
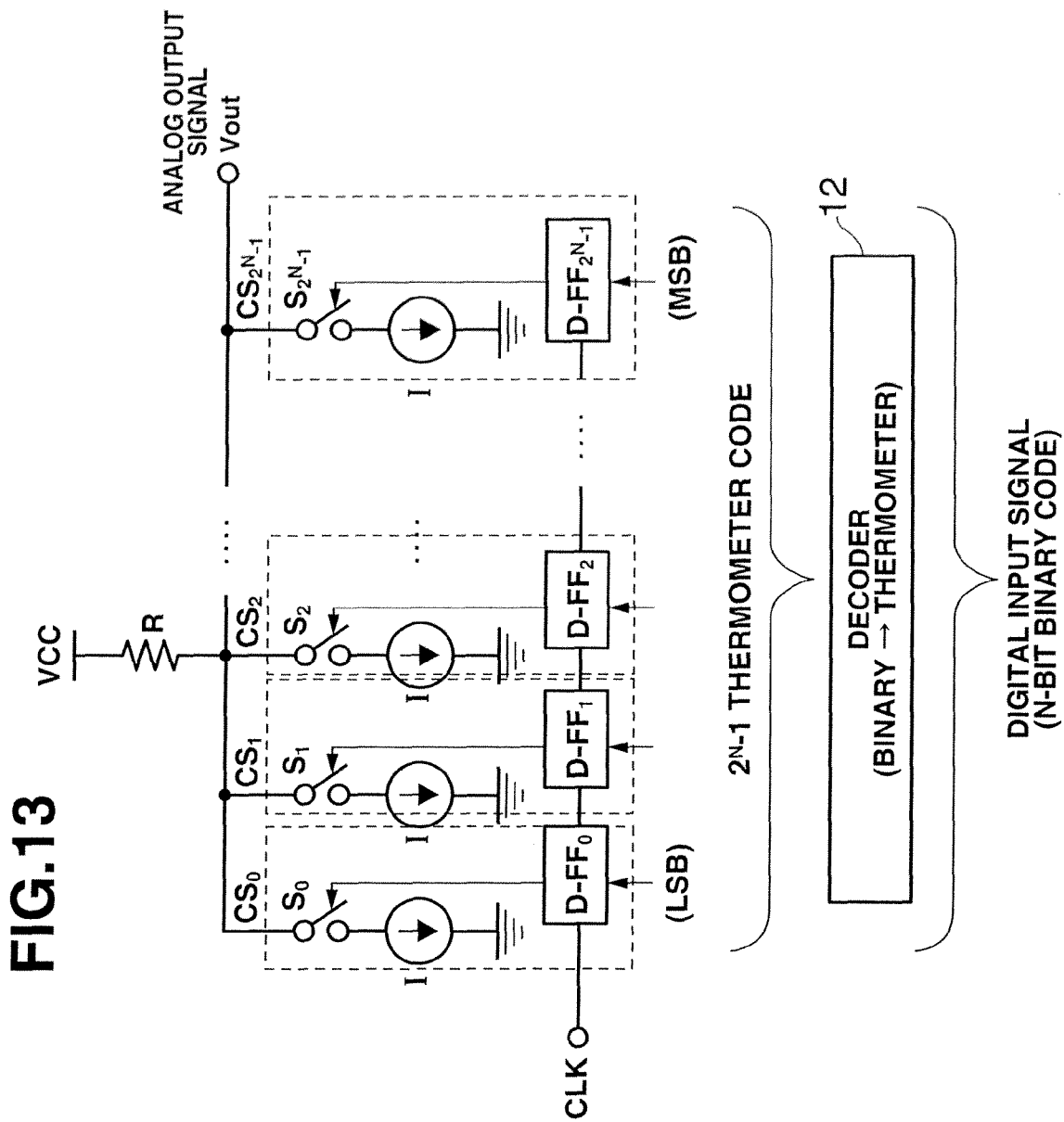
FIG. 13 is a block diagram showing an example of the circuit arrangement of a current-steering (current addition) digital-to-analog converter in which all digital input signal bits are converted into a thermometer code and input to the D flip-flops.

FIG. 13 is a block diagram showing the circuit arrangement of the current-steering (current addition) digital-to-analog converter, which converts all the digital input signal bits $D_0$, $D_1, D_2, \ldots,$ and $D_{N-1}$ into a thermometer code and inputs them to the D flip-flops D-FF. This is another modification of the conventional current-steering (current addition) digital-to-analog converter DAC shown in FIG. 24.

As shown in FIG. 13, for all the digital input signal bits $D_0$, $D_1, D_2, \ldots,$ and $D_{N-1}$, the digital-to-analog converter DAC includes a decoder 12 which decodes the bits into an unweighted thermometer code, unlike the circuit arrangement in FIG. 24. The digital-to-analog converter DAC includes $(2^N-1)$ D flip-flops D-FP, D-FF$_1$, D-FF$_2$, ..., and D-FF$_{(2^N-1)}$ that latch and retime the $(2^N-1)$-bit thermometer code input signal decoded by the decoder 12, and $(2^N-1)$ switch circuits, that is, switches $S_0, S_1, S_2, \ldots,$ and $S_{(2^N-1)}$ to be driven by the $(2^N-1)$ retimed thermometer code bits.

The circuit arrangement of each current-switching cell CS$_L$ including the D flip-flop D-FF$_L$ ($0 \leq L \leq 2^N-1$), the switch circuit, that is, the switch $S_L$, and the current source is replaced with, for example, the circuit arrangement as shown in FIG. 3A, 6A, or 8 of the first embodiment, as in the explanation of FIG. 12. Timing control is performed using the clock signal CLK, the negative-phase clock signal CLKB, the select signal SW, and the negative-phase select signal SWB which have a frequency ½ the originally required operating frequency. In this case as well, the same effect as in the first embodiment can obviously be obtained.

Note that in the circuit arrangement which converts some or all of the digital input signal bits $D_0, D_1, D_2, \ldots,$ and $D_{N-1}$ of the N-bit binary code into a thermometer code using the decoder 11 or 12 and inputs them to the current-switching cells including the D flip-flops D-FF$_L$ and the switch circuits, that is, the switches $S_L$, as shown in FIG. 12 or 13, the number of D flip-flops D-FF$_L$, that of switch circuits, that is, switches $S_L$, and that of current sources increase because of the use of the unweighted thermometer code. Hence, the number of capacitive components that appear on the output node side also increases.

For this reason, the D/A (Digital-to-Analog) conversion speed performance degrades as compared to the circuit arrangement of the related-art digital-to-analog converter DAC shown in FIG. 24 or 25, which directly inputs the digital input signal bits $D_0, D_1, D_2, \ldots,$ and $D_{N-1}$ of the N-bit binary code to the current-switching cells CS$_0$, CS$_1$, CS$_2$, ..., and CS$_{N-1}$. However, since large glitches hardly occur in the analog output signal after D/A conversion, the circuit arrangement is often used because of its excellent linearity.

When the circuit portion of the current-switching cell of the digital-to-analog converter DAC shown in FIG. 12 or 13 is replaced with the current-switching cell shown in FIG. 3A, 6A, or 8 of the first embodiment, as described above, the D/A (Digital-to-Analog) conversion performance that is problematic in the conventional digital-to-analog converter DAC shown in FIG. 24 or 25 can largely be improved. The digital-to-analog converter DAC can also generate an analog output signal with more satisfactory linearity than the single-phase digital-to-analog converter DAC or differential digital-to-analog converter DAC shown in FIG. 1, 2, 4, or 5 using the current-switching cell shown in FIG. 3A, 6A, or 8.

Effects of First Embodiment

According to the current-switching cell CS and the digital-to-analog converter DAC of the first embodiment of the present invention, the following effects can be obtained.

The current-switching cell CS and the digital-to-analog converter DAC according to the first embodiment of the present invention enable the operation of dividing a digital input signal into two half-rate signals serving as retimed digital input signals each having a frequency ½ the desired frequency using the clock signal CLK and negative-phase clock signal CLKB having a frequency ½ the desired operating frequency. It is therefore possible to achieve a D/A (Digital-to-Analog) conversion speed twice the externally supplied clock frequency. That is, the digital-to-analog converter DAC according to the first embodiment of the present invention can ensure a retiming accuracy that was a factor to restrict the conversion speed performance, and therefore implement a faster D/A conversion operation because the speed/band requirement for the clock signal system is relaxed as compared to the conventional digital-to-analog converter DAC.

Note that in the digital-to-analog converter DAC according to the first embodiment of the present invention, the D flip-flop D-FF that latches a digital input signal and outputs a retimed signal divides the digital input signal into two half-rate signals. For this reason, the band requirement for the digital signal wiring system from the D flip-flop D-FF to the switch circuit is also relaxed. This allows to increase the degree of freedom in digital signal wiring run from the viewpoint of the circuit layout of the digital-to-analog converter DAC.

The half-rate signals that are divided and output are multiplexed in the current-switching cell CS based on the select signal. As far as the supply timing of the select signal is accurately given, a slight skew (a shift on the time axis) between the half-rate signals is allowed. In this regard, since the current-switching cell CS itself is not large-scaled and can be implemented in a small area on the circuit layout, the timing of the select signal to be supplied to the switch circuit can relatively easily be adjusted.

On the other hand, in the current-switching cell CS and the digital-to-analog converter DAC according to the first embodiment of the present invention, the number of D flip-flops D-FF and that of switch circuits, is, switches in the current-switching cell CS increase, as compared to the conventional current-switching cell CS and digital-to-analog converter DAC. However, as compared to an interleaved digital-to-analog converter DAC, the increase in the number of D flip-flops D-FF and that of switches is largely suppressed. Hence, the digital-to-analog converter DAC can be made compact, and the increase in the power consumption is also suppressed. If the D/A conversion speed is the same, the current-switching cell CS and the digital-to-analog converter DAC according to the first embodiment of the present invention can suppress the power consumption to 75% the conventional amount.

In the current-switching cell CS and the digital-to-analog converter DAC according to the first embodiment of the present invention, quality (linearity) degradation of the analog output signal problematically caused in the interleaved digital-to-analog converter DAC by the characteristic difference between the sub-digital-to-analog converters SDACs or the nonlinearity characteristic of the mixer never occurs.

Figure 14:
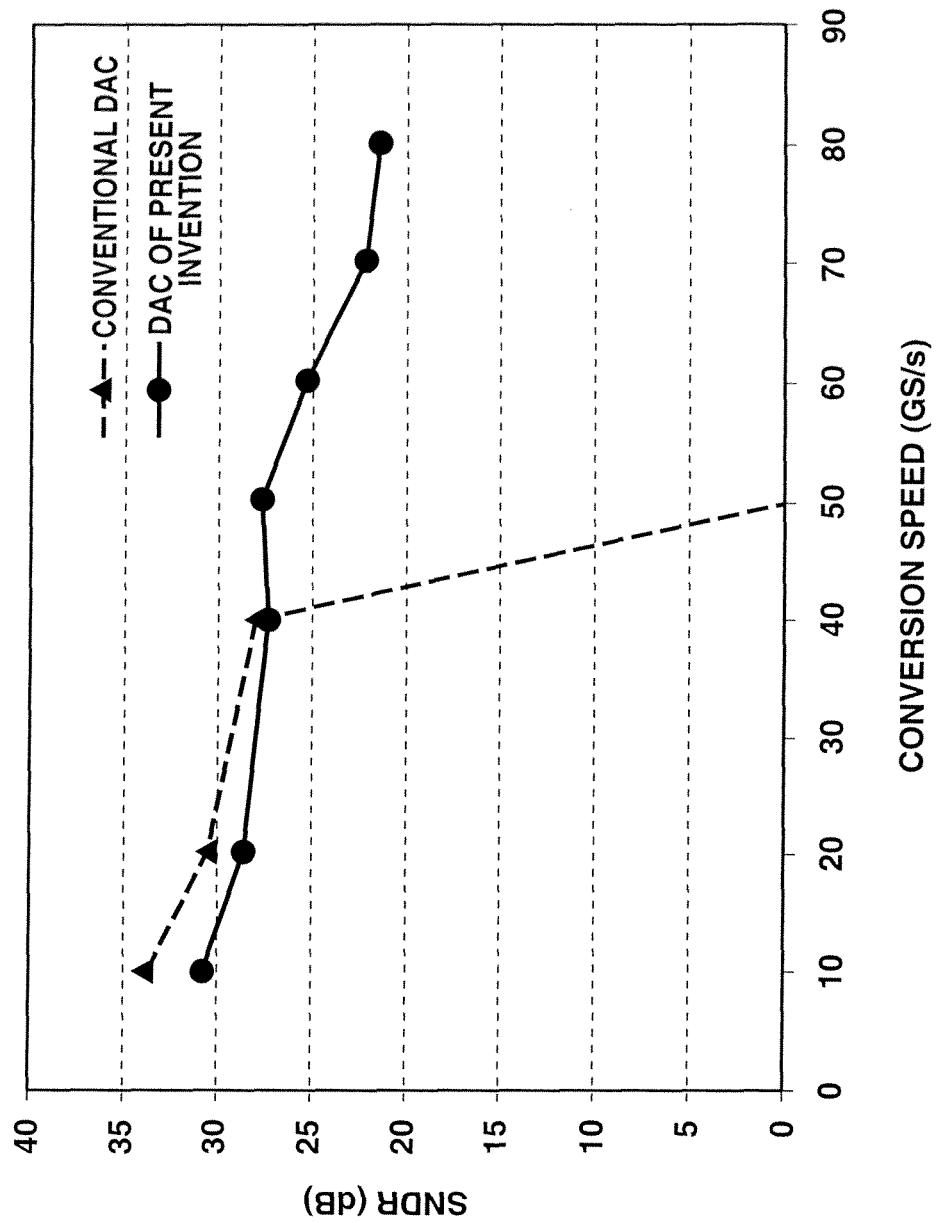
FIG. 14 is a graph showing the simulation result of the conversion speed performance of the digital-to-analog converter according to the first embodiment of the present invention.

The effects of the current-switching cell CS and the digital-to-analog converter DAC according to the first embodiment of the present invention will be described in more detail. FIG. 14 is a graph showing the simulation result of the conversion speed performance of the digital-to-analog converter DAC according to the first embodiment of the present invention. The simulation result of the conversion speed performance of the digital-to-analog converter DAC according to the first embodiment of the present invention based on the block arrangement of FIG. 1 is compared with that of the conventional digital-to-analog converter DAC based on the block arrangement of FIG. 24.

The simulation result shown in FIG. 14 was obtained using SPICE (Simulation Program with Integrated Circuit Emphasis) as a general-purpose circuit simulation. Both the conventional digital-to-analog converter DAC and the digital-to-analog converter DAC of the present invention are assumed to have a 6-bit resolution with a 6-bit digital input signal and be designed using an actual transistor model excellent in the high-speed operation.

This simulation is conducted under the condition that a 5-GHz sine wave is obtained as the analog output signal from the digital-to-analog converter DAC. As shown in FIG. 14, the relationship between the D/A (Digital-to-Analog) conversion speed and the SNDR (Signal to Noise and Distortion Ratio) under that condition. The SNDR represents the ratio of the signal to the sum of noise and distortion in the signal band (DC to Nyquist frequency (=½ the conversion frequency)). The SNDR is a general evaluation index of the dynamic characteristics of an analog-to-digital converter (ADC) or the digital-to-analog converter DAC.

As shown in FIG. 14, according to this simulation, the SNDR remains 25 dB or more up to a conversion speed of 40 GS/s in the conventional digital-to-analog converter DAC. When the conversion speed has reached 50 GS/s, clock signal supply is difficult, and the D/A conversion operation itself is impossible.

On the other hand, in the digital-to-analog converter DAC according to the first embodiment of the present invention, the band requirement for the clock signal is relaxed as compared to the conventional digital-to-analog converter DAC. For this reason, a faster operation can be achieved. The SNDR can remain 25 dB or more up to a conversion speed of 60 GS/s. An SNDR of 20 dB or more is ensured even in a faster operation at a conversion speed of 80 GS/s although there is the influence of distortion.

That is, the digital-to-analog converter DAC according to the first embodiment of the present invention can almost double the conversion speed as compared to the conventional digital-to-analog converter DAC.

As described above, the current-switching cell CS according to the first embodiment of the present invention and the digital-to-analog converter DAC using the current-switching cell CS can increase the conversion speed to almost twice that of the conventional digital-to-analog converter DAC while suppressing the increase in the power consumption.

Second Embodiment

The circuit arrangement of a current-switching cell and a digital-to-analog converter DAC according to the second embodiment of the present invention will be described next. As in the above-described first embodiment, the circuit arrangement according to the second embodiment also has a large feature in the arrangement of the current-switching cell having a retiming function of retiming a digital input signal and a switching function of controlling a current to be supplied to a load in accordance with the retimed digital input signal. Applying this current-switching cell allows to implement the digital-to-analog converter DAC capable of a high-speed D/A (Digital-to-Analog) conversion operation. In the second embodiment, however, each current-switching cell includes two current sources (equal in the current value to be supplied) serving as current sources that supply currents, unlike the current-switching cell according to the first embodiment.

Details of the current-switching cell according to the present invention will be explained later. First, the block arrangement of the digital-to-analog converter DAC according to the second embodiment of the present invention, which is formed using the current-switching cell, will be described with reference to FIGS. 15 and 16.

Figure 15:
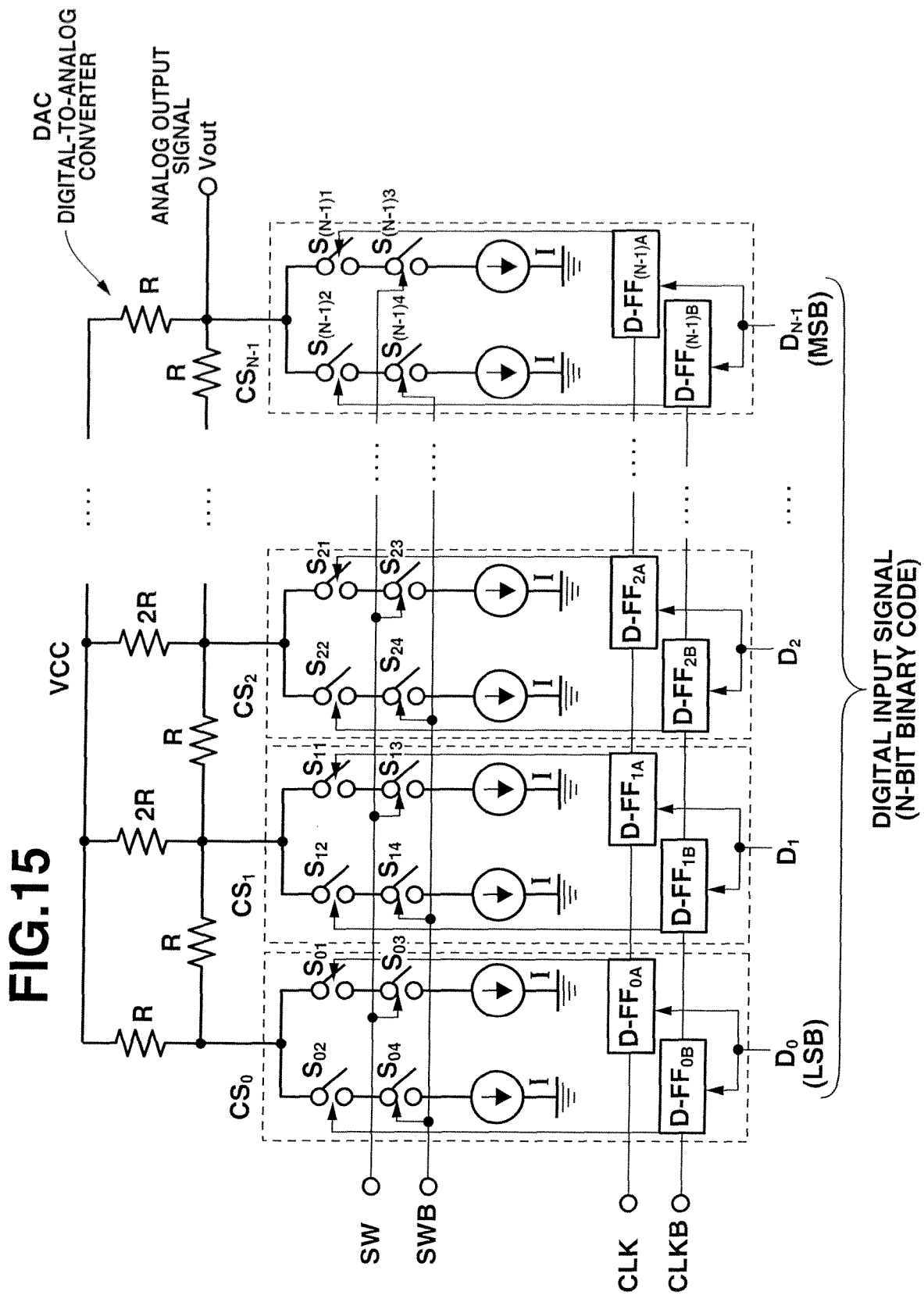
FIG. 15 is a block diagram showing an example of the circuit arrangement of a digital-to-analog converter according to the second embodiment of the present invention.

FIG. 15 is a block diagram showing an example of the circuit arrangement of the digital-to-analog converter DAC according to the second embodiment of the present invention. In this example, the digital-to-analog converter DAC includes N current-switching cells $CS_0$, $CS_1$, $CS_2$, ..., and $CS_{N-1}$ (that is, each current-switching cell is a circuit including D flip-flops for retiming, a switch circuit for current switching to the load, and a current source that supplies a current to the load) in correspondence with N digital input signal bits. N currents having the same current value are weighted and added using a binary-weighted load resistor network (resistor ladder network) including a plurality of resistors formed in a ladder with resistance values R and 2R in accordance with the digital input signal bits of an N-bit binary code and thus converted into an analog output signal Vout and output, like the current-steering (current addition) digital-to-analog converter DAC shown in FIG. 1 of the first embodiment.

The digital-to-analog converter DAC in FIG. 15 including the N current-switching cells $CS_0$, $CS_1$, $CS_2$, ..., and $CS_{N-1}$ includes two D flip-flops D-FF (D-FF: circuits having a latch function) in each of the current-switching cells $CS_0$, $CS_1$, $CS_2$, ..., and $CS_{N-1}$, as in FIG. 1. The digital-to-analog converter DAC thus includes 2×N D flip-flops D-$FF_{0A}$, D-$FF_{0B}$, D-$FF_{1A}$, D-$FF_{1B}$, D-$FF_{2A}$A, D-$FF_{2B}$, ..., D-$FF_{(N-1)A}$, and D-$FF_{(N-1)B}$ which temporarily latch N digital input signal bits $D_0$ (LSB side), $D_1$, $D_2$, ..., and $D_{N-1}$ (MSB side) and output signals obtained by dividing each of the digital input signal bits $D_0$, $D_1$, $D_2$, ..., and $D_{N-1}$ and retiming and sampling the signals in accordance with the externally supplied clock signal CLK and the negative-phase signal (negative-phase clock signal CLKB) of the clock signal CLK or the externally supplied clock signal CLK and the negative-phase clock signal CLKB generated by single balance conversion (single phase→difference conversion) of the clock signal CLK.

Additionally, in the digital-to-analog converter DAC in FIG. 15, two current sources equal in the current value (I) are arranged in each of the N current-switching cells $CS_0$, $CS_1$, $CS_2$, ..., and $CS_{N-1}$ prepared in correspondence with the digital input signal bits $D_0$, $D_1$, $D_2$, ..., and $D_{N-1}$, unlike FIG. 1. The current sources of the current-switching cells $CS_0$, $CS_1$, $CS_2$, ..., and $CS_{N-1}$ are configured to flow currents having the same current value (I) to the binary-weighted load resistor network (resistor ladder network) including a plurality of resistors formed in a ladder with resistance values R and 2R.

Each of the current-switching cells $CS_0$, $CS_1$, $CS_2$, ..., and $CS_{N-1}$ includes corresponding two of the D flip-flops D-$FF_{0A}$, D-$FF_{0B}$, D-$FF_{1A}$, D-$FF_{1B}$, D-$FF_{2A}$, D-$FF_{2B}$, ..., D-$FF_{(N-1)A}$, and D-$FF_{(N-1)B}$, as in FIG. 1, so as to divide each bit into two signals and output them. Hence, each current-switching cell includes a switch circuit including a total of four switches of which the first and third switches are connected in series, and so do the second and fourth switches (in addition, one of every two switches connected in series is connected to the load, and the two remaining switches are connected to the two current sources). The first and second switches are on/off-controlled based on the values of the digital input signal bits, and the third and fourth switches are on/off-controlled based on an externally supplied select signal SW and the negative-phase signal (negative-phase select signal SWB) of the select signal SW or based on the externally supplied select signal SW and the negative-phase select signal SWB generated by single balance conversion (single phase→difference conversion) of the select signal SW.

Hence, the digital-to-analog converter DAC includes N switch circuits each including four serially/parallelly connected switches in correspondence with the respective bits. The digital-to-analog converter DAC includes a total of 4×N switches $S_{O1}, S_{O2}, S_{O3}, S_{O4}, S_{11}, S_{12}, S_{13}, S_{14}, S_{21}, S_{22}, S_{23}, S_{24}, \ldots, S_{(N-1)1}, S_{(N-1)2}, S_{(N-1)3}$, and $S_{(N-1)4}$.

Each of the current-switching cells $CS_0, CS_1, CS_2, \ldots,$ and $CS_{N-1}$ includes two current sources, and each of the 2×N current sources is connected to the load resistor network (resistor ladder network) via two serially connected switches out of four switches included in the switch circuit of the corresponding one of the current-switching cells $CS_0, CS_1, CS_2, \ldots,$ and $CS_{N-1}$ out of the N switch circuits that is, 4×N switches. As a result, the digital-to-analog converter DAC is configured to determine whether to supply a current to the load resistor network (resistor ladder network) in accordance with the value of a corresponding one of the digital input signal bits $D_0, D_1, D_2, \ldots,$ and $D_{N-1}$. Note that symbol VCC denotes a power supply configured to drive the digital-to-analog converter DAC.

Figure 16:
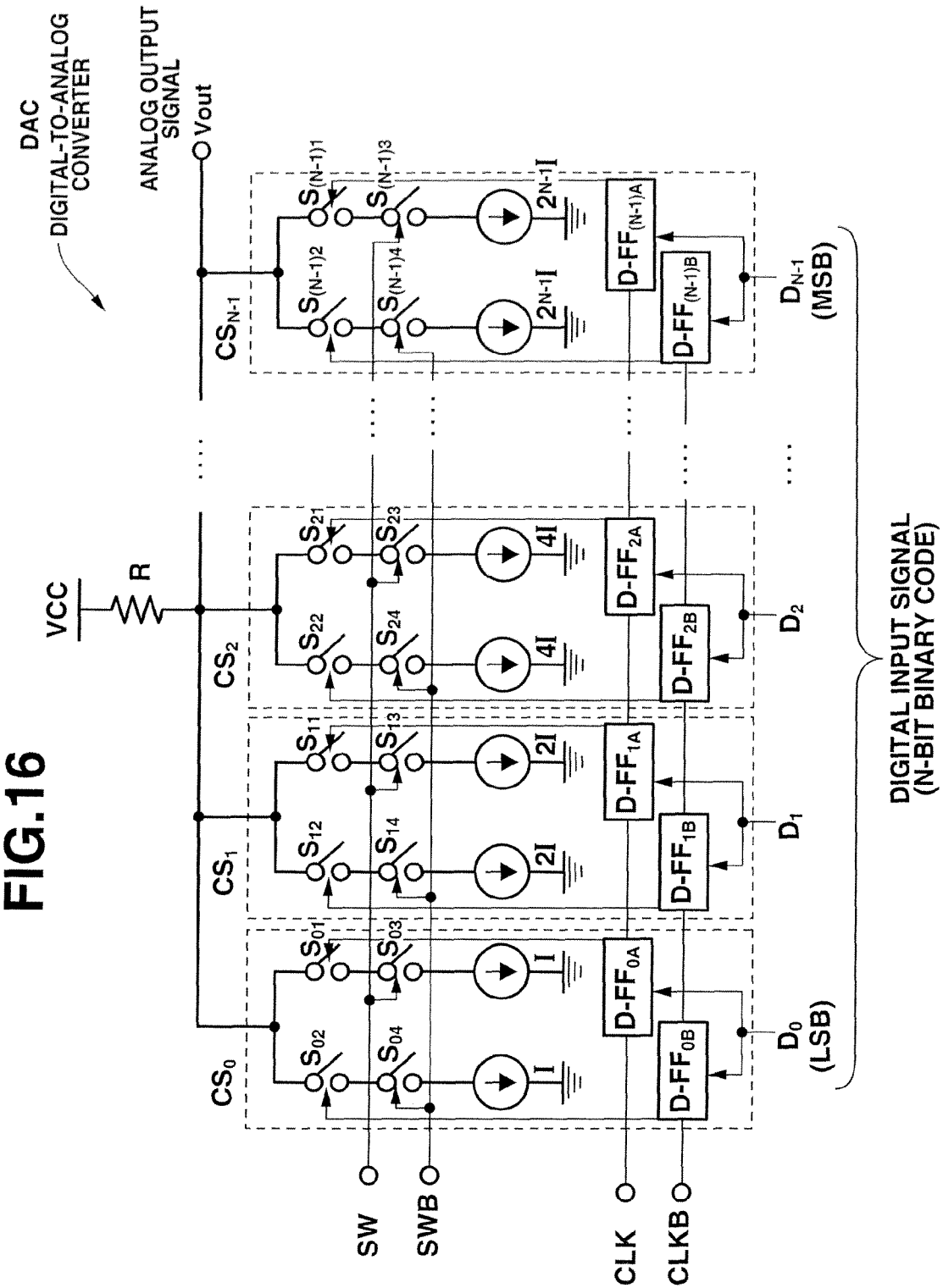
FIG. 16 is a block diagram showing another example of the circuit arrangement of the digital-to-analog converter according to the second embodiment of the present invention.

On the other hand, FIG. 16 is a block diagram showing another example of the circuit arrangement of the digital-to-analog converter DAC according to the second embodiment of the present invention. In this example, current sources arranged by twos (the two current sources supply the same current value) in the N current-switching cells $CS_0, CS_1, CS_2, \ldots,$ and $CS_{N-1}$ supply N currents obtained by binary-weighting a current value so that the N binary-weighted currents are added using a single load resistor in accordance with the digital input signal bits of an N-bit binary code and thus converted into the analog output signal Vout and output, like the current-steering (current addition) digital-to-analog converter DAC shown in FIG. 2 of the first embodiment.

The digital-to-analog converter DAC in FIG. 16 including the N current-switching cells $CS_0, CS_1, CS_2, \ldots,$ and $CS_{N-1}$ includes two D flip-flops D-FF (D-FF: circuits having a latch function) in each of the current-switching cells $CS_0, CS_1, CS_2, \ldots,$ and $CS_{N-1}$, as in FIG. 2. The digital-to-analog converter DAC thus includes 2×N D flip-flops D-$FF_{0A}$, D-$FF_{0B}$, D-$FF_{1A}$, D-$FF_{1B}$, D-$FF_{2A}$, D-$FF_{2B}$, ..., D-$FF_{(N-1)A}$, and D-$FF_{(N-1)B}$ which temporarily latch N digital input signal bits $D_0$ (LSB side), $D_1, D_2, \ldots,$ and $D_{N-1}$ (MSB side) and output signals obtained by dividing each of the digital input signal bits $D_0, D_1, D_2, \ldots,$ and $D_{N-1}$ and retiming and sampling the signals in accordance with the externally supplied clock signal CLK and the negative-phase signal (negative-phase clock signal CLKB) of the clock signal CLK or the externally supplied clock signal CLK and the negative-phase clock signal CLKB generated by single balance conversion (single phase→difference conversion) of the clock signal CLK.

Additionally, in the digital-to-analog converter DAC in FIG. 16, two current sources equal in the current value (I) are arranged in each of the N current-switching cells $CS_0, CS_1, CS_2, \ldots,$ and $CS_{N-1}$ prepared in correspondence with the digital input signal bits $D_0, D_1, D_2, \ldots,$ and $D_{N-1}$, as in FIG. 15. The current sources arranged by twos in each of the current-switching cells $CS_0, CS_1, CS_2, \ldots,$ and $CS_{N-1}$ are configured to flow currents binary-weighted to current values I (LSB side), 2I, $2^2$I, ..., and $2^{N-1}$I (MSB side) in correspondence with the digital input signal bits $D_0, D_1, D_2, \ldots,$ and $D_{N-1}$ to the single load resistor having the resistance value R, unlike FIG. 15.

Each of the current-switching cells $CS_0, CS_1, CS_2, \ldots,$ and $CS_{N-1}$ includes corresponding two of the D flip-flops D-$FF_{0A}$, D-$FF_{0B}$, D-$FF_{1A}$, D-$FF_{1B}$, D-$FF_{2A}$, D-$FF_{2B}$, ..., and D-$FF_{(N-1)A}$, D-$FF_{(N-1)B}$, as in FIG. 2 or 15, so as to divide each bit into two signals and output them. Hence, each current-switching cell includes a switch circuit including a total of four switches of which the first and third switches are connected in series, and so do the second and fourth switches (in addition, one of every two switches connected in series is connected to the load, and the two remaining switches are connected to the two current sources). The first and second switches are on/off-controlled based on the values of the digital input signal bits, and the third and fourth switches are on/off-controlled based on an externally supplied select signal SW and the negative-phase signal (negative-phase select signal SWB) of the select signal SW or based on the externally supplied select signal SW and the negative-phase select signal SWB generated by single balance conversion (single phase→difference conversion) of the select signal SW.

Hence, the digital-to-analog converter DAC includes N switch circuits each including four serially parallelly connected switches in correspondence with the respective hits. The digital-to-analog converter DAC includes a total of 4×N switches $S_{O1}, S_{O2}, S_{O3}, S_{O4}, S_{11}, S_{12}, S_{13}, S_{14}, S_{21}, S_{22}, S_{23}, S_{24}, \ldots, S_{(N-1)1}, S_{(N-1)2}, S_{(N-1)3}$, and $S_{(N-1)4}$.

Each of the current-switching cells $CS_0, CS_1, CS_2, \ldots,$ and $CS_{N-1}$ includes two current sources, and each of the 2×N current sources is connected to the common single load resistor via two serially connected switches out of four switches included in the switch circuit of the corresponding one of the current-switching cells $CS_0, CS_1, CS_2, \ldots,$ and $CS_{N-1}$ out of the N switch circuits that is, 4×N switches. As a result, the digital-to-analog converter DAC is configured to determine whether to supply a current to the single load resistor in accordance with the value of a corresponding one of the digital input signal bits $D_0, D_1, D_2, \ldots,$ and $D_{N-1}$. Note that symbol VCC denotes a power supply configured to drive the digital-to-analog converter DAC.

Examples of the circuit arrangement and operation of, out of the plurality of (N) current-switching cells $CS_0, CS_1, CS_2, \ldots,$ and $CS_{N-1}$ of the digital-to-analog converter DAC according to the second embodiment of the present invention shown in FIGS. 15 and 16, a current-switching cell $CS_M$ corresponding to the Mth bit of the digital input signal bits $D_0, D_1, D_2, \ldots,$ and $D_{N-1}$ will be described with reference to FIGS. 17A and 17B.

Figure 17A:
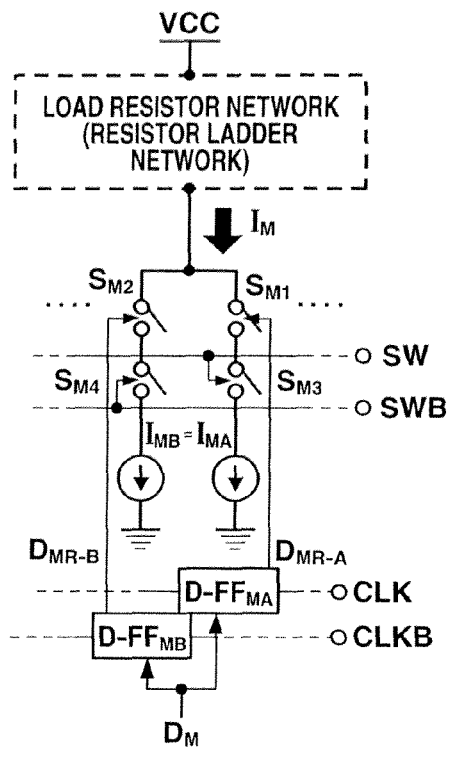
FIG. 17A is a block diagram showing the circuit arrangement of a current-switching cell included in the digital-to-analog converters shown in FIGS. 15 and 16.
Figure 17B:
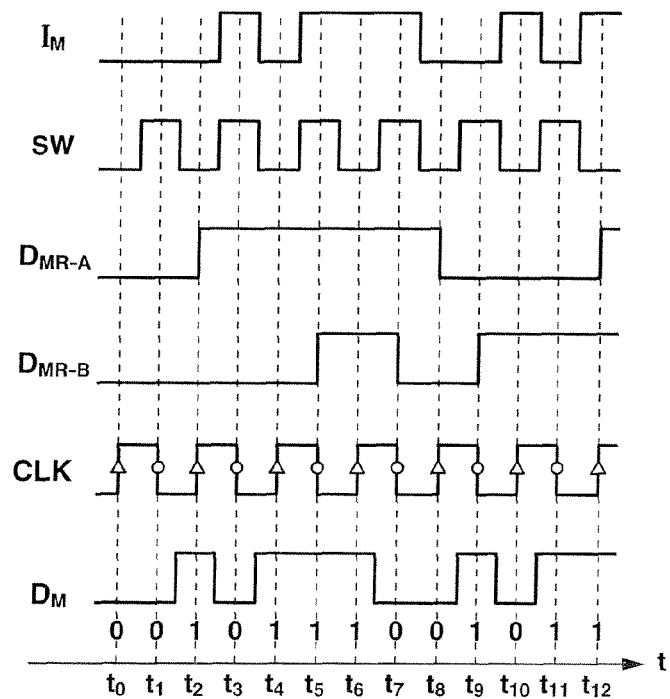
FIG. 17B is a timing chart showing the signal waveforms of various parts of the current-switching cell shown in FIG. 17A.

FIGS. 17A and 17B are schematic views for explaining the operation of the current-switching cell included in the digital-to-analog converter DAC according to the second embodiment of the present invention. In particular, FIG. 17A shows the circuit arrangement of the Mth current-switching cell $CS_N$ of the N current-switching cells $CS_0, CS_1, CS_2, \ldots,$ and $CS_{N-1}$. FIG. 17B shows the signal waveforms of various parts of the Mth current-switching cell $CS_M$ shown in FIG. 17A. Note that FIG. 17A shows, as an example, a case in which a load resistor network (resistor ladder network) including a plurality of resistors formed in a ladder with resistance values R and 2R, as shown in FIG. 15, is provided as the load connected to the current-switching cell $CS_M$. Even when the single load resistor is used, as shown in FIG. 16, the operation is the same as the operation to be described below except that the current flowing from the current source to the load resistor changes to the Mth weighted current value.

As a characteristic feature, as in FIG. 3A, each of the current-switching cells $CS_0$, $CS_1$, $CS_2$, . . . , and $CS_{N-1}$, included in the digital-to-analog converter DAC according to the second embodiment of the present invention comprises a switch circuit including two flip-flops D-FF (the D flip-flops D-FF$_{MA}$ and D-FF$_{MB}$ in the Mth current-switching cell $CS_M$) and a total of four switches (the switches $S_{M1}$ to $S_{M4}$ in the Mth current-switching cell $CS_M$) having a 2-parallel/2-serial arrangement, like, for example, the Mth current-switching cell $CS_M$ shown in FIG. 17A.

However, as shown in FIG. 17A, as the characteristic feature, each current-switching cell comprises two current sources which independently supply currents $I_{MA}$ and $I_{MB}$ to the single load resistor respectively via the switches $S_{M1}$ and $S_{43}$ and the switches $S_{M2}$ to $S_{M4}$ connected in series out of a total of four switches having a 2-parallel/2-serial arrangement, unlike FIG. 3A. Note that the two current sources supply the same current value ($I_{MA}=I_{MB}=I_M$).

As in FIGS. 3A and 3B of the first embodiment, according to the characteristic feature of the current-switching cell, the clock signal CLK having a frequency ½ the clock frequency required in the conventional digital-to-analog converter DAC and the negative-phase clock signal CLKB that is the negative-phase signal of the clock signal CLK are used to cause the two D flip-flops D-FF$_{MA}$ and D-FF$_{MB}$ to divide the Mth digital input signal bit $D_M$ into two retimed digital input signals $D_{MR-A}$ and $D_{MR-B}$ formed from two half-rate signals (signals having a signal rate ½ the desired signal rate).

As in FIGS. 3A and 3B of the first embodiment, according to the characteristic feature of the current-switching cell, whether to supply the current from the current source to the load resistor network (resistor ladder network) is determined using the select signal SW having the same frequency as that of the clock signal CLK and a phase shifted by, for example, 90° in any one of the directions, the negative-phase select signal SWB that is the negative-phase signal of the select signal SW, the two retimed digital input signals $D_{MR-A}$ and $D_{MR-B}$, and the switch circuit including a total of four switches $S_{M1}$ to $S_{M1}$ having a 2-parallel/2-serial arrangement so as to generate a current corresponding to a full-rate signal by multiplexing the two retimed digital input signals that are half-rate signals and perform an operation at a conversion frequency twice that of the clock signal CLK.

In the second embodiment in which the current-switching cell includes two current sources $I_{MA}$, and $I_{MB}$, only one pair of the switches $S_{M1}$ and $S_{M2}$ and the switches $S_{M2}$ and $S_{M4}$ connected in series is turned on by the select signal SW and the negative-phase select signal SWB. For this reason, the two current sources $I_{MA}$, and $I_{MB}$ never supply the currents to the load resistor network (resistor ladder network) via the switches simultaneously.

In the current-switching cell $CS_M$ shown in FIG. 17A having the two current sources $I_{MA}$ and $I_{MB}$, the two switches $S_{M3}$ and $S_{M4}$ located on the lower stage side out of the four switches $S_{M1}$ to $S_{M4}$ included in the switch circuit, to which the two current sources $I_{MA}$ and $I_{MB}$ are connected, are driven by the select signal SW having the same frequency as that of the clock signal CLK and a phase shifted in any one of the directions and the negative-phase select signal SWB that is the negative-phase signal of the select signal SW, as shown in FIG. 17B, thereby determining the on/off states of the two switches $S_{M3}$ and $S_{M4}$ on the lower stage side. That is, in FIG. 17A, the two switches $S_{M3}$ and $S_{M4}$ form the third and fourth switches to be driven by the select signal SW and the negative-phase select signal SWB, respectively.

Hence, when the select signal SW is "High", whether to flow the current signal $I_{MA}$ from one current source to the load resistor network (resistor ladder network) is determined based on the on/off state of the switch $S_{M1}$ on the upper stage side. When the negative-phase select signal SWB is "High", whether to flow the current signal $I_{MB}$ from the other current source to the load resistor network (resistor ladder network) is determined based on the on/off state of the switch $S_{M2}$ on the upper stage side.

Note that the two switches $S_{M1}$ and $S_{M2}$ located on the upper stage side out of the four switches $S_{M1}$ to $S_{M4}$ included in the switch circuit are driven by the two retimed digital input signals $D_{MR-A}$ and $D_{MR-B}$, that is, two half-rate signals output from the two D flip-flops D-FF$_{MA}$ and D-FF$_{MB}$, as in FIG. 3A, thereby determining the on/off state of the two switches $S_{M1}$ and $S_{M2}$ on the upper stage side. That is, in FIG. 17A, the two switches $S_{M1}$ and $S_{M2}$ form the first and second switches to be driven by the two half-rate signals, respectively.

With the above-described operation, the two half-rate signals divided as the two retimed digital input signals $D_{MR-A}$ and $D_{MR-B}$ are generated by the two D flip-flops (the D flip-flops D-FF$_{MA}$ and D-FF$_{MB}$ in the Mth current-switching cell $CS_M$ corresponding to the Mth digital input signal bit $D_M$) using the clock signal CLK and negative-phase clock signal CLKB having a frequency ½ the originally required operating frequency.

After that, the two generated half-rate signals are multiplexed into a full-rate signal (the signal having the originally required operating frequency) using the currents $I_{MA}$ or $I_{MB}$ from one of the two current sources by driving based on the select signal SW and the negative-phase select signal SWB in each switch circuit (the switch circuit included in the Mth current-switching cell $CS_M$ for the Mth digital input signal bit $D_M$) including a total of four switches (the switches $S_{M1}$ to $S_{M4}$ for the Mth digital input signal bit $D_M$) having a 2-parallel/2-serial arrangement and converted into one current signal $I_M(I_{MA}=I_{MB})$ (flowing to the load resistor network) corresponding to the Mth digital input signal bit $D_M$.

That is, the current-switching cell $CS_M$ of the digital-to-analog converter DAC according to the second embodiment of the present invention shown in FIG. 17A can generate the current signal $I_M$ (flowing to the load resistor network) having the same rate as that in the conventional digital-to-analog converter DAC using the clock signal CLK having a ½ frequency, as compared to the current-switching cell $CS_M$ of the conventional digital-to-analog converter DAC, as shown in FIG. 26A.

Details of the operation of the current-switching cell $CS_M$ in FIG. 17A other than the above-described points are the same as those of the operation described with reference to FIGS. 3A and 3B except the above-described operation of selectively using the two current sources in accordance with the states of the select signal SW and the negative-phase select signal SWB, and a repetitive description thereof will be omitted.

As described above, the fundamental operation of the current-switching cell $CS_M$ including two current sources according to the second embodiment is the same as in the first embodiment shown in FIGS. 3A and 3B. This can be summarized as follows, as in the first embodiment.

(1) The current-switching cell is arranged for each digital input signal bit. For, for example, the Mth digital input signal bit $D_M$, the current-switching cell $CS_M$ includes the two D flip-flops D-FF$_{MA}$ and D-FF$_{MB}$ having the latch function, the clock signal CLK and the negative-phase clock signal CLKB to be used for retiming and sampling by edge trigger, for example, rising edge trigger of the digital input signal bit D$_M$, the select signal SW having the same frequency as that of the clock signal CLK and a phase shifted in any one of the directions by a certain angle ranging from 0° to 180° (for example, 90° ideally) with respect to the clock signal CLK and the negative-phase select signal SWB, the switch circuit including four switches S$_{M1}$ to S$_{M4}$ serially/parallelly connected by twos, and the current source connected to the switch circuit (note that the number of current sources may be two or one as described in the first embodiment), and is connected to a load resistor network (resistor ladder network) or a single load resistor.

(2) The frequency of the clock signal CLK is ½ the originally required operating frequency (full-rate), that is, the half-rate frequency.

(3) The Mth digital input signal bit D$_M$ is divided into two retimed digital input signals D$_{MR-A}$ and D$_{MR-B}$ by edge trigger, for example, rising edge trigger of the clock signal CLK and the negative-phase clock signal CLKB.

(4) The four switches S$_{M1}$ to S$_{M4}$ serially/parallelly connected by twos in the switch circuit are driven by the two retimed digital input signals D$_{MR-A}$ and D$_{MR-B}$, the select signal SW, and the negative-phase select signal SWB, respectively.

(5) The current signal I$_M$ or a weighted current $2^M$I from the current source is supplied to the load resistor network (resistor ladder network) or the single load resistor when {(D$_{MR-A}$)$_{HIGH}$ AND (SW)$_{HIGH}$}
or {(D$_{MR-B}$)$_{HIGH}$ AND (SWB)$_{HIGH}$} holds.

(6) The current signal I$_M$ or the weighted current $2^M$I is eventually on/off-controlled at the edge timings, for example, rising edges of the select signal SW and the negative-phase select signal SWB having the same frequency as that of the clock signal CLK so as to output an analog output signal equivalent to that of D/A (Digital-to-Analog) conversion at the full rate corresponding to the double rate of the frequency of the clock signal CLK.

Note that in the above description of FIG. 17A, the retimed digital input signals D$_{MR-A}$ and D$_{MR-B}$ (0≦M≦N−1) that are two data signals, that is, two half-rate signals drive the two switches S$_{M1}$ and S$_{M2}$ on the upper stage side out of the four switches S$_{M1}$ to S$_{M4}$ included in the switch circuit, and the select signal SW and the negative-phase select signal SWB drive the two switches S$_{M3}$ and S$_{M4}$ on the lower stage side.

However, the present invention is not limited to this. The same operation can be implemented even when, for example, the retimed digital input signals D$_{MR-A}$ and D$_{MR-B}$ (0≦M≦N−1) that are two data signals, that is, two half-rate signals drive the two switches S$_{M3}$ and S$_{M4}$ serving as the first and second switches on the lower stage side, and the select signal SW and the negative-phase select signal SWB drive the two switches S$_{M1}$ and S$_{M2}$ serving as the third and fourth switches on the upper stage side, as shown in FIGS. 18, 19, 20A, and 20B.

Figure 18:
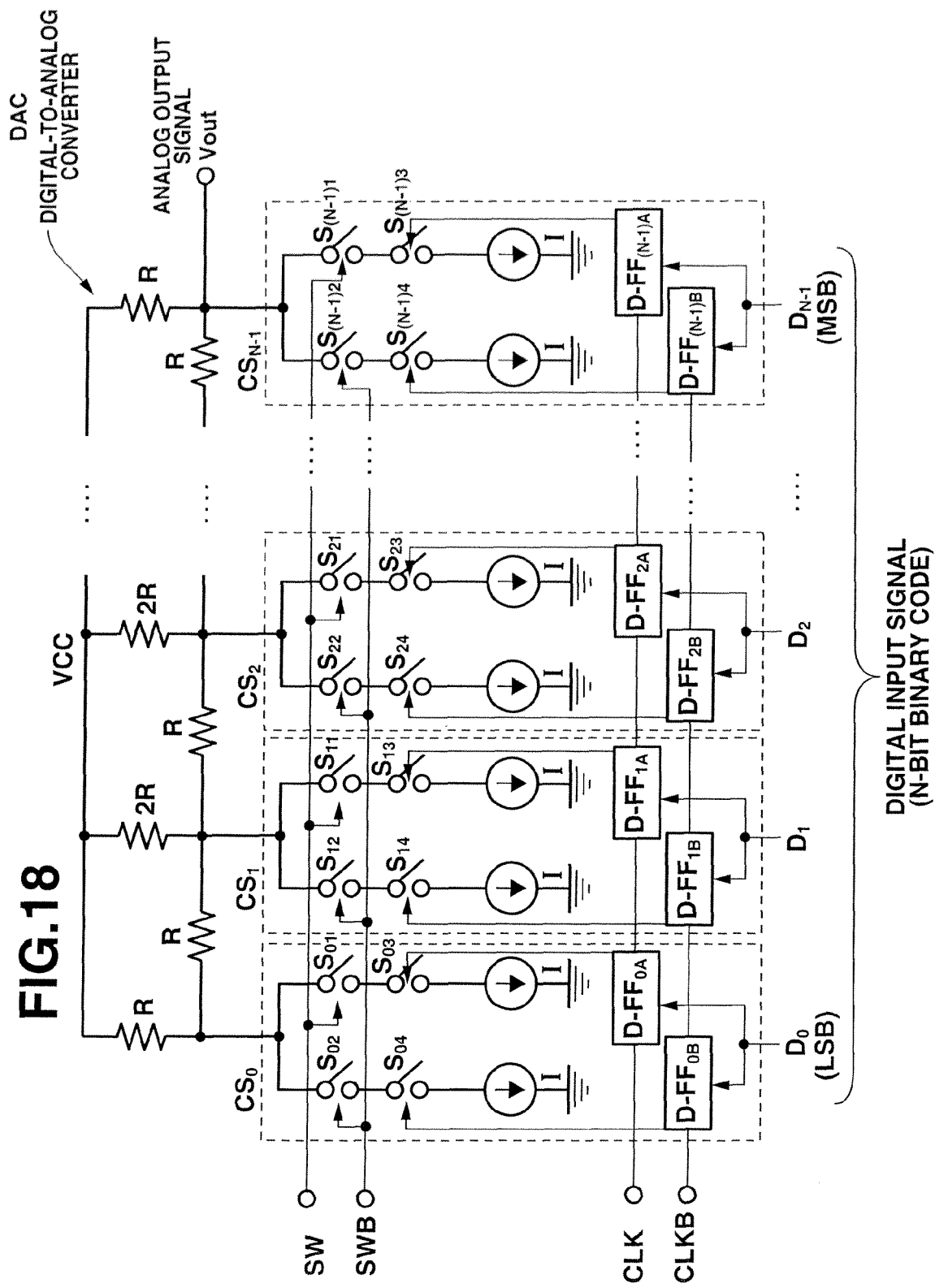
FIG. 18 is a block diagram showing still another example of the circuit arrangement of the digital-to-analog converter according to the second embodiment of the present invention.

FIG. 18 is a block diagram showing still another example of the circuit arrangement of the digital-to-analog converter DAC according to the second embodiment of the present invention. FIG. 18 illustrates a modification of the digital-to-analog converter DAC shown in FIG. 15. In the digital-to-analog converter DAC shown in FIG. 18, two current sources are arranged in each of the current-switching cells CS$_0$, CS$_1$, CS$_2$, . . . , and CS$_{N-1}$, unlike FIG. 4 of the first embodiment including one current source in each current-switching cell. Except that, the digital-to-analog converter DAC is the same as in FIG. 4. The retimed al input signals D$_{MR-A}$ and D$_{MR-B}$ (0≦M≦N−1) that are two half-rate signals drive the two switches S$_{M3}$ and S$_{M4}$ on the lower stage side, and the select signal SW and the negative-phase select signal. SWB drive the two switches S$_{M1}$ and S$_{M2}$ on the upper stage side.

Figure 19:
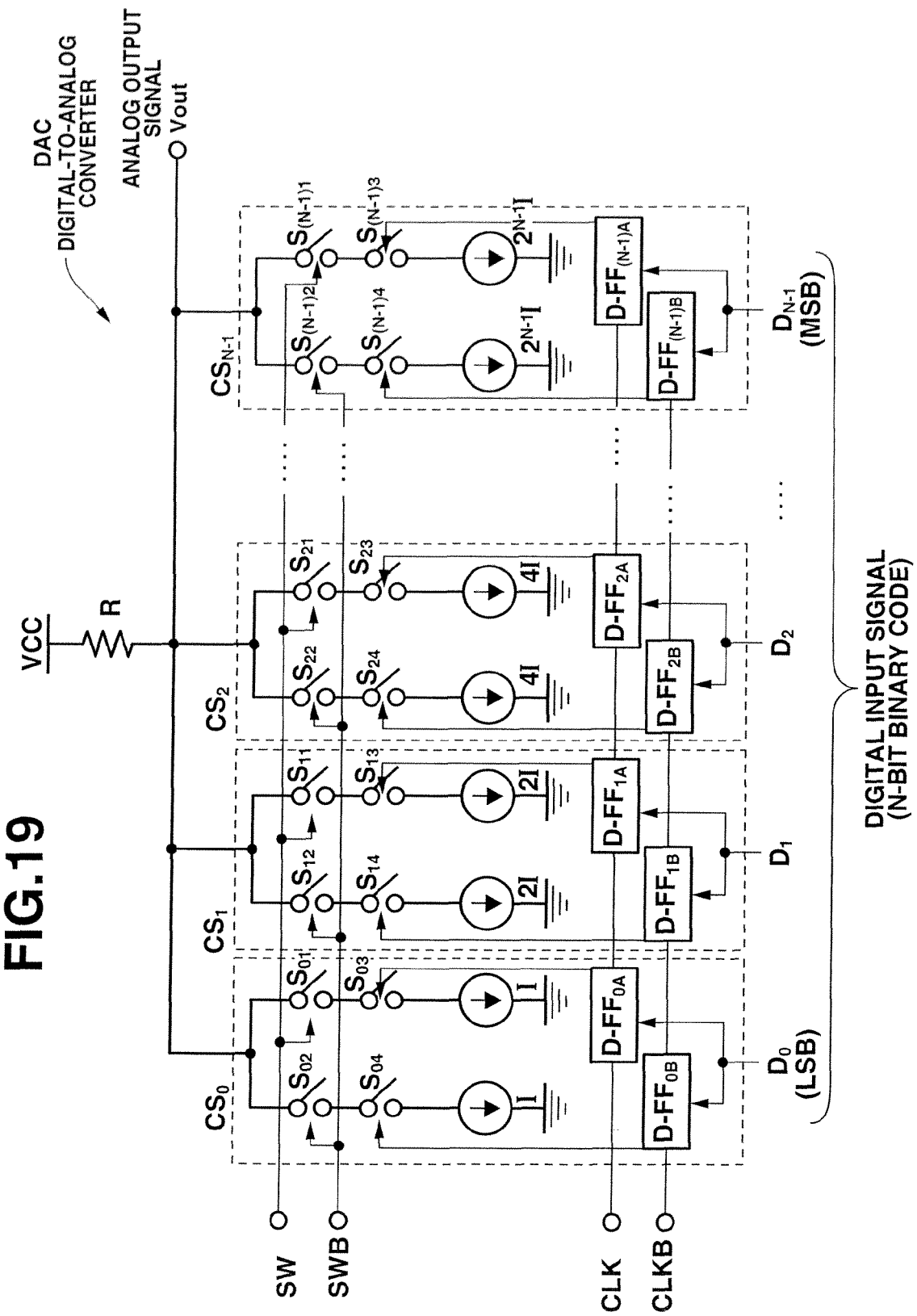
FIG. 19 is a block diagram showing yet another example of the circuit arrangement of the digital-to-analog converter according to the second embodiment of the present invention.

FIG. 19 is a block diagram showing yet another example of the circuit arrangement of the digital-to-analog converter DAC according to the second embodiment of the present invention. FIG. 19 illustrates a modification of the digital-to-analog converter DAC shown in FIG. 16. In the digital-to-analog converter SAC shown in FIG. 19, two current sources are arranged in each of the current-switching cells CS$_0$, CS$_1$, CS$_2$, . . . , and CS$_{N-1}$, unlike FIG. 5 of the first embodiment including one current source in each current-switching cell. Except that, the digital-to-analog converter DAC is the same as in FIG. 5. The retimed digital input signals D$_{MR-A}$ and D$_{MR-B}$ (0≦M≦N−1) that are two half-rate signals drive the two switches S$_{M3}$ and S$_{M4}$ on the lower stage side, and the select signal SW and the negative-phase select signal SWB drive the two switches S$_{M1}$ and S$_{M2}$ on the upper stage side.

Figure 20A:
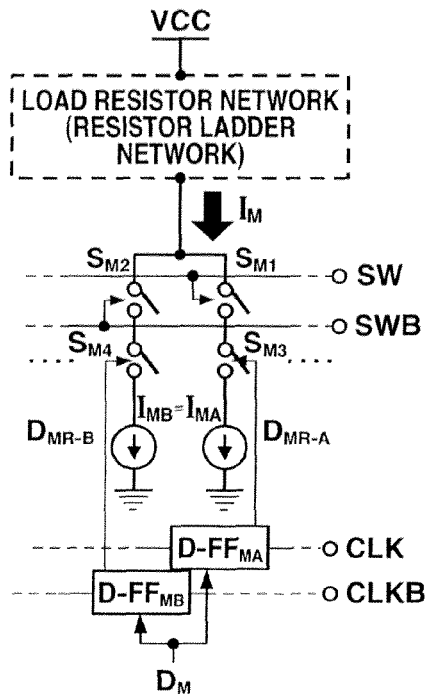
FIG. 20A is a block diagram showing the circuit arrangement of a current-switching cell included in the digital-to-analog converters shown in FIGS. 18 and 19.
Figure 20B:
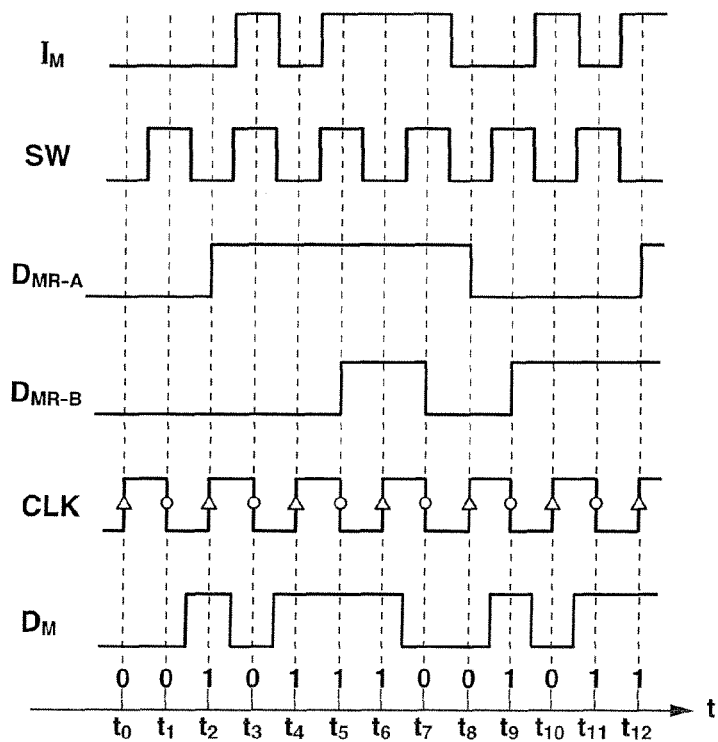
FIG. 20B is a timing chart showing the signal waveforms of various parts of the current-switching cell shown in FIG. 20A.

FIGS. 20A and 20B are schematic views for explaining the operation of a current-switching cell included in the digital-to-analog converter DAC according to the other arrangement example of the second embodiment of the present invention shown in FIG. 18 or 19. FIGS. 20A and 20B show a modification of the current-switching cell shown in FIGS. 17A and 17B. More specifically, FIG. 20A shows the circuit arrangement of the Mth current-switching cell CS$_M$ of the N current-switching cells CS$_0$, CS$_1$, CS$_2$, . . . , and CS$_{N-1}$. FIG. 20B shows the signal waveforms of various parts of the Mth current-switching cell CS$_M$ shown in FIG. 20A. The current-switching cell CS$_M$ shown in FIG. 20A includes two current sources, unlike the current-switching cell shown in FIG. 6A of the first embodiment including one current source. Except that, the current-switching cell is the same as in FIG. 6A. The retimed digital input signals D$_{MR-A}$ and D$_{MR-B}$ that are two half-rate signals drive the two switches S$_{M3}$ and S$_{M4}$ serving as the first and second switches on the lower stage side, and the select signal SW and the negative-phase select signal SWB drive the two switches S$_{M1}$ and S$_{M2}$ serving as the third and fourth switches on the upper stage side.

In the circuit of the current-switching cell CS$_M$ shown in FIG. 17A or 20A, each of the four switches S$_{M1}$ to S$_{M4}$ included in the switch circuit may be formed from a transistor circuit. In this case, a bipolar transistor or an FET (Field Effect Transistor) may be used as the switching element of each of the four switches S$_{M1}$ to S$_{M4}$ in the switch circuit.

In the current-switching cell and the digital-to-analog converter DAC according to the second embodiment of the present invention described above, each current-switching cell CS$_M$(0≦M≦N−1) includes two current sources that supply the same current value I$_{MA}$=I$_{MB}$=I$_M$). The two current sources are selectively usable based on the select signal SW and the negative-phase select signal SWB. It is possible to improve the symmetry of the circuit layout, reduce even-order noise, and implement a faster D/A conversion operation. It is also possible to obtain an analog output signal with less degradation of the quality (linearity) and obtain the same effects as those described in the first embodiment.

Note that in the current-switching cell and the digital-to-analog converter DAC described in the second embodiment, a single-phase signal has been exemplified. However, the present invention is not limited to this and is also applicable to a differential circuit which performs a differential operation by differential signals. The same effects as described above can be obtained, and the linearity (quality) of the analog output signal can further be improved.

Third Embodiment

Concerning the circuit arrangement of a current-switching cell according to the third embodiment of the present invention which performs a differential operation, an arrangement example different from that in FIG. 8 or 11 of the first embodiment will be described next.

Figure 21:
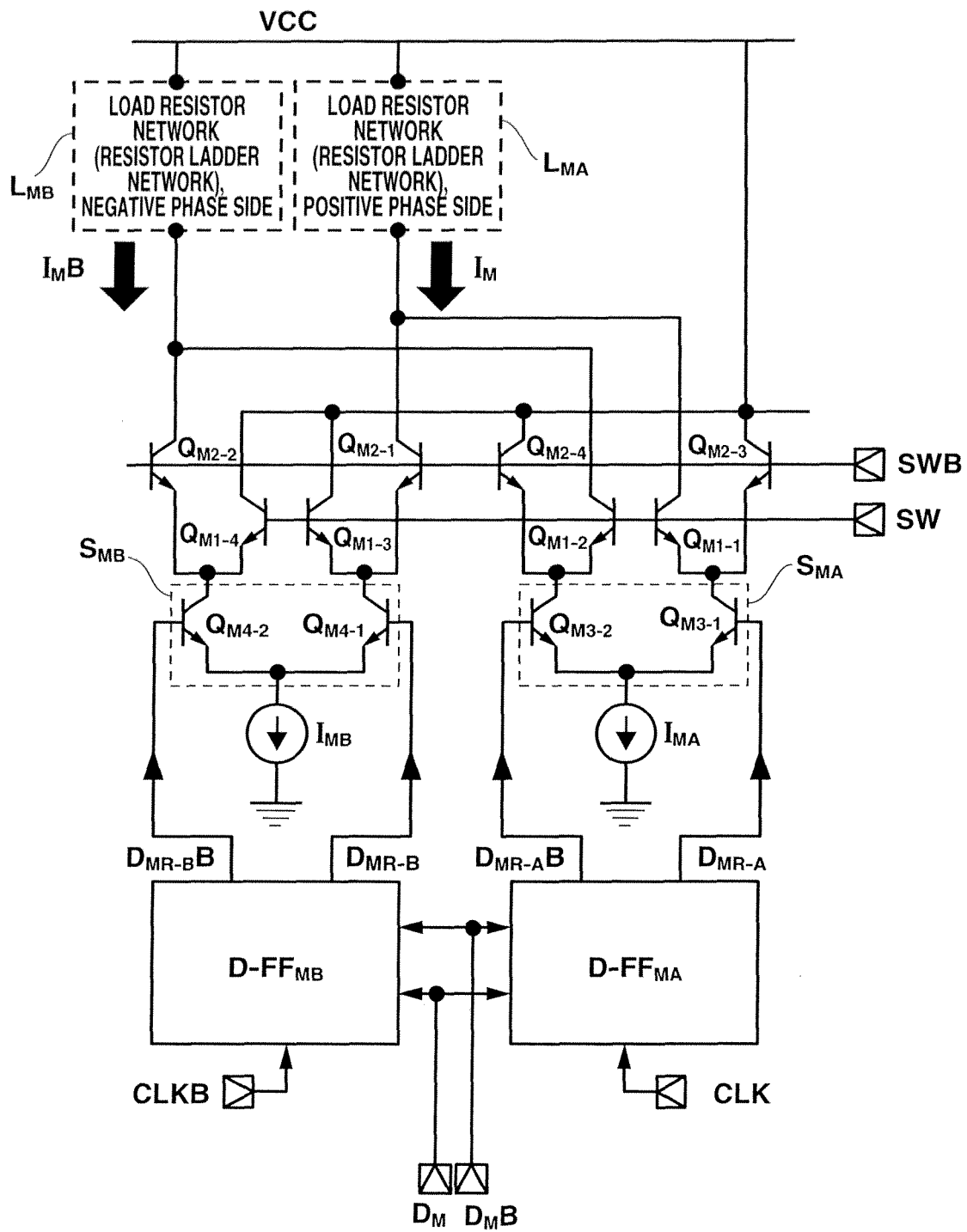
FIG. 21 is a block diagram showing an example of the block arrangement in which a current-switching cell according to the third embodiment of the present invention is formed as a differential circuit.

FIG. 21 is a block diagram showing an example of the block arrangement in which the current-switching cell according to the third embodiment of the present invention is formed as a differential circuit. As in FIG. 8, the switch circuit of the current-switching cell is formed as two differential switch circuits each of which is driven by two differential half-rate signals obtained by dividing one of differential digital input signals into two signals and retiming them by a clock signal CLK and a negative-phase clock signal CLKB. Each of the two differential switch circuits is formed by a differential amplifier circuit including pairs of transistors.

As shown in FIG. 21, a current-switching cell $CS_M$ that forms the differential circuit includes two D flip-flops D-$FF_{MA}$ and D-$FF_{MB}$ for differential input/output which latch a positive-phase-side digital input signal $D_M$ that is the positive-phase signal out of the differential digital input signals and a negative-phase-side digital input signal $D_M B$ that is the negative-phase signal by the clock signal CLK and the negative-phase clock signal CLKB, respectively, divide the signals into two pairs of differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$), and retimes and outputs the signals, as in FIG. 8.

Unlike FIG. 8, switches $S_{M1}$ and $S_{M2}$ corresponding to the third and fourth switches of the switch circuit to be driven by a select signal SW and a negative-phase select signal SWB are formed using four transistors $Q_{M1-1}$, $Q_{M1-2}$, $Q_{M1-3}$, and $Q_{M1-4}$ and four transistors $Q_{M2-3}$, $Q_{M2-4}$, $Q_{M2-1}$, and $Q_{M2-2}$, respectively, as four pairs of transistors constituted by connecting the emitters of the transistors $Q_{M1-1}$, and $Q_{M2-3}$, the transistors $Q_{M1-2}$ and $Q_{M2-4}$, the transistors $Q_{M1-3}$ and $Q_{M2-4}$, and the transistors $Q_{M1-4}$ and $Q_{M2-2}$. One collector of each of the four pairs of transistors included in the third and fourth switches is connected to the power supply. The other collector is connected to a corresponding one of a positive-phase-side differential amplifier circuit $S_{MA}$ and a negative-phase-side differential amplifier circuit $S_{MB}$ serving as loads. The nodes of the emitters of the four pairs of transistors are connected to the collector sides of a pair of transistors $Q_{M3-1}$ and $QM_{3-2}$ and a pair of transistors $Q_{M4-1}$ and $QM_{4-2}$ of two differential amplifier circuits that constitute the positive-phase-side differential amplifier circuit $S_{MA}$ and the negative-phase-side differential amplifier circuit $S_{MB}$ corresponding to the first and second switches to be driven by the two differential half-rate signals.

That is, unlike FIG. 8, as the switches $S_{M3}$ and $S_{M4}$ on the lower stage side corresponding to the first and second switches out of the four switches $S_{M1}$ to $S_{M4}$ serially/parallelly connected by twos and included in the switch circuit, the positive-phase-side differential amplifier circuit $S_{MA}$ including the pair of transistors $Q_{M3-1}$ and $QM_{3-2}$ to be driven by one pair of differential half-rate signals (retimed digital input signal $D_{MR-A}$ and its negative-phase retimed digital input signal $D_{MR-A}B$) and the negative-phase-side differential amplifier circuit $S_{MB}$ including the pair of transistors $Q_{M4-2}$ and $QM_{4-2}$ to be driven by the other pair of differential half-rate signals (retimed digital input signal $D_{MR-B}$ and its negative-phase retimed digital input signal $D_{MR-B}B$) are provided.

On the other hand, unlike FIG. 8, as the switches $S_{M1}$ and $S_{M2}$ on the upper stage side corresponding to the third and fourth switches out of the four switches $S_{M1}$ to $S_{M4}$ included in the switch circuit, the four transistors $Q_{M1-1}$, $Q_{M1-2}$, $Q_{M1-3}$, and $Q_{M1-4}$ to be driven by the select signal SW and the four transistors $Q_{M2-3}$, $Q_{M2-4}$, $Q_{M2-1}$, and $Q_{M2-2}$ to be driven by the negative-phase select signal SWB are provided.

Assume that the four transistors $Q_{M1-1}$, $Q_{M1-2}$, $Q_{M1-3}$, and $Q_{M1-4}$ are turned on by the select signal SW. In this case, when the retimed digital input signal $D_{MR-A}$ is "High", a positive-phase current signal $I_M$ flows to a positive-phase-side load resistor network (resistor ladder network) $L_{MA}$. When the negative-phase retimed digital input signals $D_{MR-A}B$ is "High", a negative-phase current digital $I_M B$ flows to a negative-phase-side load resistor network (resistor ladder network) L.

Assume that the four transistors $Q_{M2-3}$, $Q_{M2-4}$, $Q_{M2-1}$, and $Q_{M2-2}$ are turned on by the negative-phase select signal SWB. In this case, when the retimed digital input signal $D_{MR-B}$ is "High", the positive-phase current signal $I_M$ flows to the positive-phase-side load resistor network (resistor ladder network) $L_{MA}$. When the negative-phase retimed digital input signals $D_{MR-B}B$ is "High", the negative-phase current digital $I_M B$ flows to the negative-phase-side load resistor network (resistor ladder network) $L_{MB}$.

In addition, unlike FIG. 8, the current-switching cell includes not one but two current sources $I_{MA}$ and $I_{MB}$, as in the second embodiment. One current source $I_{MA}$ is connected to the positive-phase-side differential amplifier circuit $S_{MA}$ that forms the switch $S_{M3}$ out of the four switches $S_{M1}$ to $S_{M4}$ included in the switch circuit. The other current source $I_{MB}$ is connected to the negative-phase-side differential amplifier circuit $S_{MB}$ that forms the switch $S_{54}$.

The operation of the differential current-switching cell $CS_M$ shown in FIG. 21 will be described below. The Mth differential digital input signal bit $D_M$ and its negative-phase signal $D_M B$ input to the differential current-switching cell $CS_M$ are retimed by the two D flip-flops D-$FF_{MA}$ and D-$FF_{MB}$ for differential input/output to a rising edge of the clock signal CLK having a frequency ½ the clock frequency necessary in the conventional digital-to-analog converter DAC and a rising edge (=a falling edge of the clock signal CLK) of the negative-phase clock signal CLKB and simultaneously divided, as in FIG. 8 of the first embodiment.

As a result, the two D flip-flops D-$FF_{MA}$ and D-$FF_{MB}$ for differential input/output generate a total of four half-rate signals, that is, two pairs of differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$) by dividing each the information of the differential digital input signal bit $D_M$ and its differential signal $D_M B$ into two signals.

The retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$ that are the two pairs of differential half-rate signals drive the pair of transistors $Q_{M3-1}$ and $Q_{M3-2}$ and the pair of transistors $Q_{M4-1}$ and $Q_{M4-2}$ included in the positive-phase-side differential amplifier circuit $S_{MA}$, and the negative-phase-side differential amplifier circuit $S_{MB}$ which function as the switches $S_{M3}$ and $S_{M4}$ on the lower stage side out of the four switches $S_{M1}$ to $S_{M4}$ included in the switch circuit.

In this state, the select signal SW having the some frequency as that of the clock signal CLK and a phase shifted in any one of the directions and the negative-phase select signal SWB that is the negative-phase signal of the select signal SW are input to the four transistors $Q_{M1-1}$, $Q_{M1-2}$, $Q_{M1-3}$, and $Q_{M1-4}$ and the four transistors $Q_{M2-3}$, $Q_{M2-4}$, $Q_{M2-1}$, and $Q_{M2-2}$ corresponding to the two switches $S_{M1}$ and $S_{M2}$ on the upper stage side out of the four switches $S_{M1}$ to $S_{M4}$ included in the switch circuit of the Mth current-switching cell $CS_M$, thereby determining the on/off states of the two switches $S_{M1}$ and $S_{M2}$, that is, the four transistors $Q_{M1-1}$, $Q_{M1-2}$, $Q_{M1-3}$, and $Q_{M1-4}$ and the four transistors $Q_{M2-3}$, $Q_{M2-4}$, $Q_{M2-1}$, and $Q_{M2-2}$.

As a result, when the four transistors $Q_{M1-1}$, $Q_{M1-2}$, $Q_{M1-3}$, and $Q_{M1-4}$ and the four transistors $Q_{M2-3}$, $Q_{M2-4}$, $Q_{M2-1}$, and $Q_{M2-2}$ are turned on by the select signal SW and the negative-phase select signal SWB, the positive-phase current signal $I_M$ corresponding to the positive-phase-side digital input signal $D_M$ flows to the positive-phase-side load resistor network (resistor ladder network) $L_{MA}$, and the negative-phase current digital $I_M B$ corresponding to the negative-phase-side digital input signal $D_M B$ flows to the negative-phase-side load resistor network (resistor ladder network) $L_{MB}$.

Hence, applying the differential current switching cell $CS_M$ as shown in FIG. 21 to all the current-switching cells of the digital-to-analog converter DAC shown in, for example, FIG. 15, 16, 17A, 18, or the like of the second embodiment allows to implement a differential digital-to-analog converter DAC which performs the differential operation for all digital input signal bits.

Note that in the circuit of the differential current-switching cell $CS_M$ shown in FIG. 21, a bipolar transistor is used as each switching element of the four switches $S_{M1}$ to $S_{M4}$ included in the switch circuit. However, the present invention is not limited to the bipolar transistor. Any other element capable of implementing the current-switching function is usable. For example, the same function as described above can be implemented using an FET (Field Effect Transistor).

Still another example of the circuit arrangement of the differential current-switching cell which performs the differential operation will be described next with reference to FIG. 22.

Figure 22:
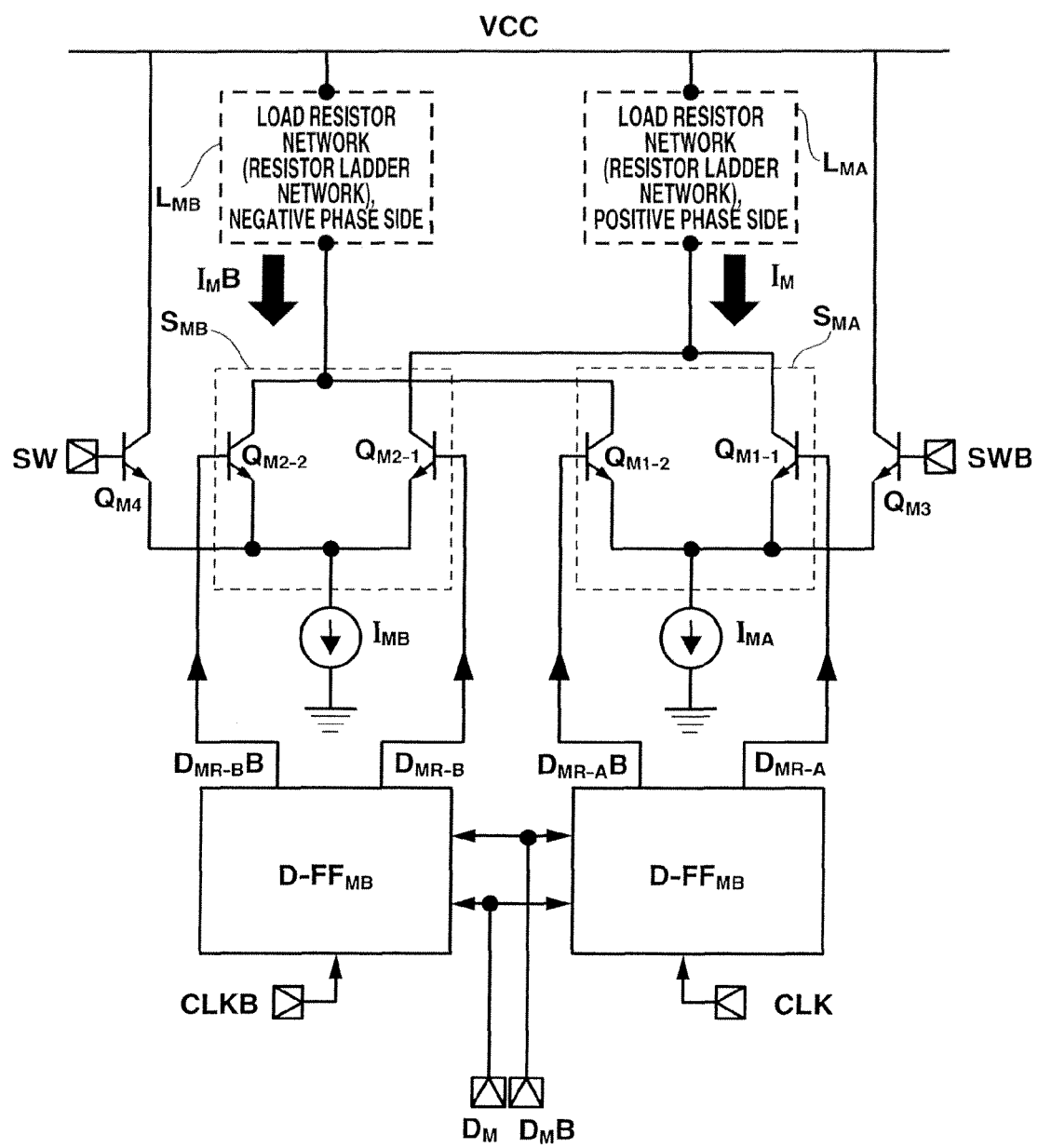
FIG. 22 is a block diagram showing another example of the block arrangement in which the current-switching cell according to the third embodiment of the present invention is formed as a differential circuit.

FIG. 22 is a block diagram showing another example of the block arrangement in which the current-switching cell according to the third embodiment of the present invention is formed as a differential circuit. As in FIG. 8, the switch circuit of the current-switching cell is formed as two differential switch circuits each of which is driven by two differential half-rate signals obtained by dividing one of differential digital input signals into two signals and retiming them by the clock signal CLK and the negative-phase clock signal CLKB. Each of the two differential switch circuits is formed by a differential amplifier circuit including pairs of transistors.

As shown in FIG. 22, the current-switching cell $CS_M$ that forms the differential circuit includes the two D flip-flops D-$FF_{MA}$ and D-$FF_{MB}$ for differential input/output which latch the positive-phase-side digital input signal $D_M$ that is the positive-phase signal out of the differential digital input signals and the negative-phase-side digital input signal $D_M B$ that is the negative-phase signal by the clock signal CLK and the negative-phase clock signal CLKB, respectively, divide the signals into two pairs of differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$), and retimes and outputs the signals, as in FIG. 8.

Unlike FIG. 8, the four switches $S_{M1}$ to $S_{M4}$ included in the switch circuit are connected not in series. Instead, the first and fourth switches and the second and third switches are arranged in parallel. The positive-phase-side differential amplifier circuit $S_{MA}$ including a pair of transistors $QM_{1-1}$ and $QM_{1-2}$ to be driven by one pair of differential half-rate signals (retimed digital input signal $D_{MR-A}$, and its negative-phase retimed digital input signal $D_{MR-A}B$) and the negative-phase-side differential amplifier circuit $S_{MB}$ including a pair of transistors $Q_{M2-1}$ and $QM_{2-2}$ to be driven by the other pair of differential half-rate signals (retimed digital input signal $D_{MR-B}$ and its negative-phase retimed digital input signal $D_{MR-B}B$) are provided as the differential switch circuits corresponding to the first and second switches. Transistors $Q_{M3}$ and $Q_{M4}$ to be driven by the negative-phase select signal SWB and the select signal SW, respectively, are provided as switches corresponding to the third and fourth switches.

In the circuit arrangement shown in FIG. 12, the third and fourth switches of the switch circuit are formed by the single transistors $Q_{M3}$ and $Q_{M4}$, respectively. In addition, the signal level of the select signal and the negative-phase select signal that drive the transistors $Q_{M3}$ and $Q_{M4}$ serving as the third and fourth switches is set to be higher than that of the two differential half-rate signals that drive the positive-phase-side differential amplifier circuit $S_{MA}$ and the negative-phase-side differential amplifier circuit $S_{MB}$ corresponding to the first and second switches.

Setting the signal level as such, the transistor $Q_{M3}$ and the positive-phase-side differential amplifier circuit $S_{MA}$ corresponding to the first and third switches, and the transistor $Q_{M4}$ and the negative-phase-side differential amplifier circuit $S_{MB}$ corresponding to the second and fourth switches are not connected in series in the circuit arrangement of FIG. 22, unlike FIG. 8. Instead, the collectors of the transistors $Q_{M3}$ and $Q_{M4}$ that constitute the third and fourth switches are connected to a power supply VCC to bypass the loads. In addition, the emitters of the transistors $Q_{M3}$ and $Q_{M4}$ that constitute the third and fourth switches are connected to the emitter sides of the pair of transistors $Q_{M1-1}$ and $Q_{M1-2}$ and the pair of transistors $Q_{M2-1}$ and $Q_{M2-2}$ of the positive-phase-side differential amplifier circuit $S_{MA}$ and the negative-phase-side differential amplifier circuit $S_{MB}$ that constitute the first and second switches having collectors connected to the loads, that is, the positive-phase-side load resistor network (resistor ladder network) $L_{MA}$ and the negative-phase-side load resistor network (resistor ladder network) $L_{MB}$.

Note that unlike FIG. 8, the current-switching cell includes not one but two current sources $I_{MA}$ and $I_{MB}$, as in the second embodiment. One current source $I_{MA}$ is connected to the positive-phase-side differential amplifier circuit $S_{MA}$ that forms the switch $S_{M1}$ out of the four switches $S_{M1}$ to $S_{M4}$ included in the switch circuit and the transistor $Q_{M3}$ that forms the switch $S_{M4}$ to be driven by the negative-phases select signal SWB. The other current source $I_{MB}$ is connected to the negative-phase-side differential amplifier circuit $S_{MB}$ that forms the switch $S_{M2}$ and the transistor $Q_{M4}$ that forms the switch $S_{M3}$ to be driven by the select signal SW. The transistors that form the switches $S_{M3}$ and $S_{M4}$ are the transistors $Q_{M4}$ and $Q_{M3}$ to be driven by the select signal SW and the negative-phase select signal SWB, respectively.

Unlike FIG. 8, the positive-phase-side load resistor network (resistor ladder network) $L_{MA}$ and the negative-phase-side load resistor network (resistor ladder network) $L_{MB}$ to which the positive-phase current signal $I_M$ and the negative-phase current digital $I_M B$ flow, respectively, are connected to the positive-phase-side differential amplifier circuit $S_{MA}$ and the negative-phase-side differential amplifier circuit $S_{MB}$ that constitute the switches $S_{M1}$ and $S_{M2}$. When the transistors $Q_{M4}$ and $Q_{M3}$ that constitute the switches $S_{M3}$ and $S_{M4}$ are driven, the positive-phase-side load resistor network (resistor ladder network) $L_{MA}$ and the negative-phase-side load resistor network (resistor ladder network) $L_{MB}$ are bypassed not to flow the currents to them.

The operation of the differential current-switching cell $CS_M$ shown in FIG. 22 will be described below. The Mth differential digital input signal bit $D_M$ and its negative-phase signal $D_M B$ input to the differential current-switching cell $CS_M$ are retimed by the two D flip-flops D-$FF_{MA}$ and D-$FF_{MB}$ for differential input/output to a rising edge of the clock signal CLK having a frequency ½ the clock frequency necessary in the conventional digital-to-analog converter DAC and a rising edge (=a falling edge of the clock signal CLK) of the negative-phase clock signal CLKB and simultaneously divided, as in FIG. 21.

As a result, the two D flip-flops D-$FF_{MA}$ and D-$FF_{MB}$ for differential input/output generate a total of four half-rate signals, that is, two pairs of differential half-rate signals (the retimed digital input signal $D_{MA}$ and its negative-phase retimed digital input signal $D_{MR-A}B$ and the retimed digital input signal $D_{MR-B}$ and its negative-phase retimed digital input signal $D_{MR-B}B$) by dividing each the information of the differential digital input signal bit $D_M$ and its differential signal $D_M B$ into two signals.

The retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$ that are the two pairs of differential half-rate signals drive the pair of transistors $Q_{M1-1}$ and $Q_{M1-2}$ and the pair of transistors $Q_{M2-1}$ and $Q_{M2-2}$ included in the positive-phase-side differential amplifier circuit $S_{MA}$ and the negative-phase-side differential amplifier circuit $S_{MB}$ which function as the switches $S_{M1}$ and $S_{M2}$ on the upper stage side out of the four switches $S_{M1}$ to $S_{M4}$ included in the switch circuit.

In this state, the select signal SW having the same frequency as that of the clock signal CLK and a phase shifted in any one of the directions and the negative-phase select signal SWB that is the negative-phase signal of the select signal SW are input to the transistors $Q_{M4}$ and $Q_{M3}$ corresponding to the two switches $S_{M3}$ and $S_{14}$ on the lower stage side out of the four switches $S_{M1}$ to $S_{M4}$ included in the switch circuit of the Mth current-switching cell $CS_M$, thereby determining the on/off states of the two switches $S_{M3}$ and $S_{M4}$, that is, the transistors $Q_{M4}$ and $Q_{M3}$.

Figure 23:
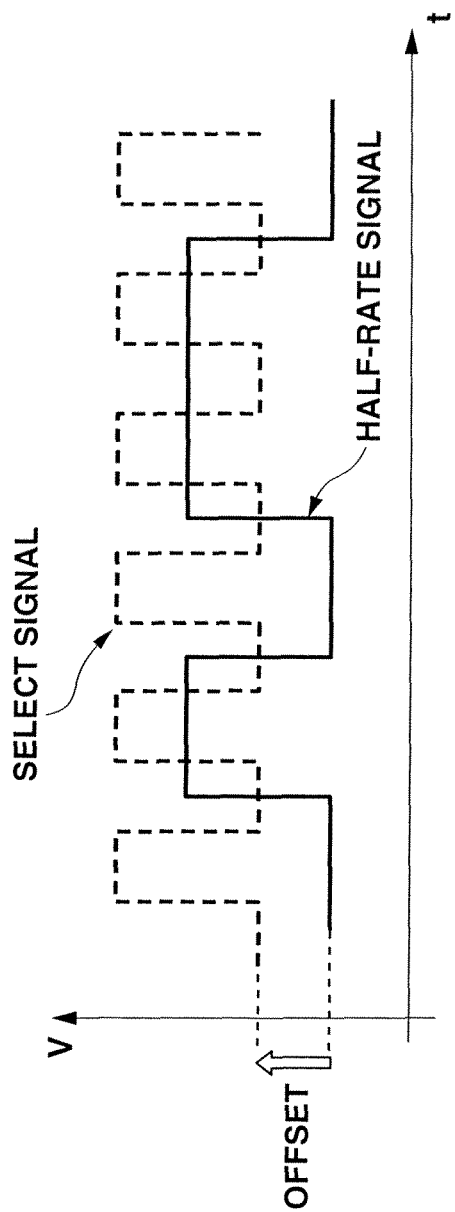
FIG. 23 is a schematic view for explaining the signal level relationship between a differential half-rate signal and a select signal used in the differential current-switching cell shown in FIG. 22.

However, the signal level of the select signal SW (and the negative-phase select signal SWB) is set to be higher than that of the differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$) with an offset (of, for example, about ½ the logical amplitude, as shown in FIG. 23. FIG. 23 is a schematic view for explaining the signal level relationship between the differential half-rate signals (the retimed digital input signal $D_{MR-A}$ and its negative-phase retimed digital input signal $D_{MR-A}B$ and the retimed digital input signal $D_{MR-B}$ and its negative-phase retimed digital input signal $D_{MR-B}B$) and the select signal SW (and the negative-phase select signal SWB) used in the differential current-switching cell $CS_M$ shown in FIG. 22.

For example, a case in which the select signal SW is "High" (=the negative-phase select signal SWB is "Low") will be described. At this time, the base of the transistor $Q_{M4}$, which receives the select signal SW in FIG. 22, is applied with the highest voltage as compared to the other transistors, as shown in FIG. 23. For this reason, the current signal $I_{MB}$ supplied from the other current source all flows to the side of the transistor $Q_{M4}$ independently of the driven state of the pair of transistors $Q_{M2-1}$ and $Q_{M2-2}$ included in the negative-phase-side differential amplifier circuit $S_{MB}$ (that is, the state of the retimed digital input signal $D_{MR-B}$ and its negative-phase retimed digital input signal $D_{MR-B}B$ included in the other pair of differential half-rate signals).

That is, when the select signal SW goes "High" to turn on the transistor $Q_{M4}$, the other current source that supplies the current signal $I_{MB}$ is completely disconnected from the positive-phase-side load resistor network (resistor ladder network) $L_{MA}$ and the negative-phase-side load resistor network (resistor ladder network) $L_{MB}$.

On the other hand, when the select signal SW is "High", the base the transistor $Q_{M3}$, which receives the negative-phase select signal SWB of "Low", is applied with a voltage lower than the "High" level of the half-rate signal. For this reason, the current signal $I_{MA}$ flows to the positive-phase-side load resistor network (resistor ladder network) $L_{MA}$ or negative-phase-side load resistor network (resistor ladder network) $L_{MB}$, in accordance with the driven state of the pair of transistors $Q_{M1-1}$ and $Q_{M1-2}$ included in the positive-phase-side differential amplifier circuit $S_{MA}$ (that is, the state of the retimed digital input signal $D_{MR-A}$ and its negative-phase retimed digital input signal $D_{MR-A}B$ included in one pair of differential half-rate signals).

This operation can be summarized as follows. When the select signal SW is "High" (=the negative-phase select signal SWB is "Low"), the current signal $I_{MA}$ or $I_M B$ flows to the positive-phase-side load resistor network (resistor ladder network) $L_{MA}$ or the negative-phase-side load resistor network (resistor ladder network) $L_{MB}$ in accordance with the driven state of the pair of transistors $Q_{M1-1}$ and $Q_{M1-2}$ included in the positive-phase-side differential amplifier circuit $S_{MA}$ (that is, the state of the retimed digital input signal $D_{MR-A}$ and its negative-phase retimed digital input signal $D_{MR-A}B$ included in one pair of differential half-rate signals). When the select signal SW is "Low" (=the negative-phase select signal SWB is "High"), the current signal $I_{MA}$ or $I_M B$ flows to the positive-phase-side load resistor network (resistor ladder network) $L_{MA}$ or the negative-phase-side load resistor network (resistor ladder network) $L_{MB}$ in accordance with the driven state of the pair of transistors $Q_{M2-1}$ and $Q_{M2-2}$ included in the negative-phase-side differential amplifier circuit $S_{MB}$ (that is, the state of the retimed digital input signal $D_{MR-B}$ and its negative-phase retimed digital input signal $D_{MR-B}B$ included in the other pair of differential half-rate signals).

As a result, when the select signal SW and the negative-phase select signal SWB turn off the transistors $Q_{M4}$ and $Q_{M3}$, the positive-phase current signal $I_M$ corresponding to the positive-phase-side digital input signal $D_M$ flows to the positive-phase-side load resistor network (resistor ladder network) $L_{MA}$, and the negative-phase current digital $I_M B$ corresponding to the negative-phase-side digital input signal $D_M B$ flows to the negative-phase-side load resistor network (resistor ladder network) $L_{MB}$.

Hence, applying the differential current-switching cell $CS_M$ as shown in FIG. 22 to all the current-switching cells of the digital-to-analog converter DAC shown in, for example, FIG. 15, 16, 17A, 18, or the like of the second embodiment allows to implement d differential digital-to-analog converter DAC which performs the differential operation for all digital input signal bits.

Note that in the circuit of the differential current-switching cell $CS_M$ shown in FIG. 22, a bipolar transistor is used as each switching element of the four switches $S_{M1}$ to $S_{M4}$ included in the switch circuit. However, the present invention is not limited to the bipolar transistor. Any other element capable of implementing the current-switching function is usable. For example, the same function as described above can be implemented using an FET (Field Effect Transistor).

Even in the differential current-switching cell $CS_M$ which performs the differential operation as shown in FIG. 21 or 22 of the third embodiment, a waveform shaping buffer circuit 5 as shown in FIG. 9 of the first embodiment may be inserted between the D flip-flop D-FF and the switch circuit of the differential current-switching cell $CS_M$. Alternatively, a degenerate resistor as shown in FIG. 11 may be connected to the emitter of the transistor that forms each switch of the switch circuit in the differential current-switching cell $CS_M$.

Additionally, in the differential current-switching cell $CS_M$ according to the third embodiment having the circuit arrangement shown in FIG. 21, the two switches on the upper stage side and the two switches on the lower stage side out of the four switches $S_{M1}$ to $S_{M4}$ included in the switch circuit may be replaced with each other, as in the circuit arrangement shown in FIG. 8 of the first embodiment.

When the current-switching cell is formed as a differential current-switching cell that performs the differential operation as in the above-described third embodiment, a D/A (Digital-to-Analog) conversion speed about twice that of the related art can be achieved, and the linearity (quality) of the analog output signal can be further improved as compared to the circuit arrangement that operates by a single-phase signal.

Note that the differential current-switching cell as shown in FIG. 21 or 22 of the third embodiment may be applied as a current-switching cell that operates by a single-phase signal as in FIG. 3A or 6A described in the first embodiment, or a current-switching cell that operates by a single-phase signal as in FIG. 17A or 20A described in the second embodiment depending on the circumstances.

In the above-described first embodiment, each of the third switch $S_{M3}$ and the fourth switch $S_{M4}$ functions as a select switch that selectively connects one of the circuit including the first switch $S_{M1}$ and the circuit including the second switch $S_{M2}$ between the current source 1 and the load resistor network 4. However, as shown in FIGS. 29 and 30, this select switch function may be implemented by one changeover switch 6.

Figure 29:
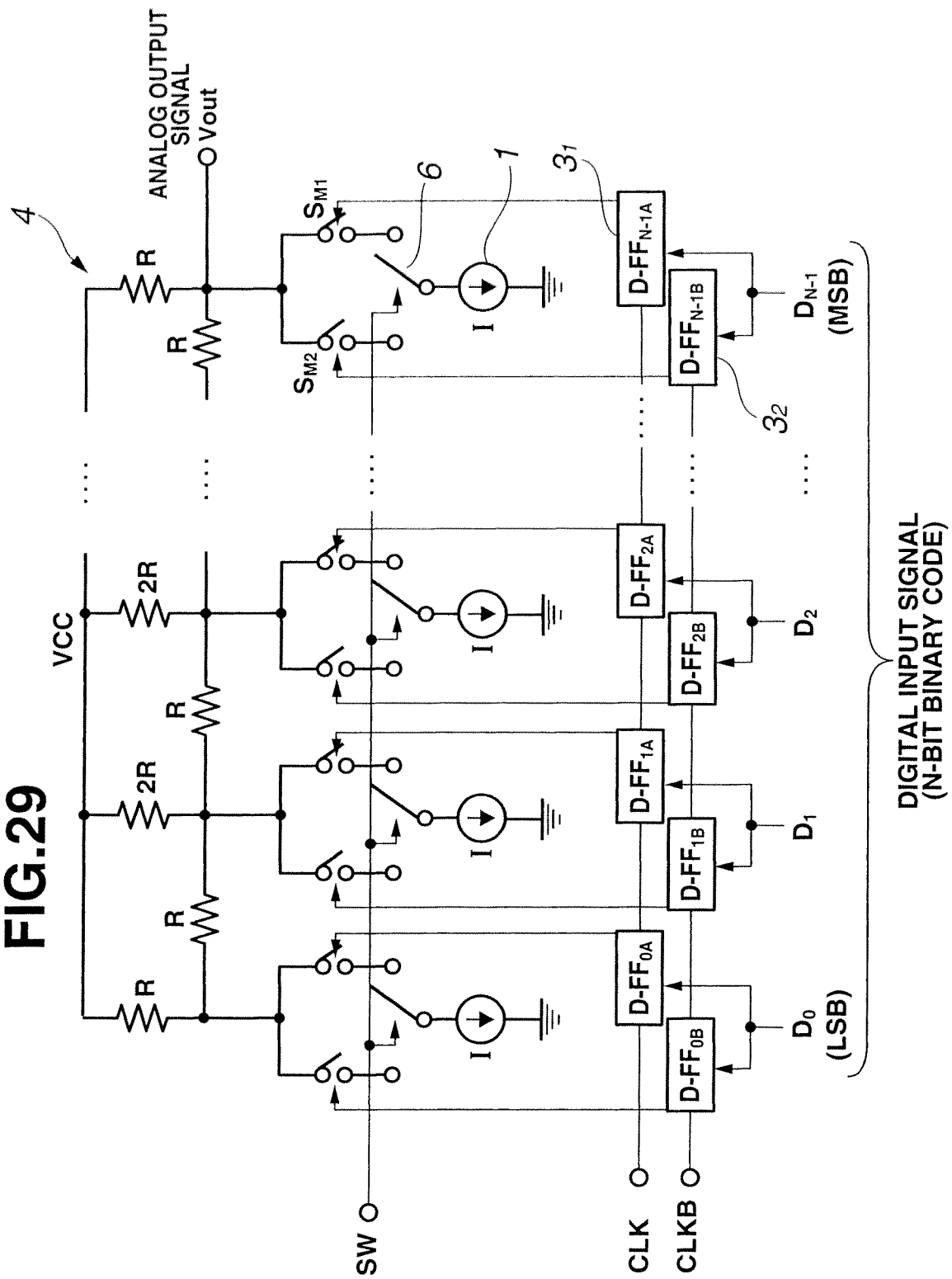
FIG. 29 is a block diagram showing a modification of the circuit arrangement of the digital-to-analog converter according to the first embodiment of the present invention.
Figure 30:
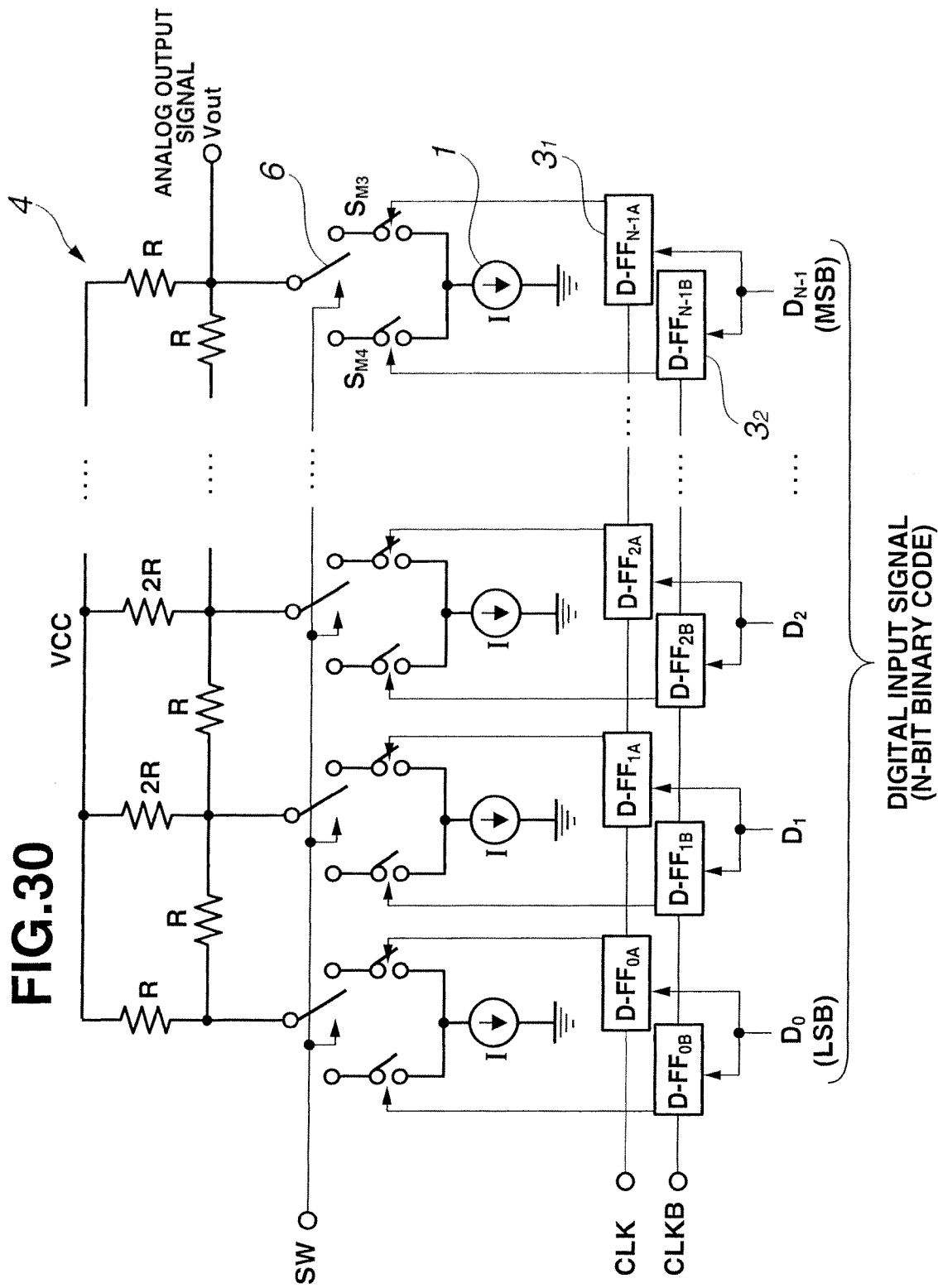
FIG. 30 is a block diagram showing another modification of the circuit arrangement of the digital-to-analog converter according to the first embodiment of the present invention.

FIG. 29 illustrates an example in which a digital-to-analog converter DAC is formed using a current-switching cell whose switches $S_{M3}$ and $S_{M4}$ in FIG. 3A are replaced with the changeover switch 6. The fixed terminal of the changeover switch 6 is connected to a current source 1. The changeover switch 6 changes the connection destination of the movable terminal to the switch $S_{M1}$ or $S_{M2}$ in accordance with the select signal SW. FIG. 30 illustrates an example in which a digital-to-analog converter DAC is formed using a current-switching cell whose switches $S_{M1}$ and $S_{M2}$ in FIG. 6A are replaced with the changeover switch 6. The fixed terminal of the changeover switch 6 is connected to a load resistor network 4. The changeover switch 6 changes the connection destination of the movable terminal to the switch $S_{M3}$ or $S_{M4}$ in accordance with the select signal SW. The changeover switch 6 is driven only by the select signal SW. Hence, the negative-phase select signal SWB is unnecessary. Note that the changeover switch 6 is also applicable to the second embodiment.

EXPLANATION OF THE REFERENCE NUMERALS AND SIGNS

10: switch circuit, 11, 12: decoder, 100: switch circuit, 101: first sub-digital-to-analog converter, 102: second sub-digital-to-analog converter, 103: clock, 104: first phase shifter, 105: second phase shifter, 106: mixer, CLK: clock signal, $CS_0$, $CS_1$, $CS_2$, ..., $CS_M$, ..., $CS_{N-1}$: current-switching cell, $D_0$, $D_1$, $D_2$, ..., $D_M$, ..., $D_{N-1}$: digital input signal, $D_{0R}$, $D_{1R}$, $D_{2R}$, ..., $D_{MR}$, ..., $D_{(N-1)R}$: retimed digital input signal, $D_{MR-A}$-in, $D_{MR-A}$B-in: differential retimed digital input signal $D_{MR-A}$-out, $D_{MR-A}$B-out: differential retimed digital output signal, D-$FF_0$, D-$FF_1$, D-$FF_2$, ..., D-$FF_M$, ..., D-$FF_{N-1}$, ..., D-$FF_{(N-M)+2^M}$, D-$FF_{(2^N-1)}$: D flip-flop, D-$FF_{0A}$, D-$FF_{0B}$, D-FF, $D_{1B}$, D-$FF_{2A}$, D-$FF_{2B}$, ..., D-$FF_{MA}$, D-$FF_{MB}$, ..., D-$FF_{(N-1)A}$, D-$FF_{(N-1)B}$: D flip-flop, DAC: digital-to-analog converter, I, 2I, $2^2$I, ..., $2^{N-1}$I: current value, $I_M$: positive-phase current signal, $I_M$B: negative-phase current digital, $I_1$, $I_{2-1}$, $I_{2-2}$, $I_3$: current source, $L_{MA}$: positive-phase-side load resistor network (resistor ladder network), $L_{MB}$: negative-phase-side load resistor network (resistor ladder network), $Q_{BM1-1}$, $Q_{BM1-2}$: pair of transistors, $Q_{M2-1}$, $Q_{M2-2}$: transistor, $Q_{BM3-1}$, $Q_{BM3-2}$: pair of transistors, $Q_{M1-1}$, $Q_{M1-2}$, $Q_{M1-3}$, $Q_{M1-4}$: transistor, $Q_{M2-1}$, $Q_{M2-2}$, $Q_{M2-3}$, $Q_{M2-4}$: transistor, $Q_{M3}$, $Q_{M4}$: transistor, $Q_{M3-1}$, $Q_{M3-2}$: pair of transistors, $Q_{M4-1}$, $Q_{M4-2}$: pair of transistors, R, 2R: resistance value, $R_{M1-1}$, $R_{M1-2}$, $R_{M2-1}$, $R_{M2-2}$, $R_{M3}$, $R_{M4}$: degenerate resistor, $S_0$, $S_1$, $S_2$, ..., $S_M$, ..., $S_{N-1}$, ..., $S_{(N-M)+2^M}$, ..., $S_{(2^N-1)}$: switch, $S_{O1}$, $S_{O2}$, $S_{O3}$, $S_{O4}$, $S_{11}$, $S_{12}$, $S_{13}$, $S_{14}$, $S_{21}$, $S_{22}$, $S_{23}$, $S_{24}$, ..., $S_{M1}$, $S_{M2}$, $S_{M3}$, $S_{M4}$, ..., $S_{(N-1)1}$, $S_{(n-1)2}$, $S_{(N-1)3}$, $S_{(N-1)4}$: switch, $S_{MA}$: positive-phase-side differential amplifier circuit, $S_{MB}$: negative-phase-side differential amplifier circuit, VCC: power supply, Vout: analog output signal

The invention claimed is:

1. A current-switching cell comprising:
a current source;
a switch circuit that switches a connection state between said current source and a load so as to switch whether to supply a current from said current source to the load; and
a first latch circuit and a second latch circuit that latch and retime a digital input signal based on a first clock signal and a second clock signal that is a negative-phase signal of the first clock signal, respectively, and output a first half-rate signal and a second half-rate signal obtained by dividing the digital input signal into two signals to said switch circuit,
said switch circuit comprising:
a first switch that is inserted between said current source and the load and driven by the first half-rate signal;
a second switch that is inserted between said current source and the load in parallel to said first switch and driven by the second half-rate signal; and
a select switch that selectively connects one of a circuit including said first latch circuit and a circuit including said second switch between said current source and the load in accordance with a signal having the same frequency as that of the first clock signal but a different phase from that of the first clock signal.

2. A current-switching cell according to claim 1, wherein said select switch comprises:
a third switch that is connected to said first switch and driven by a third clock signal having the same frequency as that of the first clock signal but a different phase from that of the first clock signal; and
a fourth switch that is connected to said second switch and driven by a fourth clock signal that is a negative-phase signal of the third clock signal, and
said first switch and said third switch, and said second switch and said fourth switch are parallelly inserted between said current source and the load.

3. A current-switching cell according to claim 2, wherein
said third switch is connected in series with said first switch, and
said fourth switch is connected in series with said second switch.

4. A current-switching cell according to claim 3, wherein
said first switch and said second switch are connected to one of said current source and the load, and
said third switch and said fourth switch are connected to the other of said current source and the load.

5. A current-switching cell according to claim 4, wherein
said current source comprises a first current source and a second current source that supply currents having the same value, and
said first current source and said second current source are respectively connected to, out of said first switch, said second switch, said third switch, and said fourth switch, two switches connected to said current source.

6. A current-switching cell according to claim 1, further comprising two waveform shaping buffer circuits that are connected between said switch circuit and said first latch circuit and said second latch circuit to shape waveforms of the first half-rate signal and the second half-rate signal.

7. A current-switching cell according to claim 2, wherein each of said first switch, said second switch, said third switch, and said fourth switch includes a transistor circuit.

8. A current-switching cell according to claim 7, wherein said transistor circuit includes one of a bipolar transistor and an FET (Field Effect Transistor).

9. A current-switching cell according to claim 7, wherein said transistor circuit comprises:
a bipolar transistor; and
a degenerate resistor connected to an emitter of said bipolar transistor.

10. A current-switching cell according to claim 2, wherein
the digital input signal includes differential digital input signals including a positive-phase signal and a negative-phase signal,
the load comprises a positive-phase-side load to which a current corresponding to the positive-phase signal flows and a negative-phase-side load to which a current corresponding to the negative-phase signal flows,
said first latch circuit and said second latch circuit include two D flip-flops for differential input/output, and output first differential half-rate signals and second differential half-rate signals obtained by dividing each of the positive-phase signal and the negative-phase signal of the differential digital input signals into two signals, and
said first switch and said second switch include two differential switch circuits to be driven by the first differential half-rate signals and the second differential half-rate signals, respectively.

11. A current-switching cell according to claim 10, wherein each of said two differential switch circuits includes a differential amplifier circuit including a pair of transistors.

12. A current-switching cell according to claim 11, wherein
each of said third switch and said fourth switch includes one transistor, and
collectors of said transistors that form said third switch and said fourth switch are connected to emitter sides of the pairs of transistors of said differential amplifier circuits that form said first switch and said second switch, respectively.

13. A current-switching cell according to claim 11, wherein
each of said third switch and said fourth switch includes one transistor,
collectors of said transistors that form said third switch and said fourth switch are connected to a power supply, and emitters of said transistors are connected to emitter sides of the pairs of transistors of said differential amplifier circuits that form said first switch and said second switch, respectively, and
a signal level of the third clock signal and the fourth clock signal that drive said third switch and said fourth switch, respectively, is higher than a signal level of the first differential half-rate signals and the second differential half-rate signals that drive said first switch and said second switch, respectively.

14. A current-switching cell according to claim 11, wherein
each of said third switch and said fourth switch includes two pairs of transistors, each of the two pairs of transistors includes two transistors having emitters connected to each other,
one of collectors of the two transistors is connected to a power supply, and the other is connected to the load, and
a node of the emitters of the two transistors is connected to collector sides of the pairs of transistors of said differential amplifier circuits that form said first switch and said second switch, respectively.

15. A digital-to-analog converter comprising:
at least one current-switching cell provided in correspondence with a bit of an N-bit (N is an integer of not less than 1) digital input signal; and
a load,
each of said current-switching cells comprising:
a current source;
a switch circuit that switches a connection state between said current source and said load so as to switch whether to supply a current from said current source to said load; and
a first latch circuit and a second latch circuit that latch and retime the digital input signal of a bit corresponding to said current-switching cell based on a first clock signal and a second clock signal that is a negative-phase signal of the first clock signal, respectively, and output a first half-rate signal and a second half-rate signal obtained by dividing the digital input signal into two signals to said switch circuit, and
said switch circuit comprising:
a first switch that is inserted between said current source and said load and driven by the first half-rate signal;
a second switch that is inserted between said current source and said load in parallel to said first switch and driven by the second half-rate signal; and
a select switch that selectively connects one of a circuit including said first latch circuit and a circuit including said second switch between said current source and said load in accordance with a signal having the same frequency as that of the first clock signal but a different phase from that of the first clock signal,
wherein said load adds currents supplied from said current sources via said current-switching cells so as to D/A (Digital-to-Analog)-convert the digital input signal.

16. A digital-to-analog converter according to claim 15, wherein the number of current-switching cells is N.

17. A digital-to-analog converter according to claim 15, wherein
   said load comprises a load ladder network that is formed by connecting a plurality of resistors in a ladder to perform binary-weighting in correspondence with each bit of the digital input signal, and
   all of said current sources included in said current-switching cells supply currents having the same value.

18. A digital-to-analog converter according to claim 15, wherein
   said load includes a single load resistor, and
   said current sources included in said current-switching cells supply currents having values binary-weighted in correspondence with the bits of the digital input signal.

19. A digital-to-analog converter according to claim 15, further comprising a decoder that decodes at least some of the bits of the digital input signal from a binary code into a thermometer code of unweighted bits,
   wherein said current-switching cell is at least provided in correspondence with each bit of the decoded thermometer code.

* * * * *